under 35

(12) United States Patent
Kojima et al.

(10) Patent No.: US 6,881,466 B2
(45) Date of Patent: Apr. 19, 2005

(54) INFORMATION RECORDING MEDIUM AND METHOD FOR PRODUCING THE SAME

(75) Inventors: Rie Kojima, Kadoma (JP); Haruhiko Habuta, Osaka (JP); Takashi Nishihara, Hirakata (JP); Hideki Kitaura, Seika-cho (JP); Noboru Yamada, Hirakata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 23 days.

(21) Appl. No.: 10/390,611

(22) Filed: Mar. 19, 2003

(65) Prior Publication Data

US 2003/0190447 A1 Oct. 9, 2003

(30) Foreign Application Priority Data

Mar. 19, 2002 (JP) ........................................ 2002-075731

(51) Int. Cl.[7] ................................................ B32B 3/02
(52) U.S. Cl. .................... 428/64.1; 428/64.4; 428/64.5; 428/64.6; 430/270.13
(58) Field of Search .............................. 428/64.1, 64.4, 428/64.5, 64.6, 913; 430/270.13, 495.1, 945

(56) References Cited

U.S. PATENT DOCUMENTS

| 4,449,138 A | | 5/1984 | Ando |
| 5,818,808 A | * | 10/1998 | Takada et al. ............... 369/116 |
| 6,108,295 A | * | 8/2000 | Ohno et al. ............... 369/275.2 |

FOREIGN PATENT DOCUMENTS

| EP | 0 825 595 | 2/1998 |
| EP | 0 978 831 | 2/2000 |
| JP | 5-109115 | 4/1993 |
| JP | 5-159373 | 6/1993 |
| JP | 8-77604 | 3/1996 |
| JP | 8-180458 | 7/1996 |
| JP | 9-259468 | 10/1997 |
| JP | 10-275360 | 10/1998 |
| JP | 2001-67722 | 3/2001 |
| WO | 97/34298 | 9/1997 |

OTHER PUBLICATIONS

N. Yamada et al., "Phase–Change Optical Disk Having a Nitride Interface Layer", Japanese Journal of Applied Physics, vol. 37 (1998), pp. 2104–2110.

* cited by examiner

*Primary Examiner*—Elizabeth Mulvaney
(74) *Attorney, Agent, or Firm*—Wenderoth, Lind & Ponack, L.L.P.

(57) ABSTRACT

An information recording medium ensures high reliability and favorable overwrite cycle-ability even when an interface layer is not provided between a recording layer and a dielectric layer. The recording layer and the dielectric layers are formed on the surface of the substrate. In the recording layer, a phase change is generated between a crystal phase and an amorphous phase by irradiation of light or application of electric energy. The dielectric layers are oxide-fluoride-based material layers containing one or more oxides which each are an oxide of at least one element selected from a first group including only Ti, Zr, Cr, Hf, Nb, Ta, Cr and Si and one or more fluorides which each are a fluoride of at least one element selected from a second group including only La, Ce, Pr, Nd, Gd, Dy, Ho, Er and Yb.

38 Claims, 10 Drawing Sheets

INFORMATION RECORDING MEDIUM AND METHOD FOR PRODUCING THE SAME

CROSS-REFERENCE TO RELATED APPLICATIONS

The present application claims a priority under 35 U.S.C. §119 to Japanese Patent Application No. 2002-75731 filed on Mar. 19, 2002, entitled "Information recording medium and method for producing the same." The contents of this application are incorporated herein by the reference thereto in their entirety.

BACKGROUND OF THE INVENTION

1. Field of the Invention

This invention relates to an information recording medium which is used for optically or electrically recording, erasing, overwriting and reproducing information, and a method for producing the same.

2. Description of Related Art

The inventors developed 4.7 GB DVD-RAM which is a large capacity rewritable phase-change type information recording medium and can be used to store a data file and an image file. This has been already commercialized.

This 4.7 GB DVD-RAM is disclosed, for example, in Japanese Patent Kokai (Laid-Open) Publication No. 2001-322357. The constitution of DVD-RAM disclosed in this publication is shown in FIG. 10. The information recording medium 31 shown in FIG. 10 has a seven-layer structure where a first dielectric layer 102, a first interface layer 103, a recording layer 4, a second interface layer 105, a second dielectric layer 106, an optical compensation layer 7, and a reflective layer 8 are formed on one surface of a substrate 1 in this order. In this information recording medium, the first dielectric layer exists in a position closer to an incident laser beam than the second dielectric layer. The same relationship exists between the first interface layer and the second interface layer. Thus, in this specification, when the information recording medium contains two or more layers having the same function, "first" "second" "third" . . . is given to the beginning of the name of each layer in the order of the layer which is closer to the incident laser beam.

The first dielectric layer 102 and the second dielectric layer 106 have the function of adjusting an optical path length so as to enhance the optical absorption efficiency of the recording layer 4, and enlarging the difference between the reflectance of crystal phase and the reflectance of amorphous phase so as to enlarge a signal amplitude. ZnS-20 mol % $SiO_2$, which is represented also as $(SiO_2)_{80}(ZnS)_{20}$ in this specification conventionally used as a material for the dielectric layer is amorphous material. It has low thermal conductivity, is transparent, and has a high refractive index. Moreover, ZnS-20 mol % $SiO_2$ exhibits a high film-forming speed at the time of the film formation, and good mechanical characteristic and moisture resistance. Thus, ZnS-20 mol % $SiO_2$ is an excellent material suitable for forming the dielectric layer.

If the thermal conductivity of the first dielectric layer 102 and the second dielectric layer 106 is low, the heat which is generated when a laser beam enters the recording layer 4 is difficult to diffuse in the dielectric layers 102 or 106 in the in-plane direction, and can diffuse from the recording layer 4 to the reflective layer 8 quickly in the thickness direction. Especially when the thermal conductivity of the second dielectric layer 106 is low, the second dielectric layer 106 insulates the recording layer 4 from the reflective layer 8 more effectively. As the degree of the insulation of the recording layer 4 from the reflective layer 8 is higher, the recording layer 4 is cooled for a shorter time, and therefore, an amorphous mark (record mark) can be easily formed. When a record mark is hard to form, a high peak power is necessary for recording. When a record mark is easy to form, recording can be conducted with a low peak power. When the thermal conductivity of the dielectric layer is low, recording can be conducted with a low peak power, and therefore, the recording sensitivity of the information recording medium becomes higher. On the other hand, when the thermal conductivity of the dielectric layer is high, recording is conducted with a high peak power, and therefore the recording sensitivity of the information recording medium becomes lower. The dielectric layer in the information recording medium exists in a form of such thin film that thermal conductivity cannot be measured accurately. For this reason, the inventors employ the recording sensitivity of the information recording medium as a relative judgment reference for learning the degree of the thermal conductivity of the dielectric layer.

The recording layer 4 is formed using a material containing Ge—Sn—Sb—Te which crystallizes at a high speed. The information recording medium which contains such material as the recording layer 4, not only has excellent initial recording characteristic, but also has excellent archival characteristic and an excellent archival overwrite characteristic. In a phase-change type information recording medium, information is recorded, erased and overwritten by utilizing reversible phase change between crystal phase and amorphous phase of the recording layer 4. When the recording layer 4 is irradiated with a high power (i.e., peak power) laser beam, and then cooled rapidly, the irradiated part turns into an amorphous phase and a record mark is formed. When the recording layer is irradiated with a low power (i.e., bias power) laser beam to raise its temperature and then cooled gradually, the irradiated part turns into a crystal phase and recorded information is erased. By irradiating the recording layer with the laser beam of which power is modulated between the peak power level and the bias power level, it is possible to overwrite new information while erasing information already recorded. Overwrite cycle-ability is expressed with the maximum number which corresponds to repeatable overwrite number on the condition that the jitter value does not cause a problem in a practical use. It can be said that the better overwrite cycle-ability is, the larger this number is. Particularly, an information recording medium for data files is expected to have excellent overwrite cycle-ability.

The first interface layer 103 and the second interface layer 105 have the function of preventing a material transfer caused between the first dielectric layer 102 and the recording layer 4, and between the second dielectric layer 106 and the recording layer 4, respectively. The material transfer here means the phenomenon that S of ZnS-20 mol % $SiO_2$ contained in the first and second dielectric layers diffuses into the recording layer while the recording layer is irradiated with a laser beam and information is repeatedly overwritten. If a lot of S diffuses into the recording layer, a reduction of the reflectance of the recording layer is caused, and overwrite cycle-ability deteriorates. This phenomenon has already been known (See N. Yamada et al. Japanese Journal of Applied Physics Vol. 37 (1998) pp. 2104–2110). Moreover, Japanese Patent Kokai (Laid-Open) Publication No. 10-275360 and International Publication No. WO 97/34298 disclose that the interface layer which prevents this phenomenon is formed using a nitride containing Ge.

The optical compensation layer 107 adjusts the ratio Ac/Aa where Ac is optical absorptance of the recording layer 4 in a crystalline state, and Aa is optical absorptance Aa of the recording layer 4 in an amorphous state, and serves to suppress distortion of overwritten marks. The reflective layer 8 optically serves to increase the light quantity absorbed by the recording layer 4, and thermally serves to diffuse the heat generated in the recording layer 4 to cool the recording layer quickly and to facilitate amorphization of the recording layer. The reflective layer 8 also serves to protect a multilayered film from the operation environment.

Thus, the information recording medium shown in FIG. 10 ensures excellent overwrite cycle-ability and high reliability with a large capacity of 4.7 GB by using the structure including the seven layers each of which functions as mentioned above, and thereby has been commercialized.

As material suitable for the dielectric layer of the information recording medium, various materials have already been proposed. For example, in Japanese Patent Kokai (Laid-Open) Publication No. 5-109115, it is disclosed that a heat-resistance protective layer is formed from a mixture of a high melting point element with a melting point above 1600K and low alkali glass in an optical information recording medium. In this publication, Nb, Mo, Ta, Ti, Cr, Zr, and Si are mentioned as the element with a high melting point. Further, in this publication, it is disclosed that the low alkali glass essentially consists of $SiO_2$, BaO, $B_2O_3$, or $Al_2O_3$.

In Japanese Patent Kokai (Laid-Open) Publication No. 5-159373, it is disclosed that the heat-resistance protective layer is formed from a mixture of at least one compound selected from nitride, carbide, oxide and sulfide with a melting point higher than that of Si, and low alkali glass in an optical information recording medium. In this publication, the carbide, oxide, and sulfide of Nb, Zr, Mo, Ta, Ti, Cr, Si, Zn, and Al, are illustrated as the high melting point compound. Moreover, in the publication, it is disclosed that the low alkali glass essentially consists of $SiO_2$, BaO, $B_2O_3$, and $Al_2O_3$.

In Japanese Patent Kokai (Laid-Open) Publication No. 8-77604, it is disclosed that a dielectric layer of a read-only information recording medium is formed from the one or more oxides which each are an oxide of at least one element selected from the group which consists of Ce, La, Si, In, Al, Ge, Pb, Sn, Bi, Te, Ta, Sc, Y, Ti, Zr, V, Nb, Cr, and W, the sulfide of at least one element selected from the group which consists of Cd, Zn, Ga, In, Sb, Ge, Sn, Pb, and Bi, or selenide and so on.

In Japanese Patent Kokai (Laid-Open) Publication No. 2001-67722, it is disclosed that the first interface control layer and the second interface control layer of an optical recording medium are selected from the nitride, oxide, carbide, and sulfide which contain at least one element selected from the element group consisting of Al, Si, Ti, Co, Ni, Ga, Ge, Sb, Te, In, Au, Ag, Zr, Bi, Pt, Pd, Cd, P, Ca, Sr, Cr, Y, Se, La, and Li.

In Japanese Patent Kokai (Laid-Open) Publication No. 8-180458, it is disclosed that a dielectric layer containing a chalcogen compound (specifically at least one compound selected from ZnS, ZnSe and ZnTe), a fluoride of a rare earth element (specifically at least one compound selected from the group consisting of $PmF_3$, $SmF_3$, $EuF_3$, $GdF_3$, $TbF_3$, $DyF_3$, $LaF_3$, $CaF_3$, $PrF_3$ and $NdF_3$) and a metal oxide (specifically at least one compound selected from the group consisting of $SiO_2$, $Ta_2O_5$, $ZrO_2$ and $Y_2O_3$), is effective for a large number of repeated recording and erasing.

In Japanese Patent Kokai (Laid-Open) Publication No. 9-259468, it is disclosed that a dielectric layer contains at least one compound of sulfides and selenides of IIa group elements (MgS, CaS, SrS, BaS, RaS, MgSe, CaSe, SrSe, BaSe, RaSe) and at least one heat-resistant compound (oxides of Al, Si, Ge, Y, Zr, Ba, Ta, Nb, V, W, Hf, Sc and lanthanoid, nitrides of Al, Si, Ge, Ta and B, fluorides of Mg, Ca, Nd, Tb, and La, and carbide of Si and B). When a write-once type recording includes the dielectric layer, the archival characteristic is stable. When a rewritable medium includes the dielectric layer, a large number of repeated recording and erasing can be conducted.

SUMMARY OF THE INVENTION

As mentioned above, when forming the first and the second dielectric layers by using ZnS-20 mol % $SiO_2$, the interface layer is inevitably needed between the recording layer and the dielectric layer for preventing the diffusion of S. However, when considering price of the medium, it is desirable that the number of the layers which compose the medium is as small as possible. If the number of layers is small, reduction of the cost of materials, miniaturization of a manufacturing apparatus, and the increase in the throughput due to reduction in manufacture time can be realized, which results in the reduction of the price of the medium.

The inventors examined a possibility of eliminating at least one of the first interface layer and second interface layer as one method of reducing the number of layers. The interface layer is very thin layer of 2 nm to 5 nm and is structurally weak. For this reason, a membrane-disruption is caused in the interface layer due to the repeated overwrite, which results in liability to the atomic diffusion. Therefore, eliminating the interface layer is desirable from the viewpoint of the stability of the information recording medium. However, the inventors considered that in the case where the interface layer is eliminated, a dielectric layer needs to be made from material other than ZnS-20 mol % $SiO_2$ so that the diffusion of S from the dielectric layer into the recording layer due to overwriting may not be caused. Further, the following are desired as to the material for the dielectric layer:

The adhesiveness of the material to the recording layer which is of chalcogenide material is good;

The material realizes recording sensitivity which is equivalent to or higher than that of the above seven-layer structure;

The material is transparent;

The material has a high melting point so that it may not melt when recording; and The material is stable so that it may not decompose by heat.

It is an object of the present invention to provide an information recording medium which is provided with a dielectric layer having favorable adhesiveness to a recording layer, in which medium a substance does not transfer from the dielectric layer to the recording layer even when the dielectric layer is formed in direct contact with the recording layer without forming the interface layer, and excellent overwrite cycle-ability is ensured.

The above-mentioned publications do not refer to the problem that a substance transfers from the dielectric layer to the recording layer. Therefore, it should be noted that these publications do not teach the problem which this invention solves, and means to solve the problem, i.e., a specific composition of the material for the dielectric layer.

The inventors formed the dielectric layer by using various compounds and evaluated the adhesiveness of the dielectric layer to the recording layer and overwrite cycle-ability of the information recording medium, as explained in the below-mentioned Examples. As a result, it was found that, when providing a dielectric layer on both sides of the recording layer directly without an interface layer, the adhesiveness of the dielectric layer to the recording layer is good in the case where the dielectric layer is formed from a material which is easy to diffuse in the recording layer, for example, the conventional ZnS-20 mol % SiO$_2$, although, overwrite cycle-ability of the medium is inferior. Moreover, for example, ZrO$_2$ has low thermal conductivity and a high melting point. Therefore, if ZrO$_2$ is used for a dielectric layer, the recording sensitivity of the information recording medium can be high and excellent overwrite cycle-ability can be ensured. However, when forming a dielectric layer using ZrO$_2$, the result was that the adhesiveness of the dielectric layer to the recording layer is inferior. With respect to the information recording medium in which the dielectric layer is formed in contact with the recording layer using other various oxides, nitrides, sulfides, selenides and fluorides, the adhesiveness of the dielectric layer to the recording layer and overwrite cycle-ability were evaluated. However, when forming the dielectric layer using one kind of oxide, nitride, sulfide, selenide or fluoride, favorable adhesiveness and favorable overwrite cycle-ability could not be obtained together.

The inventors examined forming a dielectric layer with a combination of two or more kinds of compounds not containing S. As a result, it was found that a combination of a specific oxide(s) and a fluoride(s) is suitable as a constitutive material for the dielectric layer which contacts with the recording layer, which led to this invention.

That is, the present invention provides an information recording medium which includes a substrate and a recording layer wherein a phase change between a crystal phase and an amorphous phase is generated by irradiation of light or application of an electric energy, and which further includes an oxide-fluoride-based material layer comprising at least one element selected from the group GM consisting of Ti, Zr, Hf, Nb, Ta, Cr and Si, oxygen atom (i.e. O), at least one element selected from the group GL consisting of La, Ce, Pr, Nd, Gd, Dy, Ho, Er and Yb, and fluorine atom (i.e. F).

The information recording medium of the present invention is a medium on or from which information is recorded or reproduced by irradiation of light or by application of an electric energy. Generally, irradiation of light is carried out by irradiation of a laser light (that is, laser beam), and application of an electric energy is carried out by applying a voltage to a recording layer. Hereafter, the oxygen-fluoride-based material layer which constitutes the information recording medium of this invention is described in detail.

Specifically, the oxygen-fluoride-based material layer which constitutes the information recording medium of the present invention contains an oxide-fluoride-based material expressed with the formula (1):

$$M_HO_IL_JF_K \text{ (atomic \%)} \quad (1)$$

wherein M represents at least one element selected from the group GM consisting of Ti, Zr, Hf, Nb, Ta, Cr and Si, L represents at least one element selected from the group GL consisting of La, Ce, Pr, Nd, Gd, Dy, Ho, Er and Yb, and H, I, J and K satisfy $10 \leq H \leq 45$, $24 \leq I \leq 76$, $0 < J \leq 19$, and $0 < K \leq 48$. The "atomic %" here shows that the formula (1) is a compositional formula of which basis (i.e. 100%) is the sum of the numbers of "M", oxygen, "L" and fluoride atoms. Also in the following formulae, the indication of "atomic %" is used for showing the same meaning. Further, the formula (1) is a result of counting the numbers of only "M", oxygen, "L" and fluoride atoms contained in the oxide-fluoride-based material layer. Therefore, the oxide-fluoride-based material which contains the material expressed with the formula (1) may contain components other than these atoms.

In the formula (1), it does not matter what compound each atom forms. The reason why the material is specified by this formula is that it is difficult to determine the composition represented with ratio of each compound when analyzing the composition of a layer formed into a thin film, and actually only an elementary composition (that is, ratio of each atom) is often determined. In the material expressed with the formula (1), it is considered that most of element "M" exists as oxide with oxygen atom, and most of element "L" exists as fluoride with fluorine atom. Therefore, in this specification, even the layer which contains the material expressed with the formula (1) is referred to as an oxide-fluoride-based material layer" for convenience.

When the information recording medium of the present invention is an optical recording medium, the oxide-fluoride-based material layer which contains element(s) selected from the group GM, oxygen atom, element(s) selected from the group GL and fluorine atom (which is referred to simply as an "oxide-fluoride-based material layer") preferably exists as either dielectric layer of the two dielectric layers adjacent to the recording layer. More preferably, it exists as both of the two dielectric layers. All the oxides of the elements which are the members of the group GM, that is, Ti, Zr, Hf, Nb, Ta, Cr and Si have a high melting point and are excellent in thermal stability. A layer containing a material which is excellent in thermal stability does not deteriorate easily and is excellent in durability, when the information recording medium which includes the layer is subjected to repeated overwrite. All the fluorides of the elements which are the members of the group GL, that is, La, Ce, Pr, Nd, Gd, Dy, Ho, Er and Yb are insoluble in water and are excellent in moisture resistance. Further, these fluorides adhere well to the recording layer of the chalcogenide material. Therefore, in the information recording medium wherein the dielectric layer is formed from the oxide-fluoride-based material which is a mixture of this oxide and this fluoride, the following effects are obtained:

1) The interface layer is not necessary since the dielectric layer which is free of S can be formed in good contact with the recording layer;
2) The durability against the repeated overwrite and the moisture resistance which are equal to or higher than those of the conventional information recording medium shown in FIG. 10, can be obtained; and
3) The recording sensitivity is improved because the structure of the layer is complicated by mixing the oxide and the fluoride resulting in the low thermal conductivity of the layer whereby the recording layer can be cooled more quickly.

In the information recording medium of the present invention, the oxide-fluoride-based material layer may contain a material which contains, as the elements selected from the group GM, at least one element selected from the group GM1 consisting of Ti, Zr, Hf and Ta, and Cr, and, as the element(s) selected from the group GL, at least one element selected from the group GL1 consisting of La, Ce, Pr and Nd, and is expressed with the following formula (2):

$$M^1_P Cr_Q O_I L^1_J F_K \text{ (atomic \%)} \quad (2)$$

wherein $M^1$ represents at least one element selected from the group GM1, $L^1$ represents at least one element selected from the group GL1, and P, Q, I, J and K satisfy $0<P\leq 38$, $0<Q\leq 45$, $24\leq I\leq 76$, $0<J\leq 19$, and $0<K\leq 48$.

Of the elements in the group GM, each of Ti, Zr, Hf and Ta forms an oxide which has a higher melting point and shows greater thermal stability. Therefore, in this specification, the group consisting of these elements is referred to as "GM1" so that they are distinguished from the other elements. Cr is suitable for constituting the oxide-fluoride-based material layer as the element selected from the group GM since the oxide thereof is excellent in adhesiveness to the recording layer of chalcogenide material. Of fluorides of rare earth substances, each of the fluorides of La, Ce, Pr and Nd is low-cost as well as insoluble in water and excellent in moisture resistance. Therefore, in this specification, the group consisting of these elements is referred to as "GL1" so that they are distinguished from the other elements.

Preferably, in the optical recording medium, the oxide-fluoride material layer which contains the material expressed with the formula (2) also exists as either dielectric layer of the two dielectric layers adjacent to the recording layer. More preferably, it exists as both of the two dielectric layers. The information recording medium which includes the dielectric layer containing the material expressed with the formula (2) shows more excellent overwrite cycle-ability and has better adhesiveness of the dielectric layer to the recording layer. Further, the information recording medium can be produced at low cost since the oxide-fluoride-base material layer can be formed at low cost.

In the information recording medium of the present invention, the oxide-fluoride-based material layer may contain a material which contains, as the elements selected from the group GM, Si in addition to Cr and the element(s) selected from the group GM 1, and is expressed with the formula (3):

$$M^1_R Cr_S Si_T O_U L^1_V F_W \text{ (atomic \%)} \quad (3)$$

wherein $M^1$ represents at least one element selected from the group GM1, $L^1$ represents at least one element selected from the group GL1, and R, S, T, U, V and W satisfy $0<R\leq 28$, $0<S\leq 33$, $0<T\leq 19$, $25\leq U\leq 70$, $0\leq V\leq 18$, and $0<W\leq 45$. Preferably, in the optical recording medium, the oxide-fluoride-based material layer which contains the material expressed with the formula (3) also exists as either dielectric layer of the two dielectric layers adjacent to the recording layer. More preferably, it exists as both of the two dielectric layers. Since the oxide of Si makes the oxide-fluoride-based material layer soft, the membrane-break or membrane-disruption which may occur due to the repeated recording is prevented.

As mentioned in the above, it is considered that the element(s) selected from the group GM exists as an oxide(s) with oxygen, the element(s) selected from the group GL exists as a fluoride(s) with fluorine. Therefore, the above oxide-fluoride-based material layer can be identified as a layer which contains one or more oxides which each are an oxide of at least one element selected from the group GM consisting of Ti, Zr, Hf, Nb, Ta, Cr and Si, and one or more fluorides which each are a fluoride of at least one element selected from the group GL consisting of La, Ce, Pr, Nd, Gd, Dy, Ho, Er and Yb.

In the layer identified in this manner, the group of oxides of the elements selected from the group GM and the group of fluorides of the elements selected from the group GL are contained in an amount of 90 mol % or more in total. Here, the term "group of oxides" is generically used to refer to all the oxides in the case where two or more kinds of elements are selected from the group GM, and therefore two or more kinds of oxides are contained in the layer. If only one element is selected from the group GM, and therefore one kind of oxide is contained in the layer, the term "group of oxides" is used to refer to the oxide. The same is applicable to the term "group of fluorides." In other words, the oxide-fluoride-based material layer can contain up to 10 mol % of compounds other than the oxides of the elements selected from the group GM and the fluorides of the elements selected from the group GL. Such compound is referred to as a "third component." When the ratio of the third component exceeds 10 mol %, the stability and the moisture resistance of the layer is reduced, and therefore, the above effects are difficult to obtain.

In the above-identified layer, the oxide(s) of the element(s) selected from the group GM is preferably contained in an amount of 50 mol % or more, and more preferably 50 mol % to 90 mol % when the total amount of the group of oxides of the elements selected from the group GM and the group, of fluorides of the elements selected from the group GL is basis (100 mol %). If the ratio of the group of oxides of the elements selected from the group GM is less than 50 mol %, for example, the overwrite cycle-ability tends to be inferior in the case where the oxide-fluoride-based material layer is the dielectric layer in contact with the recording layer.

The layer which is identified as the layer containing a mixture of oxide(s) and fluoride(s) preferably contains, as the oxides of the elements selected from the group GM, one ore more oxides which each are an oxide of at least one element selected from the group GM1 consisting of Ti, Zr, Hf and Ta, and an oxide of Cr, and as the fluoride(s) of the element(s) selected from the group GL, one or more fluorides which each are a fluoride of at least one element selected from the group GL1 consisting of La, Ce, Pr and Nd. The effect given by this layer is as described in connection with the material expressed with the above formula (2).

In this layer, the group of the oxides of the elements selected from the group GM1 and the oxide of Cr are preferably contained in an amount of 50 mol % or more, and more preferably in an amount of 50 to 90 mol % in total when the total amount of these oxides and the group of fluorides of the elements selected from the group GL1 is basis (100 mol %). If the ratio of these oxides is less than 50 mol %, for example, the overwrite cycle-ability tends to be inferior in the case where the oxide-fluoride-based material layer is the dielectric layer in contact with the recording layer. Still more preferably, the group of oxides of the elements selected from the group GM1 and the oxide of Cr are contained in an amount of 10 mol % or more respectively to the above basis.

Further, this layer may contain the oxide of Si in addition to the oxide of at least one element selected from the group GM1 and the oxide of Cr. The effect give by the oxide of Si is as described in connection with the material expressed with the formula (3).

The layer which contains the oxide of at least one element selected from the group GM1 and the oxide of Cr and the oxide of Si preferably contains at least one oxide selected from $ZrO_2$, $HfO_2$ and $Ta_2O_5$, and $SiO_2$ and $Cr_2O_3$, and $LaF_3$ as the fluoride of the element selected from the group GL. Specifically, such an oxide-fluoride-based material layer contains a material expressed with the formula (4):

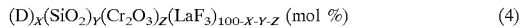

$$(D)_X(SiO_2)_Y(Cr_2O_3)_Z(LaF_3)_{100-X-Y-Z} \text{ (mol \%)} \quad (4)$$

wherein D represents at least one oxide selected from $ZrO_2$, $HfO_2$ and $Ta_2O_5$, and X, Y and Z satisfy $20 \leq X \leq 70$, $10 \leq Y \leq 50$, $10 \leq Z \leq 60$, and $50 \leq X+Y+Z \leq 90$. $ZrO_2$, $HfO_2$ and $Ta_2O_5$ have a high melting point and are thermally stable. $LaF_3$ is most suitable for the practical use because it has the highest melting point of 1500° C. of the fluorides which are insoluble in water, and is low-cost. The preferable ratio of each compound is defined by X, Y and Z as shown above. By using this oxide-fluoride-based material layer as the dielectric layer which is in contact with the recording layer, it is possible to eliminate the interface layer. Further, the information recording medium containing this layer as the dielectric layer realizes a good signal quality and is excellent in overwrite cycle-ability, moisture resistance, recording sensitivity, archival characteristic and archival overwrite characteristic.

In the oxide-fluoride-based material layer containing $ZrO_2$, $SiO_2$, $Cr_2O_3$ and $LaF_3$, when the contents of $ZrO_2$ and $SiO_2$ are substantially equal, it is preferable that $ZrSiO_4$ is contained. $ZrSiO_4$ is a complex oxide with a stable stoichiometric composition. $ZrSiO_4$ has high stable structural stability and low thermal conductivity. Therefore, when oxide-fluoride-based material layer containing $ZrSiO_4$ is provided as the dielectric layer in contact with the recording layer, the information recording medium which is excellent in overwrite cycle-ability and has high recording sensitivity can be realized.

Preferably, the oxide-fluoride-based material layer which contains $ZrSiO_4$, $Cr_2O_3$ and $LaF_3$ is a layer which contains a material expressed with the formula (5):

$$(ZrSiO_4)_A(Cr_2O_3)_B(LaF_3)_{100-A-B} \text{ (mol \%)} \quad (5)$$

wherein A and B satisfy $20 \leq A \leq 70$, $10 \leq B \leq 50$, $50 \leq A+B \leq 90$. The ratio of each compound is defined by A and B. By using this oxide-fluoride-based material layer as the dielectric layer which is in contact with the recording layer, it is possible to eliminate the interface layer. Further, the information recording medium containing this layer as the dielectric layer realizes a good signal quality and is excellent in overwrite cycle-ability, moisture resistance, recording sensitivity, archival characteristic and archival overwrite characteristic.

The composition analysis of the oxide-fluoride-based material layer which exists in the information recording medium of the present invention can be conducted using a X-ray-microanalyser. In that case, the composition is obtained as an atomic concentration of each element.

For example, when the membrane which is formed on a carbon substrate by sputtering with a sputtering target which is represented by the below-mentioned formula (40), i.e. $(ZrO_2)_x(SiO_2)_y(Cr_2O_3)_z(LaF_3)_{100-x-y-z}$ (mol %) is analyzed, the atomic concentration of Zr, Si, Cr, La, O and F can be determined. As a result, the actual analyzed values may not be consistent with the stoichiometric composition of $ZrO_2$, $SiO_2$, $Cr_2O_3$, and $LaF_3$, and therefore not be expressed with the formula (4), i.e., $(ZrO_2)_X(SiO_2)_Y(Cr_2O_3)_Z(LaF_3)_{100-X-Y-Z}$ (mol %). Even in that case, the object of the present invention is achieved as long as the oxide-fluoride-based material layer contains at least one element selected from the group GM, oxygen atom, at least one element selected from the group GL, and fluorine atom, and preferably contains the material which is expressed with the formula (1), (2) or (3).

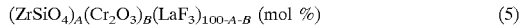

Any of the above-mentioned oxide-fluoride-based material layers preferably exist as the dielectric layer which is formed in contact with the recording layer in the information recording medium of the present invention. In that case, the dielectric layers may be formed in contact with both surfaces of the recording layer. Alternatively, any of the above-mentioned oxide-fluoride-based material layers exist as an interface layer which is located between the recording layer and the dielectric layer in an information recording medium of the present invention. In other words, any of the above-mentioned oxide-fluoride-based material layers are preferably formed in contact with the recording layer in the information recording medium of the present invention.

The information recording medium of the present invention preferably has a recording layer in which a phase change is generated reversibly. That is, the information recording medium of this invention is preferably provided as a rewritable information recording medium.

Specifically, the recording layer where a phase change occurs reversibly preferably contains any one material selected from Ge—Se—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. Each of these is a rapid crystallization material. Therefore, when a recording layer is formed from these materials, it is possible to record information at a high density and a high transfer rate, and to obtain the information recording medium excellent in reliability (specifically archival characteristic or archival overwrite characteristic).

When the information recording medium of this invention has the recording layer where a phase change occurs reversibly, it is desirable that the film thickness of the recording layer is 15 nm or less. If it exceeds 15 nm, the heat applied to the recording layer will diffuse in the planar direction and will be difficult to diffuse in the thickness direction, which interferes with overwrite of the information.

The information recording medium of this invention may have a constitution in which a first dielectric layer, a recording layer, a second dielectric layer, and a reflective layer are formed in this order on one surface of a substrate. The information recording medium of this constitution is a medium on which information is recorded by irradiation of light. In this specification, the "first dielectric layer" means the dielectric layer which is in the position closer to the incident light, and the "second dielectric layer" means the dielectric layer which is in the position farther from the incident light. That is, the incident light passes through the first dielectric layer and the recording layer in this order, and then reaches the second dielectric layer. The information recording medium of this constitution is used, for example, when recording and reproducing by the laser beam having a wavelength of about 660 nm.

When the information recording medium of this invention has this constitution, at least one of the first dielectric layer and the second dielectric layer is the above oxide-fluoride-based material layer. Preferably, both of the dielectric layers are the above oxide-fluoride-based material layers. In this case, the compositions of both dielectric layers may be the same or different from each other.

As one embodiment of the information recording medium of this constitution, there is an information recording medium in which a first dielectric layer, an interface layer, a recording layer, a second dielectric layer, an optical compensation layer and a reflective layer are formed in this order on one surface of a substrate, and the second dielectric layer is the above oxide-fluoride-based material layer and is in contact with the recording layer.

The information recording medium of this invention may have a constitution in which a reflective layer, a second dielectric layer, a recording layer, and a first dielectric layer are formed in this order on one surface of a substrate. This constitution is employed when the thickness of the substrate to which a light is applied needs to be thin. Specifically, the information recording medium of this constitution is used when information is recorded and reproduced by a short-wavelength laser beam having a wavelength of about 405 nm, and the numerical aperture NA of an objective lens is made as large as, for example, 0.85 in order to set a focal position shallow. In order to use such a wavelength and numerical aperture NA, the thickness of the substrate to which light is applied needs to be set at between about 60 and 120 μm, for example. It is difficult to form a layer on the surface of such a thin substrate. Therefore, the information recording medium of this constitution is identified as a medium formed by using a substrate to which a light is not applied as a support substrate, and stacking a reflective layer and so on in the order on one surface of the substrate.

When the information recording medium of this invention has this constitution, at least one of the first dielectric layer and the second dielectric layer is the above oxide-fluoride-based material layer. Preferably, both of the dielectric layers are the above oxide-fluoride-based material layers. In this case, the compositions of both dielectric layers may be the same or different from each other.

As one embodiment of the information recording medium of this constitution, there is an information recording medium in which a reflective layer, an optical compensation layer, a second dielectric layer, a recording layer, an interface layer and a first dielectric layer are formed in this order on one surface of a substrate, and the second dielectric layer is the above oxide-fluoride-based material layer and is in contact with the recording layer.

The information recording medium of this invention may have two or more recording layers. For example, such an information recording medium has a single-sided dual-layer structure, in which two recording layers are formed on one surface of a substrate with a dielectric layer and an intermediate layer therebetween. As to the information recording medium of the single-sided dual-layer structure, information is recorded in two recording layers by irradiation of light from one side. By employing this structure, the recording capacity can be made large. Alternatively, an information recording medium of this invention may include a recording layer on both surfaces of a substrate.

As one embodiment of the information recording medium which has two or more recording layers, there is an information recording medium in which at least a second reflective layer, a fifth dielectric layer, a second recording layer, a fourth dielectric layer, an intermediate layer, a third dielectric layer, a first reflective layer, a second dielectric layer, a first recording layer, and a first dielectric layer are formed in this order, and at least one of the first dielectric layer, the second dielectric layer, the fourth dielectric layer and the fifth dielectric layer is the above oxide-fluoride-based material layer and is in contact with the first recording layer or the second recording layer.

This invention also provides a method for producing the information recording medium of this invention which includes the process of forming the above-mentioned oxide-fluoride-based material layer by a sputtering method.

According to the sputtering method, the oxide-fluoride-based material layer whose composition is substantially the same as that of a sputtering target, can be formed. Therefore, according to this producing method, the oxide-fluoride-based material layer of a desired composition can be easily formed by selecting a sputtering target appropriately.

Specifically, a sputtering target which contains a material expressed with the following formula (10):

$$M_h O_i L_j F_k \text{ (atomic \%)} \tag{10}$$

wherein M represents at least one element selected from the group GM consisting of Ti, Zr, Hf, Nb, Ta, Cr and Si, L represents at least one element selected from the group GL consisting of La, Ce, Pr, Nd, Gd, Dy, Ho, Er and Yb, and h, i, j and k satisfy $10 \leq h \leq 45$, $24 \leq i \leq 76$, $0 < j \leq 19$, and $0 < k \leq 48$, may be used. The formula (10) is equivalent to an elementary composition formula of the material in which most of the elements selected from the group GM exist in the form of oxide, and most of the elements selected from the group GL exist in the form of fluoride. By using this target, the layer which contains the material expressed with the above-mentioned formula (1) can be formed.

Alternatively, a sputtering target which contains a material expressed with the following formula (20):

$$M^1_p Cr_q O_i L^1_j F_k \text{ (atomic \%)} \tag{20}$$

wherein $M^1$ represents at least one element selected from the group GM1 consisting of Ti, Zr, Hf and Ta, $L^1$ represents at least one element selected from the group GL1 consisting of La, Ce, Pr and Nd, and p, q, i, j and k satisfy $0 < p \leq 38$, $0 < q \leq 45$, $24 \leq i \leq 76$, $0 < j \leq 19$, and $0 < k \leq 48$, may be used. By using this sputtering target, the layer which contains the material expressed with the above-mentioned formula (2) can be formed.

Alternatively, a sputtering target which contains a material expressed with the following formula (30):

$$M^1_r Cr_s Si_t O_u L^1_v F_w \text{ (atomic \%)} \tag{30}$$

wherein $M^1$ represents at least one element selected from the group GM1 consisting of Ti, Zr, Hf and Ta, $L^1$ represents at least one element selected from the group GL1 consisting of La, Ce, Pr and Nd, and r, s, t, u, v and w satisfy $0 < r \leq 28$, $0 < s \leq 33$, $0 < t \leq 19$, $25 \leq u \leq 70$, $0 < v \leq 18$, and $0 < w \leq 45$. By using this sputtering target, the layer which contains the material expressed with the above-mentioned formula (3) can be formed.

Alternatively, a sputtering target which contains one or more oxides which each are an oxide of at least one element selected from the group GM consisting of Ti, Zr, Hf, Nb, Ta, Cr and Si, and one or more fluorides which each are a fluoride of at least one element selected from the group GL consisting of La, Ce, Pr, Nd, Gd, Dy, Ho, Er and Yb may be used. The reason why the sputtering target is thus specified is that the sputtering target containing the element(s) selected from the group GM, oxygen, the element(s) selected from the group GL and fluorine is usually provided with the indication of the composition of the oxide(s) of the element(s) selected from the group GM and the fluoride(s) of the element(s) selected from the group GL. Further, the inventors have confirmed that, according to analysis with an X-ray microanalyser, the elementary composition of a sputtering target with such an indication of composition becomes substantially equal to the elementary composition calculated from the indicated composition (that is, the indicated composition (i.e. nominal composition) is correct).

Therefore, the sputtering target which is provided as a mixture of oxide(s) and fluoride(s) is preferably used in the producing method of the present invention.

The sputtering target which is provided as the mixture of oxide(s) and fluoride(s) preferably contains the group of oxides of the elements selected from the group GM and the group of fluorides of the elements selected from the group GL in an amount of 90 mol % or more in total. In other words, the sputtering target contains the third component in an amount of 10 mol % or less. When the ratio of the third component in the sputtering target exceeds 10 mol %, also the ratio of the third component exceeds 10 mol % in the oxide-fluoride-based material layer obtained by sputtering this target, whereby it may be difficult to obtain the information recording medium which gives the desired effects.

In the sputtering target which is provided as the mixture of oxide(s) and fluoride(s), the oxide(s) of the element(s) selected from the group GM is preferably contained in an amount of 50 mol % or more, and more preferably 50 mol % to 90 mol % when the total amount of the group of oxides of the elements selected from the group GM and the group of fluorides of the elements selected from the group GL is basis (100 mol %). If the ratio of the group of oxides of the elements selected from the group GM is less than 50 mol % in the sputtering target, the ratio of the group of oxides in the layer obtained by using such a sputtering target is also less than 50 mol %, whereby it is difficult to obtain the information recording medium which gives the desired effects.

The sputtering target which is provided as the mixture of oxide(s) and fluoride(s) preferably contains, as the oxides of the elements selected from the group GM, an oxide of Cr and one or more oxides which each are an oxide of at least one element selected from the group GM1 consisting of Ti, Zr, Hf and Ta, and as the fluoride(s) of the element(s) selected from the group GL, one or more fluorides which each are a fluoride of at least one element selected from the group GL1 consisting of La, Ce, Pr and Nd. By using this sputtering target, a layer which contains one or more oxides which each are an oxide of at least one element selected from the group GM1 and one or more fluorides which each are a fluoride of at least one element selected from the group GL1 can be formed.

In this Cr-containing sputtering target, the group of oxides of the elements selected from the group GM1 and the oxide of Cr are preferably contained in an amount of 50 mol % or more in total, and more preferably in an amount of 50 to 90 mol % in total when the total amount of these oxides and the group of fluorides of the elements selected from the group GL is basis (100 mol %). By using the sputtering target which contains those oxides in an amount of less than 50 mol %, a layer obtained also contains those oxides in an amount of less than 50 mol %, whereby it is difficult to obtain the information recording medium which gives the desired effect.

The Cr-containing sputtering target further contains the oxide of Si. By using the sputtering target containing the oxide of Si, the layer obtained also contains the oxide of Si and gives a favorable property to the information recording medium.

More specifically, the preferable sputtering target contains, as the oxides of the elements selected from the group GM, at least one oxide selected from $ZrO_2$, $HfO_2$ and $Ta_2O_5$, and $SiO_2$ and $Cr_2O_3$, and, as the fluoride of the element selected from the group GL, $LaF_3$. Such a sputtering target preferably contains a material expressed with the formula (40):

$$(D)_x(SiO_2)_y(Cr_2O_3)_z(LaF_3)_{100-x-y-z} \text{ (mol \%)} \quad (40)$$

wherein D represents at least one oxide selected from $ZrO_2$, $HfO_2$ and $Ta_2O_5$, and x, y and z satisfy $20 \leq x \leq 70$, $10 \leq y \leq 50$, $10 \leq z \leq 60$, and $50 \leq x+y+z \leq 90$. By using the sputtering target, an oxide-fluoride-based material layer which contains the material expressed with the above formula (4) can be formed.

The sputtering target which contains the material expressed with the formula (40) may be one in which $ZrO_2$ and $SiO_2$ are contained at equal ratio, and thereby $ZrSiO_4$ is formed. Such a sputtering target preferably contains a material expressed with the formula (50):

$$(ZrSiO_4)_a(Cr_2O_3)_b(LaF_3)_{100-a-b} \text{ (mol \%)} \quad (50)$$

wherein a and b satisfy $20 \leq a \leq 70$, $10 \leq b \leq 50$, and $50 \leq a+b \leq 90$. By using this sputtering target, an oxide-fluoride-based material layer which contains the material expressed with the formula (5) can be formed.

Preferably, this invention is characterized in that the layer which is in direct contact with the recording layer is formed from a mixture of one or more oxides which each are an oxide of at least one element selected from the group GM consisting of Ti, Zr, Hf, Nb, Ta, Cr and Si and one or more fluorides which each are a fluoride of at least one element selected from the group GL consisting of La, Ce, Pr, Nd, Gd, Dy, Ho, Er and Yb. According to this characteristic by eliminating the interface layer which is provided between the recording layer and the dielectric layer in the prior art optical information recording medium, the number of layers can be reduced, while the optical information recording medium which has high reliability, and ensures excellent overwrite cycle-ability and high recording sensitivity, can be realized. When the oxide-fluoride-based material layer is used as a dielectric layer for insulating a recording layer in the information recording medium to which an electric energy is applied, the phase change of the recording layer can be generated with a small electric energy.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Hereafter, the embodiments of the present invention are described with reference to the accompanying drawings. The following embodiments are illustrative, and the present invention is not limited to the following embodiments.
(Embodiment 1)

Figure 1:
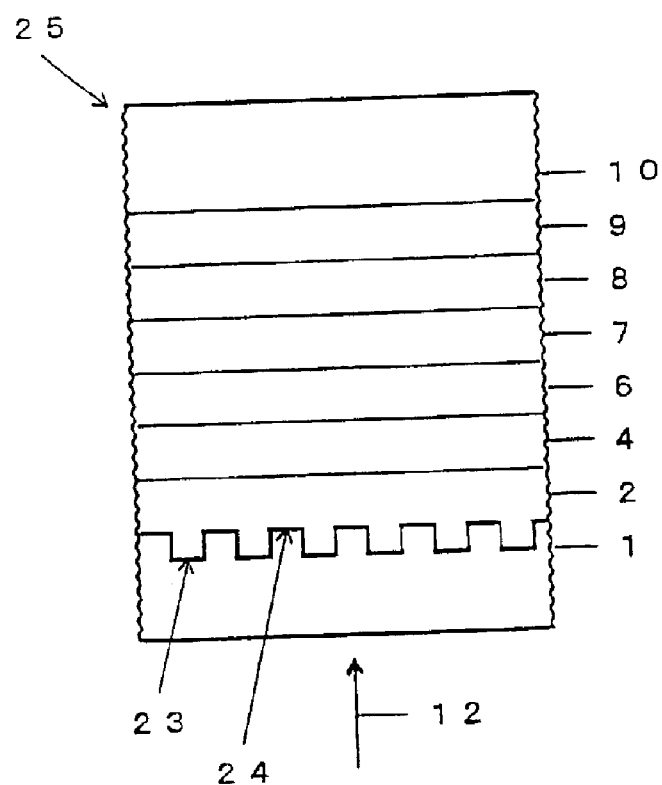
FIG. 1 is a fragmentary sectional view which schematically shows an example of the optical information recording medium of the invention.

As Embodiment 1 of this invention, an example of the optical information recording medium on or from which information is recorded or reproduced by a laser beam, is described. FIG. 1 shows the partial cross section of the optical information recording medium.

The information recording medium 25 shown in FIG. 1 has a construction in which a first dielectric layer 2, a recording layer 4, a second dielectric layer 6, an optical compensation layer 7, and a reflective layer 8 are formed on one surface of a substrate 1 in this order (i.e. the layer 8 is formed on the layer 7, which is formed on the layer 6, which is formed on the layer 4, which is formed on the layer 2), and a dummy substrate 10 is bonded to the reflective layer 8 with an adhesive layer 9. The information recording medium of this constitution can be used as a 4.7 GB DVD-RAM on or from which information is recorded or reproduced by a laser beam with a wavelength of about 660 nm in a red wavelength region. A laser beam 12 is applied to the information recording medium of this constitution from the substrate 1 side, and thereby, information is recorded and reproduced. The information recording medium 25 is different from the prior art information recording medium 31 shown in FIG. 10 in that it does not have the first interface layer 103 and the second interface layer 105.

In Embodiment 1, both of the first dielectric layer 2 and the second dielectric layer 6 are oxide-fluoride-based material layers. As described in the above, the oxide-fluoride-based material layer is a layer which contains one ore more oxides which each are an oxide of at least one element selected from the group GM consisting of Ti, Zr, Hf, Nb, Ta, Cr and Si, and one or more fluorides which each are a fluoride of at least one element selected from the group GL consisting of La, Ce, Pr, Nd, Gd, Dy, Ho, Er and Yb.

Generally, it is required that the material for a dielectric layer 1) is transparent; 2) has a high melting point and does not melt at the time of recording; and 3) has good adhesiveness to the recording layer which is of chalcogenide material. Transparency is a characteristic necessary for allowing the laser beam 12 applied from the substrate 1 side to pass through the dielectric layer and to reach the recording layer 4. Particularly, this characteristic is required for the first dielectric layer on the laser incident side. The high melting point is a characteristic necessary for ensuring that the material of the dielectric layer is not immixed in the recording layer when applying the laser beam of a peak power level. High melting point is required for both of the first and the second dielectric layers. If the material of the dielectric layer is immixed in the recording layer, overwrite cycle-ability deteriorates remarkably. Good adhesiveness to the recording layer which is of chalcogenide material is a characteristic necessary for ensuring reliability of the information recording medium. This characteristic is required for both of the first and the second dielectric layers. Further, it is necessary to select the material for the dielectric layer so that the information recording medium has recording sensitivity equivalent to or higher than the conventional information recording medium (that is, a medium wherein an interface layer is located between the dielectric layer consisting of ZnS-20 mol % $SiO_2$ and the recording layer).

Of the components contained in the above oxide-fluoride-based material layer, all the oxides of the elements which are the members of the group GM are transparent and have a high melting point and excellent thermal stability. Therefore, these compounds ensure the overwrite cycle-ability of the information recording medium. All the fluorides of the elements which are the members of the group GL are insoluble in water and excellent in moisture resistance. Therefore, these compounds ensure the moisture resistance of the information recording medium. The oxides of the elements of the group GM include, for example, $TiO_2$, $ZrO_2$, $HfO_2$, $Nb_2O_5$, $Ta_2O_5$, $Cr_2O_3$ and $SiO_2$. The fluorides of the elements of the group GL include, for example, $LaF_3$, $CeF_3$, $PrF_3$, $NdF_3$, $GdF_3$, $DyF_3$, $HoF_3$, $ErF_3$, and $YbF_3$. By forming the first dielectric layer 2 and the second dielectric layer 6 from a mixture of the oxide(s) and the fluoride(s) not containing S in contact with the recording layer 4 as illustrated, the information recording medium 25 which is excellent in overwrite cycle-ability with favorable adhesiveness between the recording layer and the dielectric layer can be realized. Further, the layer is made more complex by mixing the oxide and the fluoride, whereby the thermal conduction in the dielectric layer is suppressed. Therefore, by employing the above oxide-fluoride based material layer, the dielectric layer which quenches the recording layer more effectively can be formed, which leads to improvement in recording sensitivity of the information recording medium.

The above oxide-fluoride-based material layer may contain oxides of two or more elements selected from the group GM, that is, two or more kinds of oxides. The two or more kinds of oxides may form a complex oxide. The above oxide-fluoride-based material layer may contain fluorides of two or more elements selected from the group GL, that is, two or more kinds of fluorides. An example of the layer which contains two or more kinds of oxides is the layer which contains the material expressed with the above formula (4). An example of the layer in which two or more kinds of oxides form a complex oxide is the layer which contains the material expressed with the above formula (5).

The first dielectric layer 2 and the second dielectric layer 6 are preferably oxide-fluoride-based material layers each of which contains, an oxide of Cr and one or more oxides which each are an oxide of at least one element selected from the group GM1 consisting of Ti, Zr, Hf and Ta as the oxides of the elements selected from the group GM, and one or more fluorides which each are a fluoride of at least one element selected from the group GL1 consisting of La, Ce, Pr and Nd as the fluoride(s) of the element(s) selected from the group GL. All the oxides of the elements which are the members of the group GM1 have a higher melting point and more excellent thermal stability. The oxide of Cr is excellent in adhesiveness to the recording layer which is formed from chalcogenide material. All the fluorides of the elements which are the members of the group GL1 have advantage in cost. Therefore, in the case where the first and the second dielectric layers 2 and 6 are the oxide-fluoride-based material layers containing these particular oxides and fluoride(s), the information recording medium which is more excellent in overwrite cycle-ability can be provided at a lower cost. When this oxide-fluoride-based material layer further contains the oxide of Si, the dielectric layer is softened, whereby membrane-break or membrane-disruption of the dielectric layer is prevented even if the information recording medium is subjected to the repeated recording.

More specifically, it is preferable that the oxide-fluoride-based material layer contains at least one oxide selected from $ZrO_2$, $HfO_2$ and $Ta_2O_5$ as the oxide(s) of the element(s) selected from the group GM1 and $SiO_2$ and $Cr_2O_3$, and $LaF_3$ as the fluoride of the element selected from the group GL1. Each of $ZrO_2$ and $HfO_2$ is transparent and has a high melting point (about 2700° C.) and thermal stability. Further, of the oxides, $ZrO_2$, $HfO_2$ and $Ta_2O_5$ have low thermal conductivity. Since $LaF_3$ has the highest melting point of about 1500° C. of the fluorides which are insoluble in water, and is low-cost, it is most suitable for practically using as the fluoride for constituting the dielectric layer. The material containing at least one oxide selected from $ZrO_2$, $HfO_2$ and $Ta_2O_5$, and $SiO_2$, $Cr_2O_3$ and $LaF_3$ is expressed with the above formula (4), i.e. $(D)_X(SiO_2)_Y(Cr_2O_3)_Z(LaF_3)_{100-X-Y-Z}$ (mol %). In this formula, D represents one or more oxides selected from $ZrO_2$, $HfO_2$ and $Ta_2O_5$. Further, in this formula, X, Y and Z each of which denotes the mixing ratio of each compound, satisfy $20 \leq X \leq 70$, $10 \leq Y \leq 50$, $10 \leq Z \leq 60$, and $50 \leq X+Y+Z \leq 90$. When X which is the mixing ratio of one oxide or the mixing ratio in total of two or more oxides selected from $ZrO_2$, $HfO_2$ and $Ta_2O_5$, and Y which is the mixing ratio of $SiO_2$ are within the above ranges, the information recording medium shows excellent overwrite cycle-ability. When Z which is the mixing ratio of $Cr_2O_3$ is within the above range, the oxide-fluoride-based material layer which is excellent in adhesiveness to the recording layer can be obtained. When X+Y+Z is within the above range, 100-X-Y-Z is within the range of 10 to 50. When 100-X-Y-Z (which is the mixing ratio of $LaF_3$) is within this range, the information recording medium shows excellent recording sensitivity.

The oxide-fluoride based material layer may be a layer which contains $ZrSiO_4$, $Cr_2O_3$ and $LaF_3$. $ZrSiO_4$ is a complex oxide which is formed when $ZrO_2$ and $SiO_2$ are mixed at 1:1, and has a high structural stability. The material which contains $ZrSiO_4$, $Cr_2O_3$ and $LaF_3$ is expressed with the above formula (5), i.e. $(ZrSiO_4)_A(Cr_2O_3)_B(LaF_3)_{100-A-B}$ (mol %). In this formula, A and B each of which denotes the mixing ratio of each compound satisfy $20 \leq A \leq 70$, $10 \leq B \leq 50$, $50 \leq A+B \leq 90$. When A which is the mixing ratio of $ZrSiO_4$ is within the above range, the information recording medium shows excellent overwrite cycle-ability. When B which is the mixing ratio of $Cr_2O_3$ is within the above range, the oxide-fluoride-based material layer which is excellent in adhesiveness to the recording layer can be obtained. When A+B is within the above range, 100-A-B is within the range of 10 to 50. When 100-A-B which is the mixing ratio of $LaF_3$ is within the above range, the information recording medium shows excellent recording sensitivity.

Figure 7:
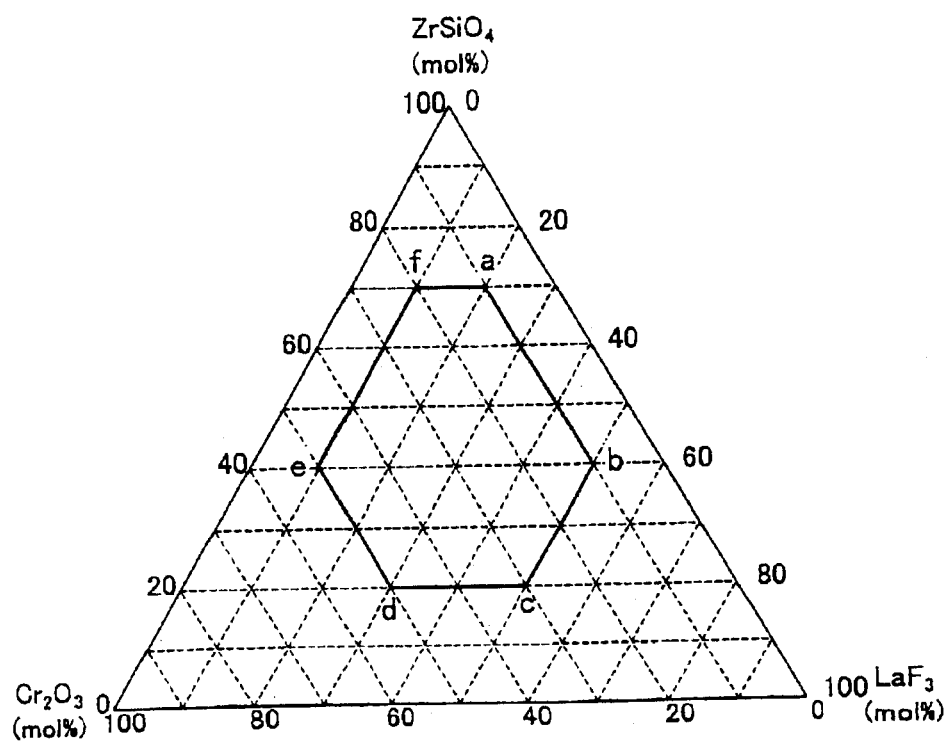
FIG. 7 is a triangular diagram which shows the composition range of the material expressed with the formula (5)

The composition range of material expressed with the formula (5) is shown in FIG. 7. The coordinate is ($ZrSiO_4$, $Cr_2O_3$, $LaF_3$) in FIG. 7. In this figure, the material expressed with the formula (5) is within the range (including the place on the line) surrounded by a(70, 10, 20), b(40, 10, 50), c(20, 30, 50), d(20, 50, 30), e(40, 50, 10) and f(70, 20, 10).

The oxide-fluoride-based material layer preferably contains the oxide(s) of the element(s) selected from the group GM and the fluoride(s) of the element(s) selected from the group GL in an amount of 90 mol % or more in total. The layer containing these compounds in an amount of 90 mol % or more always has substantially the same thermal stability and moisture resistance and is preferably used as the first dielectric layer 2 and the second dielectric layer 6 even if it contains the third component other than these compounds. The third component is one which is inevitably contained or formed upon forming the oxide-fluoride-based material layer. As the third component, for example, a dielectric substance, metal, a semimetal, a semiconductor, and/or a nonmetal are contained in the oxide-fluoride-based material layer.

The dielectric substances which may be included as the third component are, for example, $Al_2O_3$, $CeO_2$, $CuO$, $Cu_2O$, $Er_2O_3$, $FeO$, $Fe_2O_3$, $Fe_3O_4$, $Ga_2O_3$, $Ho_2O_3$, $In_2O_3$, a mixture of $In_2O_3$ and $SnO_2$, $La_2O_3$, $Mn_3O_4$, $Nd_2O_3$, $NiO$, $Sc_2O_3$, $Sm_2O_3$, $SnO$, $SnO_2$, $Tb_4O_7$, $WO_3$, $Y_2O_3$, $Yb_2O_3$, $ZnO$, $AlN$, $BN$, $CrN$, $Cr_2N$, $HfN$, $NbN$, $Si_3N_4$, $TaN$, $TiN$, $VN$, $ZrN$, $B_4C$, $Cr_3C_2$, $HfC$, $Mo_2C$, $NbC$, $SiC$, $TaC$, $TiC$, $VC$, $W_2C$, $WC$ and $ZrC$.

The metals which may be included as the third component are, for example, Sc, Y, Ti, Zr, Hf, V, Nb, Ta, Cr, Mo, W, Mn, Fe, Ni, Pd, Pt, Cu, Ag, Au, Zn, La, Ce, Nd, Sm, Gd, Tb, Dy and Yb.

The semimetals and semiconductors which may be included as the third component are, for example, B, Al, C, Si, Ge and Sn. The nonmetals which may be included as the third component are, for example, Sb, Bi, Te and Se.

The first dielectric layer 2 and the second dielectric layer 6 may be the oxide-fluoride-based material layers whose compositions are different from each other. For example, in case where the material expressed with the formula (4), i.e. $(D)_X(SiO_2)_Y(Cr_2O_3)_Z(LaF_3)_{100-X-Y-Z}$ (mol %) is employed, the first dielectric layer 2 is preferably formed from a material whose composition is selected so that it is excellent in moisture resistance, such as $(ZrO_2)_{20}(SiO_2)_{10}(Cr_2O_3)_{50}(LaF_3)_{20}$ (mol %). The second dielectric layer 6 is preferably formed from a material whose composition is selected so that it cools the recording layer more rapidly, such as $(ZrO_2)_{30}(SiO_2)_{10}(Cr_2O_3)_{20}(LaF_3)_{40}$ (mol %). The first dielectric layer 2 may be formed from a material containing the oxide of the element selected from the group GM and/or the fluoride of the element selected from the group GL which are different from those contained in the material which forms the second dielectric layer 6. For example, the first dielectric layer 2 may be formed from $Ta_2O_5$—$Cr_2O_3$—$CeF_3$-mixture-based material, while the second dielectric layer 6 may be formed from $HfO_2$—$SiO_2$—$Cr_2O_3$—$LaF_3$-mixture-based material. In this manner, the oxide-fluoride-based material layer is formed by optimizing the kinds of oxide(s) and fluoride(s), and/or the mixing ratio of those compounds depending on the desired functions.

By changing each optical path length (that is, the product "nd" of refractive index n of a dielectric layer and the film thickness d of a dielectric layer), the first dielectric layer 2 and the second dielectric layer 6 serve to adjust optical absorptance Ac (%) of the recording layer 4 in a crystalline state and optical absorptance Aa (%) of the recording layer 4 in an amorphous state, adjust the optical reflectance Rc (%) of the information recording medium 25 when the recording layer 4 is in a crystalline state and the optical reflectance Ra (%) of the information recording medium 25 when the recording layer 4 is in an amorphous state, and adjust the phase difference $\Delta \phi$ of the light of the information recording medium 25 between the portions where the recording layer 4 is in a crystalline state and an amorphous state. In order to improve signal quality by increasing the reproduced-signal amplitude of a record mark, it is desirable that a reflectance difference (|Rc-Ra|) or a reflectance ratio (Rc/Ra) is large. Further, it is desirable that Ac and Aa are also large so that the recording layer 4 may absorb a laser beam. The optical path length of each of the first dielectric layer 2 and the second dielectric layer 6 is determined so as to satisfy these conditions simultaneously. The optical path length which satisfies those conditions can be determined accurately, for example, by calculation based on a matrix method (for example, see "Wave Optics" by Hiroshi Kubota et al., Section 3, Iwanami Shinsho, 1971).

The oxide-fluoride-based material described above has the refractive index which differs depending on the composition. When setting the refractive index of a dielectric layer at n, the film thickness at d (nm), and the wavelength of the laser beam 12 at $\lambda$(nm), the optical path length "nd" is expressed with nd=a$\lambda$, wherein "a" is a positive number. In order to improve the signal quality by increasing the reproduced-signal amplitude of the record mark of the information recording medium 25, for example, it is preferable that Rc and Ra satisfy 15%$\leq$Rc, and Ra$\leq$2%, respectively. Moreover, in order to eliminate the mark distortion by overwriting, or to make it small, it is preferable that Ac and Aa satisfy 1.1$\leq$Ac/Aa. The optical path length (a$\lambda$) of each of the first dielectric layer 2 and the second dielectric layer 6 was accurately calculated based on the matrix method so that these preferable conditions might be satisfied simultaneously. From the obtained optical path length (a$\lambda$), A and n, the thickness d of each dielectric layer was calculated. As a result, it was found that when the dielectric layer 2 is formed from the material which is expressed with the formula (5), i.e. $(ZrSiO_4)_A(Cr_2O_3)_B$ $(LaF_3)_{100-A-B}$ (mol %) and has a refractive index of 1.8 to 2.3, the thickness is preferably in the range of 130 nm to 170 nm. Further, it was found that when the second dielectric layer 6 is formed from this material, the thickness is preferably in the range of 40 nm to 70 nm.

The substrate 1 is usually a transparent disc-shaped plate. A guide groove for guiding a laser beam may be formed in the surface where the dielectric layer, the recording layer and so on may be formed. In the case where the guide groove is formed on the substrate, groove portions and land portions are formed, when the substrate is viewed in cross section. It can be said that a groove portion is located between two adjacent land portions. Therefore, the surface wherein the guide groove is formed has a top surface and a bottom surface which are connected by side walls. In this specification, when viewed from the direction of the laser beam 12, the surface which is located closer to the laser beam 12 is referred to as a "groove surface" for convenience, whereas the surface which is located away from the laser beam 12 is referred to as a "land surface" for convenience. In FIG. 1, the bottom surface 23 corresponds to the groove surface, whereas the top surface 24 corresponds to the land surface. This is applicable to FIGS. 2, 3 and 6 mentioned below. On the contrary, in FIGS. 4 and 5, the surface 24 which is the bottom surface corresponds to the "land surface", whereas the surface 23 which is the top surface corresponds to the "groove surface." This is because, in the information recording medium illustrated in FIGS. 4 and 5, the order of forming the reflective layer and the recording layer is reverse to that in the information recording medium illustrated in FIG. 1. Record marks are formed in the recording layer on the surface of the recording layer corresponding to the groove surface of the guide groove (groove recording), or on the surface of the recording layer corresponding to the land surface of the guide groove (land recording), or on both of the surfaces of the recording layer (land-groove recording).

In the embodiment shown in FIG. 1, the distance in the thickness direction between the groove surface 23 and the land surface 24 (i.e. the depth of groove) is preferably in the range of 40 nm to 60 nm. The below-mentioned embodiments shown in FIGS. 2, 3 and 6, the distance in the thickness direction between the groove surface 23 and the land surface 24 is preferably in this range. Moreover, it is desirable that the surface where a layer is not formed is flat. As material for the substrate 1, a resin like a polycarbonate, amorphous polyolefin, or PMMA, or glass can be employed. Considering moldability, price and mechanical strength, a polycarbonate resin is preferably used. In the embodiment shown in FIG. 1, the thickness of the substrate 1 is in the range of about 0.5 to 0.7 mm.

The recording layer 4 is a layer where a phase change between a crystal phase and an amorphous phase is generated by irradiation of light or application of an electric energy, and record marks are formed. The erasure and overwrite can be carried out if the phase change is reversible. It is preferable to use Ge—Se—Te or Ge—Sn—Sb—Te which is a rapid crystallization material, as a reversible phase change material. Specifically, GeTe—$Sb_2Te_3$ pseudo-binary composition is preferably used as Ge—Se—Te. In this case, the composition preferably satisfy $4Sb_2Te_3 \leq GeTe \leq 50Sb_2Te_3$. In case of GeTe<$4Sb_2Te_3$, the variation in the amount of reflected light before and after recording is small resulting in deterioration of the quality of a read-out signal. In case of $50Sb_2Te_3$<GeTe, the volume variation between a crystal phase and an amorphous phase is large, resulting in deterioration of overwrite cycle-ability. Ge—Sn—Sb—Te has a crystallization speed higher than Ge—Se—Te. Ge—Sn—Sb—Te is, for example, a material in which Sn is substituted for part of Ge of GeTe—$Sb_2Te_3$ pseudo-binary composition. It is preferable that the content of Sn is 20 atomic % or less in the recording layer 4. If it exceeds 20 atomic %, the crystallization speed is too high and therefore, the stability of an amorphous phase is impaired, which results in deterioration of reliability of record marks. The content of Sn can be adjusted depending on the recording conditions.

The recording layer 4 may be formed from a material containing Bi such as Ge—Bi—Te, Ge—Sn—Bi—Te, Ge—Sb—Bi—Te, or Ge—Sn—Sb—Bi—Te. Bi more easily crystallizes than Sb. Therefore, the crystallization speed of the recording layer can be increased by substituting Bi for part of Sb.

Ge—Bi—Te is a mixture of GeTe and $Bi_2Te_3$. In this mixture, it is preferable that $8Bi_2Te_3 \leq GeTe \leq 25Bi_2Te_3$. In case of GeTe<$8Bi_2Te_3$, the crystallization temperature is reduced, resulting in deterioration of archival characteristic. In case of $25Bi_2Te_3$<GeTe, the volume variation between a crystal phase and an amorphous phase is large, resulting in deterioration of overwrite cycle-ability.

Ge—Sn—Bi—Te is obtained by substituting Sn for part of Ge of Ge—Bi—Te. The crystallization speed can be controlled depending on the recording conditions by adjusting the content of Sn introduced by substitution. Substitution by Sn is suitable for fine adjustment of the crystallization speed compared with substitution by Bi. In the recording layer, the content of Sn is preferably 10 atomic % or less. If the content of Sn is more than 10 atomic %, the crystallization speed becomes too high, which reduces the stability of an amorphous phase, and therefore, the archival characteristic of record, marks is deteriorated.

Ge—Sn—Sb—Bi—Te is obtained by substituting Sn for part of Ge of Ge—Se—Te, and Bi for part of Sb of Ge—Se—Te. This corresponds to a mixture of GeTe, SnTe, $Sb_2Te_3$ and $Bi_2Te_3$. As to this mixture, the crystallization speed can be controlled depending on the recording conditions, by adjusting the contents of Sn and Bi introduced by substitution. In Ge—Sn—Sb—Bi—Te, it is preferable that $4(Sb—Bi)_2Te_3 \leq (Ge—Sn)Te \leq 25(Sb—Bi)_2Te_3$. In case of $(Ge—Sn)Te < 4(Sb—Bi)_2Te_3$, the variation in the amount of reflected light before and after recording is small, resulting in deterioration of the quality of a read-out signal. In case of $25(Sb—Bi)_2Te_3 < (Ge—Sn)Te$, the volume variation between a crystal phase and an amorphous phase is large, resulting in deterioration of overwrite cycle-ability. In the recording layer, the content of Bi is preferably 10 atomic % or less and the content of Si is preferably 20 atomic % or less. These Bi content and Si content make the archival characteristic of record marks good.

As the material in which a phase change is generated reversibly, Ag—In—Sb—Te, Ag—In—Sb—Te—Ge, and Sb—Te containing Sb in an amount of 70 atomic % or more more may be employed.

As an irreversible phase change material, it is preferable to use $TeO_x + \alpha$ ($\alpha$ is Pd, Ge, or the like) as disclosed in Japanese Patent Publication No. 7-025209 B2. The information recording medium whose recording layer is of an irreversible phase change material is a so-called write-once type in which recording can be conducted only once. Also in such an information recording medium, there are problems that the atom in the dielectric layer diffuses into the recording layer with heat at the time of recording, which results in the deterioration of the signal quality. Therefore, this invention is preferably applied to the write-once type information recording medium as well as the rewritable information recording medium.

As mentioned above, when the recording layer 4 is formed from the reversible phase change material (that is, the information recording medium is the rewritable one), the recording layer 4 preferably has a thickness of 15 nm or less, and more preferably 12 nm or less.

The optical compensation layer 7 adjusts the ratio Ac/Aa of the optical absorptance Ac when the recording layer 4 is in a crystalline state, and the optical absorptance Aa when the recording layer 4 is in an amorphous state, and serves to suppress the distortion of the mark shape at the time of overwriting. It is preferable to form the optical compensation layer 7 from a material which has a high refractive index and absorbs a light moderately. For example, the optical compensation layer 7 may be formed using a material whose refractive index n is in the range of 3 to 6, and whose extinction coefficient k is in the range of 1 to 4. Specifically, it is preferable to use material selected from amorphous Ge alloys, such as Ge—Cr and Ge—Mo, amorphous Si alloys, such as Si—Cr, Si—Mo and Si—W, telluride, and crystalline metal, such as Ti, Zr, Nb, Ta, Cr, Mo, W, SnTe, PbTe and so on, semimetals, and semiconductor material. The film thickness of the optical compensation layer 7 is preferably in the range of 20 nm to 60 nm.

The reflective layer 8 has an optical function of increasing the quantity of light absorbed by the recording layer 4, and a thermal function of diffusing the heat generated in the recording layer 4 quickly to quench the recording layer 4, and thereby facilitate the amorphization of the recording layer 4. Further, the reflective layer 8 protects the multilayered film including the recording layer 4 and the dielectric layers 2 and 6 from the operation environment. As the material for the reflective layer 8, for example, the single-metal material with high thermal conductivity, such as Al, Au, Ag and Cu, is used. The reflective layer 8 may be formed from the material which contains another one or more elements in addition to one or more elements selected from the above-mentioned metallic material for the purpose of improving the moisture resistance and/or the purpose of adjusting thermal conductivity or an optical characteristic (for example, an optical reflectance, an optical absorptance or transmissivity). Specifically, an alloy material, such as Al—Cr, Al—Ti, Ag—Pd, and Ag—Pd—Cu, Ag—Pd—Ti, or Au—Cr, may be used. Each of these materials is excellent in corrosion resistance and has a quenching function. The similar purpose may be accomplished also by forming the reflective layer 8 in two or more layers. The thickness of the reflective layer 8 is preferably in the range of 50 to 180 nm, and more preferably from 60 nm to 100 nm.

In the illustrated information recording medium 25, the adhesive layer 9 is provided in order to adhere the dummy substrate 10 to the reflective layer 8. The adhesive layer 9 may be formed using a highly heat-resistant and highly adhesive material, for example, a bonding resin such as an ultraviolet-curing resin. Specifically, the adhesive layer 9 may be formed from an acrylic resin-based material, or an epoxy resin-based material. Moreover, if necessary, before forming the adhesive layer 9, a protective layer which consists of an ultraviolet-curing resin and has a thickness of 5 to 20 $\mu$m may be provided on the surface of the reflective layer 8. The thickness of the adhesive layer 9 is preferably in the range of 15 to 40 $\mu$m, and more preferably in the range of 20 to 35 $\mu$m.

The dummy substrate 10 enhances the mechanical strength of the information recording medium 25 and protects the multilayered body consisting of the layers from the first dielectric layer 2 to the reflective layer 8. The preferable material for the dummy substrate 10 is the same as that for the substrate 1. In the information recording medium 25 which includes the dummy substrate 10, it is preferable that the dummy substrate 10 and the substrate 1 are formed from substantially the same material and have the same thickness so as not to cause mechanical curvature and distortion.

The information recording medium of Embodiment 1 is a single-sided structure disc which has one recording layer. The information recording medium of this invention may have two recording layers. For example, an information recording medium of the double-sided structure is obtained by bonding two laminated pieces in which the layers up to the reflective layer 8 are stacked. The two pieces are bonded through an adhesive layer with the reflective layers 8 facing each other. In this case, the bonding of two pieces are carried out by forming the adhesive layer from a slow-acting resin and applying heat and pressure. In the case where the protective layer is provided on the reflective layer 8, an information recording medium of the double-sided structure is obtained by bonding two layered pieces in which the layers up to the protective layer are formed, with the protective layers facing each other.

Next, the method for producing the information recording medium 25 of Embodiment 1 is described. The information recording medium 25 is produced by carrying out the process in which the substrate 1 (for example, having a thickness of 0.6 mm) where the guide groove (the groove surface 23 and the land surface 24) is formed is set in a film-forming device, and then the first dielectric layer 2 is formed on the surface of the substrate 1 where the guide groove is formed (Process a), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. In this specification including the following description, unless otherwise indicated, the "surface" of each layer means the surface (vertical to the thickness direction) which is exposed when each layer is formed.

First, Process a in which the first dielectric layer 2 is formed on the surface of the substrate 1 in which the guide groove is formed is carried out. Process a is carried out by sputtering. The sputtering is conducted in Ar gas atmosphere using a high frequency electric power unit. The sputtering may be conducted in a mixed-gas atmosphere in which oxygen is mixed in an amount of 5 mol % or less with Ar gas.

As the sputtering target used in Process a, the target which is formed from the material containing an one or more oxides which each are an oxide of at least one element selected from the group GM consisting of Ti, Zr, Hf, Nb, Ta, Cr and Si, and one or more fluorides which each are a fluoride of at least one element selected from the group GL consisting of La, Ce, Pr, Nd, Gd, Dy, Ho, Er and Yb is used. Such a sputtering target contains the material which is expressed with the formula (10), (20) or (30) as a result of elementary analysis. By using the sputtering target, the oxide-fluoride-based material layer containing the material which is expressed with the formula (1), (2) or (3) is formed.

As described above, a sputtering target containing one or more elements selected from the group GM, oxygen atom, one or more elements selected from the group GL, and fluorine atom is provided in the form of a mixture of the oxide(s) of the element(s) of the group GM and the fluoride(s) of the element(s) of the group GL. The sputtering target used in the producing method of the present invention preferably contains the group of oxides of the elements selected from the group GM in an amount of 50 mol % or more, and more preferably in an amount of 50 mol % to 90 mol % of the basis which is the total amount of the group of oxides of the elements selected from the group GM and the group of fluorides of the elements selected from the group GL. If the ratio of the group of oxides of the elements selected from the group GM is small in the sputtering target, the ratio of the group of oxides of the elements selected from the group GM in the layer obtained by sputtering is also small. In that case, it may be difficult to obtain the desired effects in the information recording medium.

As the sputtering target which contains the above particular oxide(s) and fluoride(s), a sputtering target containing at least one oxide selected from $ZrO_2$, $HfO_2$ and $Ta_2O_5$, and $SiO_2$ and $Cr_2O_3$, and $LaF_3$ can be used. Specifically, a sputtering target which contains a material expressed with the formula (40), i.e. $(D)_x(SiO_2)_y(Cr_2O_3)_z(LaF_3)_{100-x-y-z}$ (mol %), wherein D represents at least one oxide selected from $ZrO_2$, $HfO_2$ and $Ta_2O_5$, and x, y and z satisfy $20 \leq x \leq 70$, $10 \leq y \leq 50$, $10 \leq z \leq 60$, and $50 \leq x+y+z \leq 90$, may be used. By using this target, the layer which contains the material expressed with the formula (4) is formed.

Alternatively, as the sputtering target, a sputtering target containing $ZrSiO_4$, $Cr_2O_3$ and $LaF_3$ can be used. More specifically, a sputtering target which contains a material expressed with the formula (50), i.e. $(ZrSiO_4)_a(Cr_2O_3)_b(LaF_3)_{100-a-b}$ (mol %), wherein a and b satisfy $20 \leq a \leq 70$, $10 \leq b \leq 50$, and $50 \leq a+b \leq 90$, may be used. By using this sputtering target, the layer which contains the material expressed with the formula (5) is formed.

Any of the sputtering targets which contain the oxide(s) of the element(s) selected from the group GM and the fluoride(s) of the element(s) selected from the group GL may contain the third component in an amount of 10 mol % or less. The components which may be contained as the third component are exemplified in the above.

Next, Process b is carried out for forming the recording layer 4 on the surface of the first dielectric layer 2. Process b is also carried out by sputtering. The sputtering is conducted in an Ar gas atmosphere or in a mixed-gas atmosphere of Ar gas and $N_2$ gas using a direct-current power source. A sputtering target which contains any one material selected from Ge—Se—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te, and Sb—Te is used. The recording layer 4 after film formation is in an amorphous state.

Next, Process c is conducted for forming the second dielectric layer 6 on the surface of the recording layer 4. Process c is carried out in the same manner as Process a. The sputtering target may be used for forming the second dielectric layer 6, in which the oxide and the fluoride may be the same as those contained in the sputtering target used for forming the first dielectric layer 2, while the mixing ratio of the oxide and the fluoride are different from those in the sputtering target for the first dielectric layer 2. Alternatively, the sputtering target may be used for forming the second dielectric layer 6, in which the oxide and/or the fluoride are different from those contained in the sputtering target used for forming the first dielectric layer 2. For example, in Process a the sputtering target containing $(ZrO_2)_{20}(SiO_2)_{10}(Cr_2O_3)_{50}(LaF_3)_{20}$ (mol %) may be used, while in Process c the sputtering target containing $(ZrO_2)_{30}(SiO_2)_{10}(Cr_2O_3)_{20}(LaF_3)_{40}$ (mol %) may be used. Alternatively, in Process a, the sputtering target containing $Ta_2O_5$—$Cr_2O_3$—$CeF_3$-mixture-based material may be used, while in Process c, the sputtering target containing $HfO_2$—$SiO_2$—$Cr_2O_3$—$LaF_3$-mixture-based material may be used.

Next, Process d is carried out for forming the optical compensation layer 7 on the surface of the second dielectric layer 6. In Process d, the sputtering is carried out using a direct-current power source or a high frequency electric power unit. A sputtering target which consists of a material selected from amorphous Ge alloys, such as Ge—Cr and Ge—Mo, amorphous Si alloys, such as Si—Cr, Si—Mo and Si—W, telluride, and crystalline metal, such as Ti, Zr, Nb, Ta, Cr, Mo, W, SnTe and PbTe, semimetal, semiconductor material and so on, is used. Generally, the sputtering is conducted in an Ar gas atmosphere.

Next, Process e is conducted for forming the reflective layer 8 on the surface of the optical compensation layer 7. Process e is carried out by sputtering. The sputtering is conducted in an Ar gas atmosphere using a direct current power source or a high frequency electric power unit. A sputtering target which consists of an alloy material, such as Al—Cr, Al—Ti, Ag—Pd, Ag—Pd—Cu, Ag—Pd—Ti, or Au—Cr, may be used.

As mentioned above, Processes a–e are all sputtering processes. Therefore, Processes a–e may be conducted successively by changing the target in order in one sputtering device. Alternatively, each of Processes a–e may be conducted using an independent sputtering device.

After forming the reflective layer 8, the substrate 1 on which the layers from the first dielectric layer 2 to the reflective layer 8 are formed in order is picked out from the sputtering device. Then, an ultraviolet-curing resin is applied to the surface of the reflective layer 8, for example, by a spin coat method. The dummy substrate 10 is stuck to the applied ultraviolet-curing resin. An ultraviolet ray is applied from the dummy substrate 10 side to cure the resin, whereby the bonding process is finished.

After finishing the bonding process, an initialization process is carried out if necessary. The initialization process is a process in which the temperature of the recording layer 4 which is in an amorphous state is raised to a temperature more than the crystallization temperature so as to crystallize the layer, for example, by irradiation of a semiconductor laser. The initialization process may be carried out before the bonding process. In this manner, the information recording medium 25 of Embodiment 1 can be produced by implementing Processes a-e, the process of forming the adhesive layer, and the bonding process of the dummy substrate in order.

(Embodiment 2)

Figure 2:
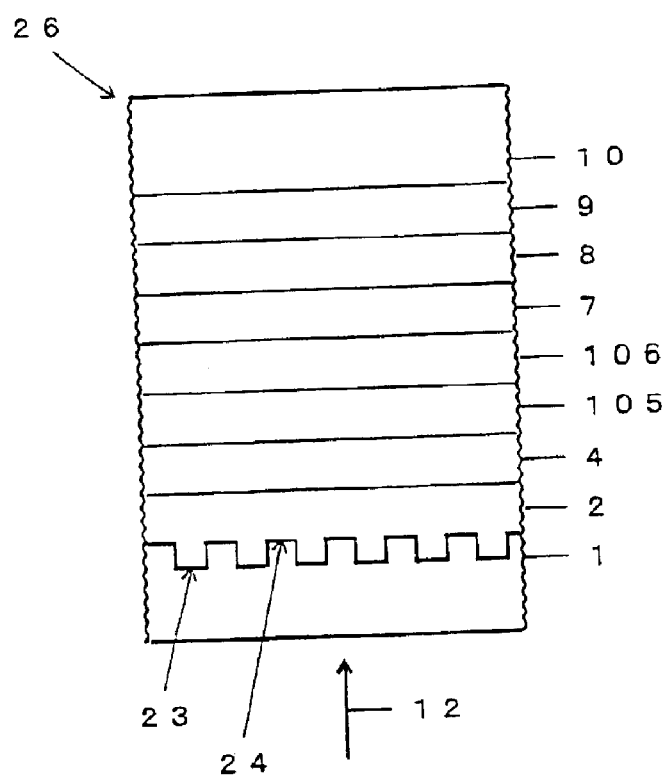
FIG. 2 is a fragmentary sectional view which schematically shows another example of the optical information recording medium of the invention.

As Embodiment 2 of the present invention, another example of the optical information recording medium on or from which information is recorded or reproduced by using a laser beam, is described. FIG. 2 shows the partial cross section of the optical information recording medium.

The information recording medium 26 shown in FIG. 2 has a constitution in which a first dielectric layer 2, a recording layer 4, a second interface layer 105, a second dielectric layer 106, an optical compensation layer 7, and a reflective layer 8 are formed on one surface of a substrate 1 in this order, and furthermore a dummy substrate 10 is adhered to the reflective layer 8 with an adhesive layer 9. The information recording medium 26 shown in FIG. 2 is different from the prior art information recording medium 31 shown in FIG. 10 in that it does not have the first interface layer 103. Moreover, the information recording medium 26 is different from the information recording medium 25 of Embodiment 1 shown in FIG. 1 in that the second dielectric layer 106 is formed on the recording layer 4 with the second interface layer 105 therebetween. In the information recording medium 26, the first dielectric layer 2 is an oxide-fluoride-based material layer like Embodiment 1. In addition, in FIG. 2, the reference numerals which are identical to those used in FIG. 1 denote identical components which are formed from the material and by the method described with reference to FIG. 1. Therefore, as to the components already described in connection with FIG. 1, the detailed description is omitted. It should be noted that although only one interface layer is provided in this embodiment, it is referred to as a "second interface layer" for convenience, since it is located between the second dielectric layer 106 and the recording layer 4.

The information recording medium 26 of this embodiment has a constitution in which the second dielectric layer 106 is formed from ZnS-20 mol % SiO$_2$ used for the prior art information recording medium. Therefore, the second interface layer 105 is provided in order to prevent the material transfer caused between the second dielectric layer 106 and the recording layer 4 due to repeated recording. The second interface layer 105 is formed from nitride such as Si—N, Al—N, Zr—N, Ti—N, Ge—N, or Ta—N, the nitride oxide containing one or more compounds of these, carbide such as SiC, or C (carbon). Alternatively, the second interface layer 105 may be a layer which contains two or more kinds of oxides of the elements selected from the above group GM. Specifically, the second interface layer 105 may be formed from ZrO$_2$—SiO$_2$—Cr$_2$O$_3$-mixture-based material or HfO$_2$—SiO$_2$—Cr$_2$O$_3$-mixture-based material. The thickness of the interface layer is preferably in the range of 1 to 10 nm, and more preferably from 2 to 7 nm. If the thickness of the interface layer is large, the recording and erasing performance is affected because of the change of the optical reflectance and the optical absorptance of the multilayered body which consists of the layers from the first dielectric layer 2 to the reflective layer 8 and is formed on the surface of the substrate 1.

Next, the method for producing the information recording medium 26 of Embodiment 2 is described. The information recording medium 26 is produced by carrying out the process in which the first dielectric layer 2 is formed on the surface of the substrate 1 on which the guide groove is formed (Process a), the process in which the recording layer 4 is formed (Process b), the process in which the second interface layer 105 is formed (Process f), the process in which the second dielectric layer 106 is formed (Process g), the process in which the optical compensation layer 7 is formed (Process d) and the process in which the reflective layer 8 is formed (Process e) in this order, and further carrying out the process in which the adhesive layer 9 is formed on the surface of the reflective layer 8, and the process in which the dummy substrate 10 is bonded. Since Processes a, b, d, and e are as described in relation to Embodiment 1, the description of these processes is omitted here. Hereafter, only the processes not carried out in the production of the information recording medium of Embodiment 1 are described.

Process f is a process which is carried out after forming the recording layer 4, in order to form the second interface layer 105 on the surface of the recording layer 4. In Process f, the sputtering is conducted using a high frequency electric power unit. The sputtering may be a reactive sputtering which is conducted, for example, in a mixed-gas atmosphere of Ar gas and N$_2$ gas, using a sputtering target containing Ge—Cr. According to this reactive sputtering, the interface layer containing Ge—Cr—N is formed on the surface of the recording layer 4.

Next, Process g is carried out in order to form the second dielectric layer 106 on the surface of the second interface layer 105. In Process g, the sputtering is conducted, for example, in an Ar gas atmosphere or a mixed-gas atmosphere of Ar gas and O$_2$ gas, using a high frequency electric power unit and a sputtering target consisting of ZnS-20 mol % SiO$_2$. Thereby, the layer consisting of ZnS-20 mol % SiO$_2$ is formed. After finishing the process in which the dummy substrate 10 is bonded, the initialization process is carried out if necessary as described in relation to Embodiment 1. The information recording medium 26 is thus obtained.

(Embodiment 3)

Figure 3:
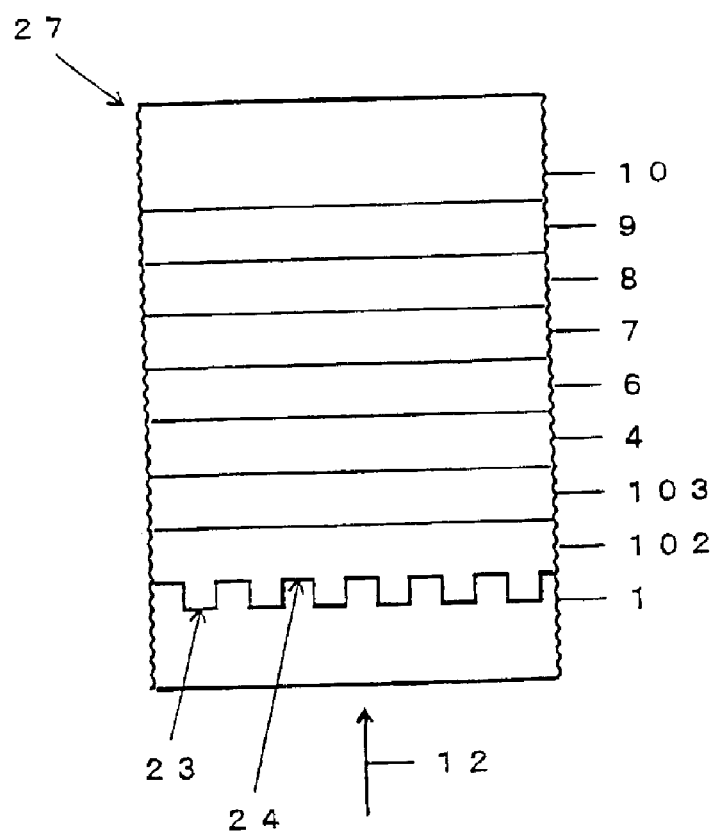
FIG. 3 is a fragmentary sectional view which schematically shows further another example of the optical information recording medium of the invention.

As Embodiment 3 of the present invention, another example of the optical information recording medium on or from which information is recorded or reproduced by using a laser beam, is described. FIG. 3 shows the partial cross section of the optical information recording medium.

The information recording medium 27 shown in FIG. 3 has a constitution in which a first dielectric layer 102, a first interface layer 103, a recording layer 4, a second dielectric layer 6, an optical compensation layer 7, and a reflective layer 8 are formed on one surface of a substrate 1 in this order, and furthermore a dummy substrate 10 is bonded to the reflective layer 8 with an adhesive layer 9. The information recording medium 27 shown in FIG. 3 is different from the prior art information recording medium 31 shown in FIG. 10 in that it does not have the second interface layer 105. Moreover, the information recording medium 27 is different from the information recording medium 25 of Embodiment 1 shown in FIG. 1 in that the first dielectric layer 102 and the first interface layer 103 are formed between the substrate 1 and the recording layer 4 in this order. In the information recording medium 27, the second dielectric layer 6 is an oxide-fluoride-based material layer like Embodiment 1. In addition, in FIG. 3, the reference numerals which are identical to those used in FIG. 1 denote identical components which are formed from the material and by the method described with reference to FIG. 1. Therefore; the detailed description as to the components already described in connection with FIG. 1, is omitted.

The information recording medium 27 of this embodiment has a constitution in which the first dielectric layer 102 is formed from ZnS-20 mol % SiO$_2$ used for the prior art information recording medium. Therefore, the first interface layer 103 is provided in order to prevent the material transfer caused between the first dielectric layer 102 and the recording layer 4 due to repeated recording. The preferable material and thickness of the first interface layer 103 are the same as those of the second interface layer 105 of the information recording medium 26 of Embodiment 2 described with reference to FIG. 2. Therefore, detailed description about the first interface layer 103 is omitted.

Next, the method for producing the information recording medium 27 of Embodiment 3 is described. The information recording medium 27 is produced by carrying out the process in which the first dielectric layer 102 is formed on the surface of the substrate 1 where the guide groove is formed (Process h), the process in which the first interface layer 103 is formed (Process i), the process in which the recording layer 4 is formed (Process b), the process in which the second dielectric layer 6 is formed (Process c), the process in which the optical compensation layer 7 is formed (Process d), and the process in which the reflective layer 8 is formed (Process e) in this order, and further carrying out the process in which the adhesive layer 9 is formed on the surface of the reflective layer 8, and the process in which the dummy substrate 10 is bonded. Since Processes b, c, d and e are as described in relation to Embodiment 1, the description of these processes is omitted here. Hereafter, only the processes not carried out in the production of the information recording medium of Embodiment 1 are described.

Process h is a process in which the first dielectric layer 102 is formed on the surface of the substrate 1. The method is the same as that of Process g which is described in relation to the producing method of Embodiment 2. Process i is a process in which the first interface layer 103 is formed on the surface of the first dielectric layer 102. The method is the same as that of Process f described in relation to the producing method of Embodiment 2. After finishing the process in which the dummy substrate 10 is bonded, the initialization process is carried out if necessary as described in relation to Embodiment 1. The information recording medium 27 is thus obtained.

(Embodiment 4)

Figure 4:
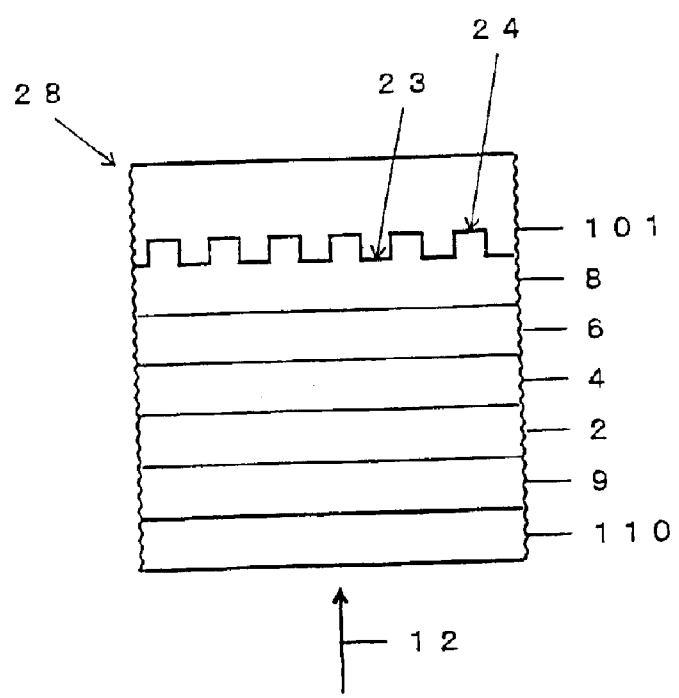
FIG. 4 is a fragmentary sectional view which schematically shows further another example of the optical information recording medium of the invention.

As Embodiment 4 of the present invention, another example of the optical information recording medium on or from which information is recorded or reproduced by using a laser beam is described. FIG. 4 shows the partial cross section of the optical information recording medium.

The information recording medium 28 shown in FIG. 4 has a constitution in which a reflective layer 8, a second dielectric layer 6, a recording layer 4, and a first dielectric layer 2 are formed on one surface of a substrate 101 in this order, and further a dummy substrate 110 is bonded to the first dielectric layer 2 with an adhesive layer 9. This information recording medium 28 is different from the prior art information recording medium 31 shown in FIG. 10 in that it does not have the first interface layer 103 and the second interface layer 105. Moreover, the information recording medium of this constitution is different from the information recording medium 25 which has the constitution shown in FIG. 1 in that it does not have the optical compensation layer 7.

A laser beam 12 is applied to the information recording medium 28 of this constitution from the dummy substrate 110 side, and thereby, information is recorded or reproduced. In order to make the recording density of the information recording medium high, it is necessary to form small record marks in the recording layer by narrowing a laser beam as well as using a laser beam of short wavelength. In order to narrow the beam, it is necessary to make the numerical aperture NA of an objective lens larger. However, a focal position becomes shallow when NA becomes large. Therefore, the substrate to which a laser beam is applied needs to be made thin. In the information recording medium 28 shown in FIG. 4, the thickness of the dummy substrate 110 can be made small, since the substrate 110 to which the laser beam is applied does not need to have a function as a support at the time of forming the recording layer and so on. Therefore, by employing this constitution, it is possible to obtain a large capacity information recording medium 28 on which information can be recorded with a higher density. Specifically, by employing this constitution, it is possible to obtain a 25 GB information recording medium on or from which information is recorded or reproduced by using a laser beam with a wavelength of about 405 nm in a bluish-violet wavelength region.

Also in this information recording medium, the first and the second dielectric layers 2 and 6 are oxide-fluoride based material layers like Embodiment 1. An oxide-fluoride-based material layer is used as the dielectric layer irrespective of the formation order of the reflective layer and so on, and recording capacity. Since the material contained in the oxide-fluoride-based material layer is as described in relation to Embodiment 1, detailed description thereof is omitted.

As mentioned above, this information recording medium 28 is suitable for recording and reproducing by a laser beam of a short wavelength. Therefore, the thickness of each of the first and the second dielectric layers 2 and 6 is determined from a preferable optical path length on the assumption that $\lambda$ is, for example, 405 nm. In order to improve signal quality by increasing the reproduced signal amplitude of the record mark on the information recording medium 28, the optical path length "nd" of each of the first dielectric layer 2 and the second dielectric layer 6 is strictly determined by calculation based on the matrix method so as to satisfy, for example, $20\% \leq Rc$, and $Ra \leq 5\%$. As a result, when the oxide-fluoride-based material layer having the refractive index of from 1.8 to 2.5 is made into the first and the second dielectric layers 2 and 6, it was found that the thickness of the first dielectric layer 2 is preferably in the range of 30 nm to 100 nm, and more preferably from 50 nm to 80 nm. Moreover, It was found that the thickness of the second dielectric layer 6 is preferably in the range of 3 nm to 50 nm, and more preferably from 10 nm to 30 nm.

The substrate 101 is a transparent disc-shaped plate like the substrate 1 of Embodiment 1. The guide groove for guiding a laser beam may be formed in the surface of substrate 101 where the reflective layer and so on are formed. When forming the guide groove, a s described in connection with Embodiment 1, the surface 23 which is closer to the laser beam 12 is referred to as the "groove surface", whereas the surface 24 which is located away is referred to as the "land surface" for convenience. In the substrate 101, the distance in the thickness direction between the groove surface 23 and the land surface 24 (i.e. the depth of groove) is preferably in the range of 10 nm to 30 nm, and more preferably from 15 nm to 25 nm. Moreover, it is desirable that the surface where a layer is not formed is flat. The material for the substrate 1 of Embodiment 1 can be used as the material for the substrate 101.

Preferably, the thickness of the substrate 101 is in the range of about 1.0 to 1.2 mm. The preferable thickness of the substrate 101 is larger than that of the substrate 1 of Embodiment 1. This is because, as mentioned below, the thickness of the dummy substrate 110 is thin, and therefore, the substrate 101 needs to ensure the strength of the information recording medium.

The dummy substrate 110 is a transparent disc-shaped plate like the substrate 101. As mentioned above, by employing the constitution shown in FIG. 4, it is possible to record information with the laser beam of a short wavelength by making the thickness of the dummy substrate 110 small. Therefore, the thickness of the dummy substrate 110 is preferably in the range of 40 μm to 110 μm. More preferably, the thickness of the adhesive layer 9 and the dummy substrate 110 in total is in the range of 50 μm to 120 μm.

Since the dummy substrate 110 is thin, the substrate is preferably formed from a resin like a polycarbonate, an amorphous polyolefin, or PMMA. The polycarbonate is particularly preferable. Moreover, since the dummy substrate 110 is located so that the laser-beam 12 reaches it first, it is preferable that the substrate has an optical characteristic of small birefringence with respect to a light in a short wavelength region.

Preferably, the adhesive layer 9 is formed from a transparent ultraviolet-curing resin. The thickness of the adhesive layer 9 is preferably in the range of 5 to 15 μm. The dummy substrate 110 can be omitted, when the adhesive layer 9 also provides the function of the dummy substrate 110 and is formed so as to have a thickness in the range of 50 μm to 120 μm.

In addition, each component identified with the reference numeral which is identical to that used in Embodiment 1 is as already described in relation to Embodiment 1, and therefore the description thereof is omitted.

In a variation of the information recording medium of this embodiment, for example, only the first dielectric layer is formed from an oxide-fluoride-based material layer, and the second dielectric layer is formed from ZnS-20 mol % $SiO_2$, and the second interface layer is formed between the second dielectric layer and the recording layer. Moreover, in another variation of the information recording medium of this embodiment, only the second dielectric layer is formed from an oxide-fluoride-based material layer, and the first dielectric layer is formed from ZnS-20 mol % $SiO_2$, and the first interface layer is formed between the first dielectric layer and the recording layer.

Next, the method for producing the information recording medium 28 of Embodiment 4 is described. The information recording medium 28 is produced by carrying out the process in which the substrate 101 (for example, having a thickness of 1.1 mm) where the guide groove (the groove surface 23 and the land surface 24) is formed is set in a film-forming device, and the reflective layer 8 is formed on the surface of the substrate 101 on which the guide groove is formed (Process e), the process in which the second dielectric layer 6 is formed (Process c), the process in which the recording layer 4 is formed (Process b), and the process in which the first dielectric layer 2 is formed (Process a) in this order, and further carrying out the process in which the adhesive layer 9 is formed on the surface of the first dielectric layer 2, and the process in which the dummy substrate 110 is bonded.

First, Process e is carried out in order to form the reflective layer 8 on the surface of the substrate 101 where the guide groove is formed. The method for carrying out Process e is as described in relation to Embodiment 1. Next, Process c, Process b, and Process a are carried out in this order. The methods for carrying out Processes c, b, and a are as described in relation to Embodiment 1. As in the production of the information recording medium of Embodiment 1, in the production of this embodiment, the sputtering target used in Process c may be different from that used in Process a. In the producing method of the information recording medium of this embodiment, the order of carrying out each process differs from that in the producing method of the information recording medium of Embodiment 1.

After forming the first dielectric layer 2, the substrate 101 on which the layers from the reflective layer 8 to the first dielectric layer 2 are stacked in order is picked out from the sputtering device. Then, an ultraviolet-curing resin is applied to the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. The process for bonding the dummy substrate 110 can be omitted by forming the adhesive layer 9 into thickness of 50 μm to 120 μm and applying an ultraviolet ray thereto.

After finishing the bonding process, the initialization process is conducted if necessary. The method of the initialization process is as described in relation to Embodiment 1.

(Embodiment 5)

Figure 5:
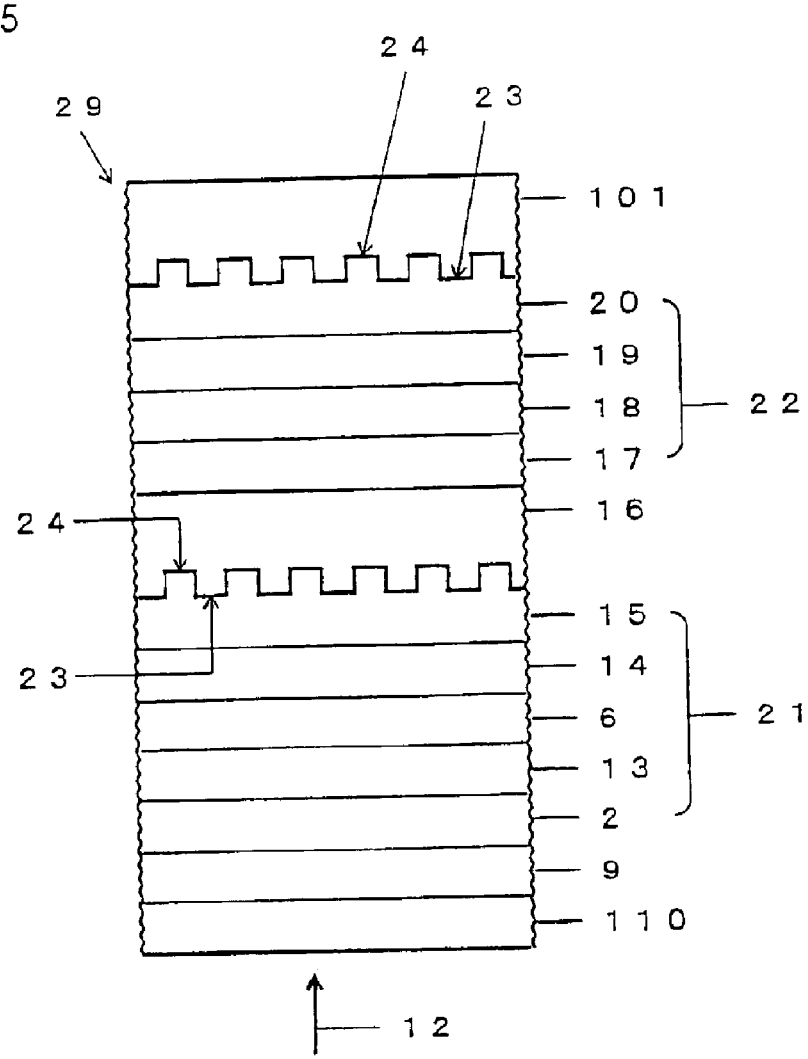
FIG. 5 is a fragmentary sectional view which schematically shows further another example of the optical information recording medium of the invention.

As Embodiment 5, another example of the optical information recording medium on or from which information is recorded or reproduced by using a laser beam, is described. FIG. 5 shows the partial cross section of the optical information recording medium.

The information recording medium 29 shown in FIG. 5 has a constitution in which a second information layer 22, an intermediate layer 16, and a first information layer 21 are formed on one surface of a substrate 101 in this order, and furthermore a dummy substrate 110 is bonded to the first information layer 21 with an adhesive layer 9. In detail, the second information layer 22 is formed by stacking a second reflective layer 20, a fifth dielectric layer 19, a second recording layer 18, and a fourth dielectric layer 17 on one surface of the substrate 101 in this order. The intermediate layer 16 is formed on the surface of the fourth dielectric layer 17. The first information layer 21 is formed by stacking a third dielectric layer 15, a first reflective layer 14, a second dielectric layer 6, a first recording layer 13, and a first dielectric layer 2 on the surface of the intermediate layer 16 in this order. Also in this embodiment, a laser beam 12 is applied from the dummy substrate 110 side. Moreover, in the information recording medium of this embodiment, information can be recorded in each of the two recording layers. Therefore, by employing, this constitution, the information recording medium which has about double the capacity of Embodiment 4, can be obtained. Specifically, by employing this constitution, it is possible to obtain a 50 GB information recording medium on which information is recorded by a laser beam with a wavelength of about 405 nm in a bluish-violet wavelength region.

The recording in and reproducing from the first information layer 21 is conducted by the laser beam 12 which has passed through the dummy substrate 110. The recording in and reproducing from the second information layer 22 is conducted by the laser beam 12 which has passed through the dummy substrate 110, the first information layer 21, and the intermediate layer 16.

In the information recording medium 29 of the embodiment shown in FIG. 5, the fifth dielectric layer 19, the fourth dielectric layer 17, the second dielectric layer 6, and the first dielectric layer 2 are all oxide-fluoride-based material layers. By using the oxide-fluoride-based material layer, it is not necessary to form an interface layer between the first recording layer 13 and the first dielectric layers 2, between the first recording layer 13 and the second dielectric layer 6, between the second recording layer 18 and the fourth dielectric layer 17, and between the second recording layer 18 and the fifth dielectric layer 19. Since the material for the oxide-fluoride-based material layer is as described in relation to Embodiment 1, the detailed description thereof is omitted.

Each of the fifth dielectric layer 19 and the second dielectric layer 6 serves as a thermal insulating layer between the reflective layer and the recording layer. Therefore, each of the fifth and the second dielectric layers 19 and 6 is preferably formed by selecting a material so that the dielectric layers have low thermal conductivity and quench the second and the first recording layers 18 and 13 more effectively. Specifically, it is preferable that those layers contain a material expressed with, for example, $(ZrSiO_4)_{50}(Cr_2O_3)_{20}(LaF_3)_{30}$ (mol %). Moreover, the film thickness of each of the fifth and the second dielectric layers 19 and 6 is preferably in the range of 3 nm to 50 nm, and more preferably from 10 nm to 30 nm.

The laser beam 12 passes through the fourth dielectric layer 17 and the first dielectric layer 2 before reaching the second recording layers 18 and the first recording layers 13 in the second information layer 22 and the first information layer 21, respectively. Therefore, it is desirable that each of the fourth and the first dielectric layers 17 and 2 consists of a transparent material with low thermal conductivity. Specifically, those layers preferably contain a material expressed with, for example, $(ZrO_2)_{20}(SiO_2)_{40}(Cr_2O_3)_{10}(LaF_3)_{30}$ (mol %). Preferably, the film thickness of each of the fourth and the first dielectric layers 17 and 2 is in the range of 30 nm to 80 nm.

Thus, also in the information recording medium of the single-sided dual-layer structure shown in FIG. 5, the oxide-fluoride-based material layer makes it possible to form the dielectric layer located on both sides of the recording layer in direct contact with the recording layer without the interface layer. Therefore, according to this invention, the number of the layers which compose the whole medium can be reduced, also as to the information recording medium of the single-sided dual-layer structure. Moreover, by forming the dielectric layer from a material which contains a plurality of oxides and fluorides, or by selecting the kind(s) of oxide(s) and fluoride(s) which are to be contained in the material for the dielectric layer appropriately, the refractive index and the recording sensitivity of the medium are adjusted so as to be optimized depending on the kind of information recording medium.

The third dielectric layer 15 is located between the intermediate layer 16 and the first reflective layer 14. The third dielectric layer 15 is preferably transparent and has a high refractive index so that it may serve to enhance the transmissivity of the first information layer 21. Moreover, the third dielectric layer 15 preferably consists of a material with higher thermal conductivity so that it serves to diffuse the heat of the first recording layer 13 quickly, like the reflective layer. The material which satisfies these conditions is $TiO_2$-containing material (that is, $TiO_2$-based material). Specifically, $TiO_2$-based material is a material which contains 50 mol % or more $TiO_2$. $TiO_2$-based material preferably contains 80 mol % or more $TiO_2$, and more preferably 90 mol % or more $TiO_2$. By using $TiO_2$-based material, the layer having a large refractive index of about 2.7 is formed. The film thickness of the third dielectric layer 15 is preferably in the range of 10 nm to 30 nm.

The substrate 101 is the same as the substrate 101 of Embodiment 4. Therefore, the detailed description about the substrate 101 is omitted here.

The second reflective layer 20 is the same as the reflective layer 8 of Embodiment 1. Further, the second recording layer 18 is the same as the recording layer 4 of Embodiment 1. Therefore, the detailed description about the second reflective layer 20 and the second recording layer 18 is omitted here.

The intermediate layer 16 is provided in order to make the focal position of the laser beam in the first information layer 21 significantly differ from the focal position in the second information layer 22. In the intermediate layer 16, the guide groove is optionally formed on the first information layer 21 side. The intermediate layer 16 can be formed from an ultraviolet-curing resin. It is desirable that the intermediate layer 16 is transparent with respect to the light of the wavelength λ used for recording and reproducing information so that the laser beam 12 can reach the second information layer 22 efficiently. The thickness of the intermediate layer 16 needs to be equal to or more than the focal depth ΔZ determined by the numerical aperture NA of an objective lens and the laser beam wavelength λ. ΔZ can be approximated to be $\Delta Z=\lambda/\{2(NA)^2\}$. When λ is 405 nm, and NA is 0.85, ΔZ becomes ΔZ=0.28 μm. Further, since the range within ±0.3 μm of this value is included in the range of focal depth, the intermediate layer 16 needs to have a thickness of 0.8 μm or more. Furthermore, the total thickness of the intermediate layer 16 and the dummy substrate 110 is preferably set within a tolerance of substrate thickness acceptable to the objective lens to be used, so that the distance between the first recording layer 13 of the first information layer 21 and second recording layer 18 of the second information layer 22 may be within the range where the objective lens can concentrate light. Therefore, the thickness of the intermediate layer is preferably in the range of 10 μm to 40 μm.

If necessary, the intermediate layer 16 may be constituted by stacking a plurality of resin layers. Specifically, it may have a two-layer structure consisting of a layer which protects the fourth dielectric layer 17, and a layer which has a guide groove.

The first reflective layer 14 serves to diffuse the heat of the first recording layer 13 quickly. When information is recorded in or reproduced from the second information layer 22, the laser beam 12 which has passed through the first information layer 21 is used. For this reason, the first information layer 21 needs to have a high transmissivity as a whole, and preferably has a transmissivity of 45% or more. Therefore, the first reflective layer 14 is limited in the material and the thickness, compared with the second reflective layer 20. In order to decrease optical absorption by the first reflective layer 14, it is desirable that the first reflective layer 14 has a small thickness, a low extinction coefficient, and high thermal conductivity. Specifically, it is preferable that the first reflective layer 14 is made of an alloy containing Ag, and is formed into a film whose thickness is in the range of 5 nm to 15 nm.

In order to ensure the high transmissivity of the first information layer 21, the first recording layer 13 is also limited in the material and film thickness, compared with the second recording layer 18. The first recording layer 13 is preferably formed so that the average of the transmittance of the crystal phase and the transmittance of the amorphous phase becomes 45% or more. Therefore, the film thickness of the first recording layer 13 is preferably 7 nm or less. The material which constitutes the first recording layer 13 is selected so that even if the layer is such a thin film, it is ensured that good record marks are formed by melting and quenching, and thereby the signal with high quality is reproduced, and that record marks are erased by temperature rising and gradual cooling. Specifically, it is preferable to form the first recording layer 13 from a reversible phase change material, for example, Ge—Se—Te such as GeTe—$Sb_2Te_3$-based material or Ge—Sn—Sb—Te obtained by substituting Sn for part of Ge of GeTe—$Sb_2Te_3$-based material. Ge—Bi—Te such as GeTe—$Bi_2Te_3$-based material, or Ge—Sn—Bi—Te obtained by substituting Sn for part of Ge of Ge—Bi—Te may be used. Specifically, for example, $Ge_{22}Sb_2Te_{25}$ in which $GeTe:Sb_2Te_3=22:1$, or $Ge_{19}Sn_3Sb_2Te_{25}$ is preferably used.

The adhesive layer 9 is preferably formed from a transparent ultraviolet-curing resin like the adhesive layer 9 of Embodiment 4. The thickness of the adhesive layer is preferably in the range of 5 to 15 $\mu$m.

The dummy substrate 110 is the same as the dummy substrate 110 of Embodiment 4. Therefore, the detailed description about the dummy substrate is omitted here. Also in this embodiment, the dummy substrate 110 can also be omitted, when the adhesive layer 9 also serves as the dummy substrate 110 and can be formed so as to have a thickness of 50 $\mu$m to 120 $\mu$m.

In the information recording medium of this embodiment, only one dielectric layer of the first, second, fourth and fifth dielectric layers 2, 6, 17, and 19 may be the oxide-fluoride-based material layer. Alternatively, two or three dielectric layers may be the oxide-fluoride-based material layers. When only one dielectric layer is the oxide-fluoride-based material layer, at least one interface layer becomes unnecessary. When two dielectric layers are the oxide-fluoride-based material layers, at least two interface layers become unnecessary. Therefore, in the information recording medium of this embodiment, it is possible to eliminate up to four interface layers. The interface layer may be provided between the recording layer and the dielectric layer which is not the oxide-fluoride-based material layer, if necessary. In that case, the interface layer may be an oxide-fluoride-based material layer in the form of a very thin film of 5 nm thickness.

The information recording medium of a constitution having two information layers each of which has a recording layer is described above. The information recording medium which has a plurality of recording layers is not limited to this constitution. The medium can also have a constitution including three or more information layers. Further, in a variation of the illustrated embodiment, for example, one of the two information layers has one recording layer in which a reversible phase change is generated, and the other has one recording layer in which an irreversible phase change is generated.

Moreover, in a variation of the information recording medium which has three information layers, one is made into the read-only information layer, another has a recording layer in which a reversible phase change is generated, and the other has a recording layer in which an irreversible phase change is generated. Thus, there are many variations of the information recording medium which has two or more information layers. Also in any form, by forming a dielectric layer from an oxide-fluoride based material layer, the need of providing an interface layer between the recording layer and the dielectric layer can be eliminated.

Further, in the information recording medium having two recording layers, an oxide-fluoride-based material layer may exists as an interface layer which is located between the recording layer and the dielectric layer. Such interface layer is formed into a very thin film having about 5 nm thickness.

Next, the method for producing the information recording medium 29 of Embodiment 5 is described. The information recording medium 29 is produced by carrying out the process in which the second reflective layer 20 is formed on the substrate 101 (Process j), the process in which the fifth dielectric layer 19 is formed (Process k), the process in which the second recording layer 18 is formed (Process l), and the process in which the fourth dielectric layer 17 is formed (Process m) in this order, and then carrying out the process in which the intermediate layer 16 is formed on the surface of the fourth dielectric layer 17, and further carrying out the process in which the third dielectric layer 15 is formed on the surface of the intermediate layer 16 (Process n), the process in which the first reflective layer 14 is formed (Process o), the process in which the second dielectric layer 6 is formed (Process p), the process in which the first recording layer 13 is formed (Process q), and the process in which the first dielectric layer 2 is formed (Process r) in this order, and furthermore carrying out the process in which the adhesive layer 9 is formed on the surface of the first dielectric layer 2, and the process in which the dummy substrate 110 is bonded.

Processes j to m correspond to the processes for forming the second information layer 22. Process j is a process in which the second reflective layer 20 is formed on the surface of the substrate 101 where the guide groove is formed. Process j is carried out in the same manner as Process e in the production of Embodiment 1. Next, Process k is carried out in order to form the fifth dielectric layer 19 on the surface of the second reflective layer 20. Process k is carried out in the same manner as Process c in the production of Embodiment 1. Next, Process l is carried out to form the second recording layer 18 on the surface of the fifth dielectric layer 19. Process l is carried out in the same manner as Process b in the production of Embodiment 1. Finally, Process m is carried out in order to form the fourth dielectric layer 17 on the surface of the second recording layer 18. Process m is carried out in the same manner as Process a in the production of Embodiment 1.

The substrate 101 on which the second information layer 22 is formed according to Processes j to m is picked out from the sputtering device, and then the intermediate layer 16 is formed. The intermediate layer 16 is formed according to the following procedures. Firstly, an ultraviolet-curing resin is applied to the surface of the fourth dielectric layer 17 by, for example, a spin coat method. Next, a polycarbonate substrate which has on its surface concavities and convexities which are complementary to the guide groove to be formed on the intermediate layer is stuck to the ultraviolet-curing resin with the concavo-convex side in contact with the resin. After applying an ultraviolet ray and curing the resin, the polycarbonate substrate with concavities and convexities is peeled. Thereby, the guide groove which is complementary to the concavities and convexities is formed in the ultraviolet-curing resin, and the intermediate layer 16 which has the illustrated guide groove is formed. Alternatively, the intermediate layer 16 may be formed by forming a layer from an ultraviolet-curing resin which protects the fourth dielectric layer 17, and then forming a layer having a guide groove thereon. In this case, the intermediate layer to be obtained has a two-layer structure. Alternatively, the intermediate layer is formed by stacking three or more layers.

The substrate 101 on which the layers up to the intermediate layer 16 are formed is again placed in a sputtering device, and then the first information layer 21 is formed on the surface of the intermediate layer 16. The processes for forming the first information layer 21 correspond to Processes n to r.

Process n is a process in which the third dielectric layer 15 is formed on the surface of the intermediate layer 16 on which the guide groove is formed. In process n, the sputtering is conducted in an Ar gas atmosphere or in a mixed-gas atmosphere of Ar gas and $O_2$ gas, using a high frequency electric power unit and a sputtering target consisting of a $TiO_2$-based material.

Next, Process o is carried out in order to form the first reflective layer 14 on the surface of the third dielectric layer 15. In Process o, the sputtering is conducted in an Ar gas atmosphere, using a direct current power source and a sputtering target of an alloy containing Ag.

Then, Process p is carried out in order to form the second dielectric layer 6 on the surface of 14 of the first reflective layer 14. Process p is carried out in the same manner as Process k.

Next, Process q is carried out in order to form the first recording layer 13 on the surface of the second dielectric layer 6. In Process q, the sputtering is conducted in an Ar gas atmosphere or in a mixed-gas atmosphere of Ar gas and $N_2$ gas, using a direct current power source and a sputtering target consisting of a material selected from Ge—Se—Te such as GeTe—$Sb_2Te_3$-based material, Ge—Sn—Sb—Te which is, for example, obtained by substituting Sn for part of Ge of GeTe—$Sb_2Te_3$-based material, Ge—Bi—Te, Ge—Sn—Bi—Te, Ge—Sb—Bi—Te, and Ge—Sn—Sb—Bi—Te.

Next, Process r is carried out in order to form the first dielectric layer 2 on the surface of the first recording layer 13. Process r is carried out in the same manner as Process m. Thus, the first information layer 21 is formed by carrying out Processes n to r in this order.

The substrate 101 on which the first information layer 21 are formed is picked out from the sputtering device. Then, an ultraviolet-curing resin is applied to the surface of the first dielectric layer 2, for example, by a spin coat method. The dummy substrate 110 is stuck to the applied ultraviolet-curing resin. An ultraviolet ray is applied from the dummy substrate 110 side to cure the resin, whereby the bonding process is finished. Also in the producing method of the information recording medium of Embodiment 5, the process of bonding the dummy substrate 110 can also be omitted in the same manner as in the producing method of the information recording medium of Embodiment 4.

After finishing the bonding process, the initialization processes of the second information layer 22 and the first information layer 21 is carried out if necessary. The Initialization process of the second information layer 22 may be carried out before or after forming the intermediate layer, and the initialization process of the first information layer 21 may be carried out before or after the bonding process of the dummy substrate 110. The method for carrying out the initialization process is as described in relation to Embodiment 1.

(Embodiment 6)

Figure 6:
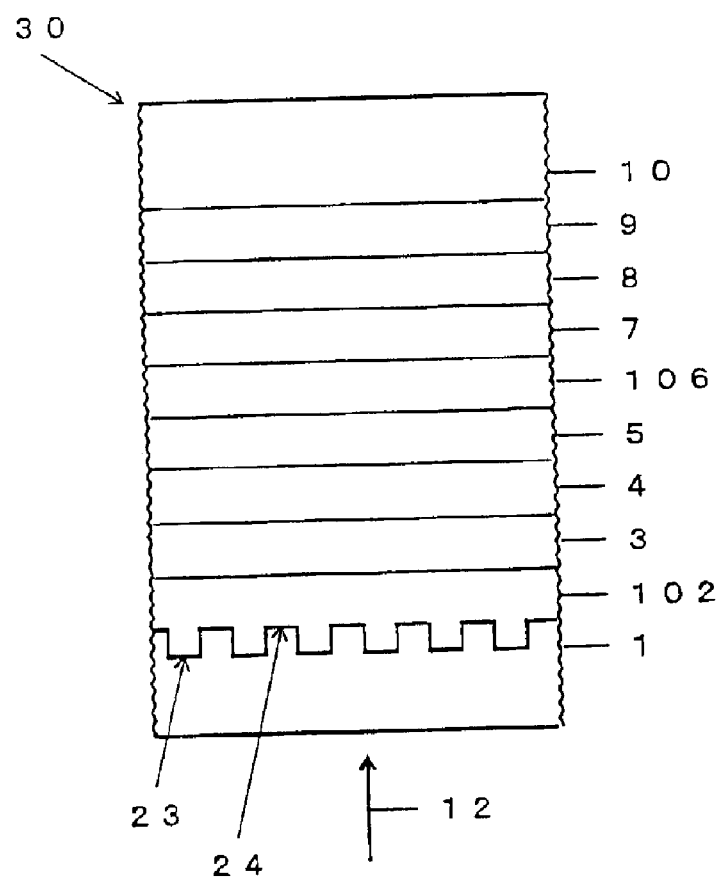
FIG. 6 is a fragmentary sectional view which schematically shows further another example of the optical information recording medium of the invention.

As Embodiment 6, another example of the information recording medium on or from which information is recorded or reproduced by using a laser beam, is described. FIG. 6 shows the partial cross section of the optical information recording medium.

The information recording medium 30 shown in FIG. 6 has a constitution in which a first dielectric layer 102, a first interface layer 3, a recording layer 4, a second interface layer 5, a second dielectric layer 106, an optical compensation layer 7, and a reflective layer 8 are formed on one surface of a substrate 1 in this order, and furthermore a dummy substrate 10 is bonded to the reflective layer 8 with an adhesive layer 9. In the information recording medium 30 shown in FIG. 6, the first and the second interface layers 3 and 5 are oxide-fluoride-based material layers. In addition, in FIG. 6, the reference numerals which are identical to those used in FIG. 1 denote identical components which are formed from the material and by the method described with reference to FIG. 1. Therefore, the detailed description is omitted as to the components already described with reference to FIG. 1.

The information recording medium of this embodiment has a constitution in which the first and the second dielectric layers 102 and 106 are formed from ZnS-20 mol % $SiO_2$ used for the prior art information recording medium. In such a constitution, an oxide-fluoride-based material layer can be used as the first and the second interface layers 3 and 5. The preferable materials for the first and the second interface layers 3 and 5 are the same as those for the first and the second dielectric layers 2 and 6 of Embodiment 1. Therefore, the detailed description about them is omitted. The thickness of each of the first and the second interface layers 3 and 5 is preferably in the range of 1 to 10 nm, and more preferably in the range of about 2 to 7 nm so that recording and erasing characteristic may not be affected. The interface layer which is the oxide-fluoride-based material layer has the advantages that cost for the material is inexpensive, the extinction coefficient is low (i.e. transparency is high), and its melting point is high and then it is thermally stable, compared with the prior art interface layer consisting of the nitride containing Ge.

Next, the method for producing the information recording medium 30 of Embodiment 6 is described. The information recording medium 30 is produced by carrying out the process in which the first dielectric layer 102 is formed on the surface of the substrate 1 where the guide groove is formed (Process h), the process in which the first interface layer 3 is formed (Process s), the process in which the recording layer 4 is formed (Process b), the process in which the second interface layer 5 is formed (Process t), the process in which the second dielectric layer 106 is formed (Process g), the process in which the optical compensation layer 7 is formed (Process d), and the process in which the reflective layer 8 is formed (Process e) in this order, and further by carrying out the process in which the adhesive layer 9 is formed on the surface of the reflective layer 8, and the process in which the dummy substrate 10 is bonded. Processes b, d, and e are as described in relation to Embodiment 1, Process g is as described in relation to Embodiment 2, and Process h is as described in relation to Embodiment 3. Therefore, the description of these processes is omitted here.

Process s is a process in which the first interface layer 3 is formed on the surface of the first dielectric layer 102. Process s is carried out in the same manner as Process a in the production of Embodiment 1. Process t is a process in which the second interface layer 5 is formed on the surface of the recording layer 4. Process t is carried out in the same manner as Process c in the production of Embodiment 1.

In the above, the optical information recording media on or from which information is recorded or reproduced by a laser beam are described as embodiments of this invention with reference to FIGS. 1 to 6. The optical information recording medium of this invention is not limited to these embodiments. As long as an oxid-fluoride-based material layer is provided, preferably in contact with a recording layer, as one of constitutive layers, the optical information recording medium of this invention may be embodied in other forms. In other words, the present invention is applicable to any embodiment irrespective of the order of forming each layer on the substrate, number of the recording layers, recording conditions and recording capacity. Moreover, the optical information recording medium of this invention is suitable for recording with a laser beam of various wavelengths. Therefore, the optical information recording medium of this invention may be, for example, DVD-RAM or DVD-R on or from which information is recorded or reproduced by a laser beam with a wavelength between 630 and 680 nm, or a large capacity optical disk on or from which information is recorded or reproduced by a laser beam with a wavelength between 400 and 450 nm.

(Embodiment 7)

Figure 8:
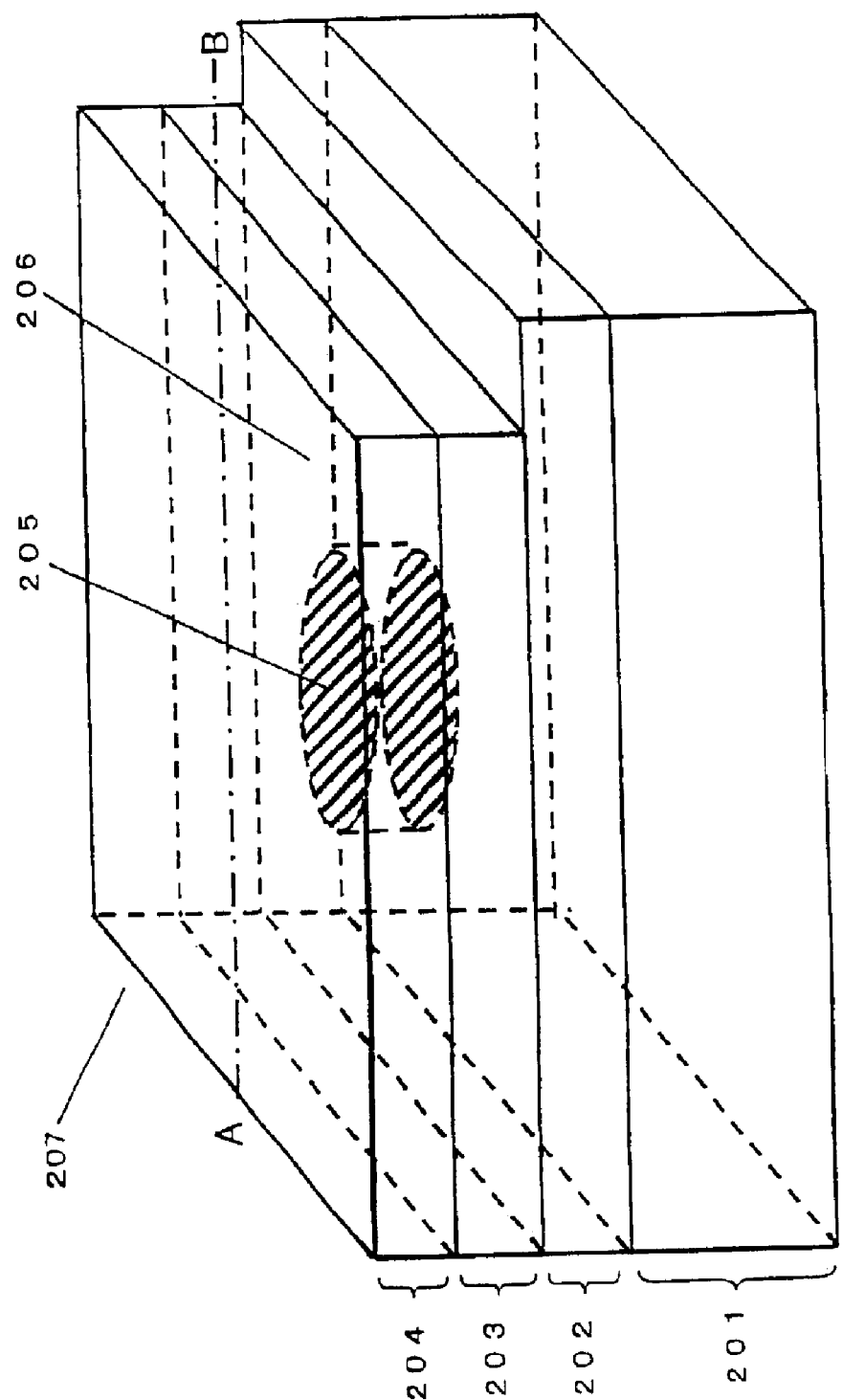
FIG. 8 is a schematic view which shows an example of the information recording medium of the invention on which information is recorded by application of an electric energy.

As Embodiment 7, an example of the information recording medium on or from which information is recorded or reproduced by applying an electric energy, is described. FIG. 8 shows the partial cross section of the information recording medium.

FIG. 8 shows a memory 207 in which a lower electrode 202, a recording part 203, and an upper electrode 204 are formed on the surface of a substrate 201 in this order. The recording part 203 of the memory 207 has a constitution including a column-shaped recording layer 205 and a dielectric layer 206 which encloses the recording layer 205. It differs from the optical information recording media described with reference to FIGS. 1 to 6. In the memory 207 of this embodiment, the recording layer 205 and the dielectric layer 206 are formed on the same surface, and they are not in the laminated relationship. However, since the recording layer 205 and the dielectric layer 206 both constitute part of the multilayered body including the substrate 201, the lower and the upper electrodes 202 and 204 in the memory 207, they can be each referred to as a "layer." Therefore, the information recording medium of this invention also includes an embodiment which has a recording layer and a dielectric layer on the same surface.

As the substrate 201, a semiconductor substrate, such as Si substrate, a polycarbonate substrate, or an insulating substrate such as a $SiO_2$ substrate and an $Al_2O_3$ substrate can be used. The lower electrode 202 and the upper electrode 204 are formed from a suitable electrically conductive material. The lower electrode 202 and the upper electrode 204 are formed by, for example, sputtering a metal such as Au, Ag, Pt, Al, Ti, W, Cr, or a mixture thereof.

The recording layer 205 which constitutes the recording part 203 consists of a material in which the phase change is generated by applying an electric energy. Therefore, the recording layer 205 can be referred to as a "phase-change part." The recording layer 205 is formed from the material in which the phase change between a crystal phase and an amorphous phase is caused by the Joule heat generated by applying an electric energy. As the material for the recording layer 205, for example, Ge—Sb—Te, Ge—Sn—Sb—Te, Ge—Bi—Te, Ge—Sn—Bi—Te, Ge—Sb—Bi—Te and Ge—Sn—Sb—Bi—Te-based material is used, and more specifically, a GeTe—$Sb_2Te_3$-based material or a GeTe—$Bi_2Te_3$-based material is used.

The dielectric layer 206 which constitutes the recording part 203 serves to prevent the current which flows the recording layer 205 by applying a voltage between the upper electrode 204 and the lower electrode 202, from escaping to the periphery part, and to insulate the recording layer 205 electrically and thermally. Therefore, the dielectric layer 206 can be also referred to as a "thermal insulating part." The dielectric layer 206 is an oxide-fluoride-based material layer. Specifically, the layer is one which contains the material expressed with the above-mentioned formula (1), (2), (3), (4) or (5). The oxide-fluoride-based material layer is preferably used because it has a high melting point, atoms in the material layer are difficult to diffuse even when the material is heated, and it has low thermal conductivity.

This memory 207 is further explained together with the operation method in the below-mentioned Examples.

EXAMPLES

To further illustrate the present invention, and not by way of limitation, the following examples are given.

(Test 1)

First, the relationship between the nominal composition of a sputtering target of an oxide-fluoride-based material used for producing the information recording medium of this invention (in other words, the composition which a target manufacturer indicates in public when they provide it) and its analyzed composition, was examined.

In this test, a sputtering target of which nominal composition was indicated with $(ZrSiO_4)_{40}(Cr_2O_3)_{30}(LaF_3)_{30}$ (mol %) corresponding to the formula (50) was powdered and then subjected to a composition analysis by a X-ray-microanalyser method. As a result, the analyzed composition of the sputtering target was obtained not as the formula (50) in which the ratio of each compound was indicated, but as the formula (30) in which the ratio of each element was indicated. The results of the analysis are shown in Table 1. Further, the reduced composition (atomic %) which is an elementary composition calculated from the nominal composition is also shown in Table 1.

TABLE 1

| Nominal Composition | Analyzed Composition |
|---|---|
| $(ZrSiO_4)_a(Cr_2O_3)_b(LaF_3)100$-a-b(mol %) (= Reduced Composition (at. %)) | $Zr_rCr_sSi_tO_uLa_vF_w$ (at. %) |
| $(ZrSiO_4)_{40}(Cr_2O_3)_{30}(LaF_3)_{30}$ (= $Zr_{7.8}Cr_{11.8}Si_{7.8}O_{49.1}La_{5.9}F_{17.6}$) | $Zr_{7.5}Cr_{12}Si_{7.5}O_{49}La_6F_{18}$ |

As shown in Table 1, the analyzed composition was substantially equal to the reduced composition (atomic %) of the nominal composition (mol %). From this result, it was confirmed that the actual composition (i.e. the analyzed composition) of the sputtering target with the composition indicated by the formula (50) was substantially the same as the elementary composition (i.e. the reduced composition) obtained by calculation, and therefore the nominal composition was correct.

(Test 2)

The relationship-between the nominal composition of a sputtering target of an oxide-fluoride-based material used in the production of the information recording medium of this invention and the analyzed composition of an oxide-fluoride-based material layer formed by using this target was examined. Specifically, a sputtering target whose nominal composition was indicated as $(ZrSiO_4)_{30}(Cr_2O_3)_{50}(LaF_3)_{20}$ (mol %) corresponding to the above formula (50) was used. The sputtering target (of 100 mm diameter and 6 mm thickness) was set in a conventional film-forming device (sputtering device). The sputtering was carried out in an atmosphere of Ar gas under conditions of a power of 500 W and a pressure of 0.13 Pa using a high frequency electric power unit. As a result of this sputtering, an oxide-fluoridebased material layer was formed into 500 nm thick on a Si substrate. The composition analysis of this oxide-fluoride-based material layer was also carried out by the X-ray-microanalyser method. The analyzed composition of the oxide-fluoride-based material layer was also obtained not as the formula (5) in which the ratio of each compound was indicated, but as the formula (3) in which the ratio of each element was indicated. The results of analysis are shown in Table 2. Further, the reduced composition of the target which is calculated from the nominal composition is shown in Table 2.

TABLE 2

| Nominal Composition of Target | Analyzed Composition of |
|---|---|
| $(ZrSiO_4)_a(Cr_2O_3)_b(LaF_3)_{100-a-b}$ (mol %) <br> (= Reduced Composition (at. %)) | Oxide-Fluoride-based Material Layer <br> $Zr_R Cr_S Si_T O_U La_V F_W$ (at. %) |
| $(ZrSiO_4)_{30}(Cr_2O_3)_{50}(LaF_3)_{20}$ <br> (= $Zr_{5.9} Cr_{19.6} Si_{5.9} O_{52.9} La_{3.9} F_{11.8}$) | $Zr_{6.2} Cr_{20} Si_6 O_{52.9} La_{3.5} F_{11.4}$ |

As shown in Table 2, the analyzed composition of the layer was substantially the same as the reduced composition of the target. From this result, it was confirmed that the actual composition (i.e. the analyzed composition) of the oxide-fluoride-based material layer was substantially the same as the elementary composition (i.e. the reduced composition) of the sputtering target obtained by calculation. Therefore, it was confirmed that by using a sputtering target with the composition indicated by the formula (50), a layer which had the same composition was formed.

It is considered that the same result as those of tests 1 and 2 will be obtained as to other sputtering targets which are provided with the indications of the mixing ratios of the oxide(s) of the element(s) selected from the group GM and the fluoride(s) of the element(s) selected from the group GL. Therefore, in the following examples, the composition of a sputtering target is expressed with the nominal composition (mol %). Further, it is considered that it is permissible that the nominal composition of a sputtering target and the composition (mol %) of an oxide-fluoride-based material layer formed by a sputtering method using the sputtering target are regarded as the same. Therefore, in the following examples, by the indicated composition of a sputtering target, the compositions of a dielectric layer is indicated. Further, in the following examples, the compositions of a puttering target and an oxide-fluoride-based material layer are indicated only by the ratio (mol %) of each compound. One skilled in the art will easily convert such composition (mol %) to the elementary composition (atomic %) of a sputtering target and an oxide-fluoride-based material layer.

Example 1

In Example 1, as a preliminary test leading to this invention, fourteen samples, which each had a constitution similar to the information recording medium 25 described in Embodiment 1 with reference to FIG. 1, were produced while varying a material for a first and a second dielectric layers 2 and 6. In each sample, the first dielectric layer 2 and the second dielectric layer 6 were made of a material having the same composition. Hereafter, the producing method of the information recording medium 25 is explained. For ease in understanding, each of the elements is identified by the same reference number as that which identifies each element shown in FIG. 1. Similarly, with respect to information recording mediums of the following examples, each element is identified by the same reference number as that which identifies each of the elements of the corresponding information recording medium.

Firstly, a disc-shaped polycarbonate substrate having a diameter of 120 mm and a thickness of 0.6 mm was prepared as a substrate 1. A guide groove was previously provided on one side of the polycarbonate substrate with a depth of 56 nm and a track pitch (i.e. a distance between centers of a groove surface 23 and a land surface 24 in a plane parallel to the principal surface of the substrate) of 0.615 µm.

On this substrate 1, the first dielectric layer 2 of 150 nm thickness, a recording layer 4 of 9 nm thickness, the second dielectric layer 6 of 50 nm thickness, an optical compensation layer 7 of 40 nm thickness, and a reflective layer 8 of 80 nm thickness were formed in this order by a sputtering method as follows.

As a material for the first dielectric layer 2 and the second dielectric layer 6, $TiO_2$ (Sample No. 1-1), $ZrO_2$ (Sample No. 1-2), $HfO_2$ (Sample No. 1-3), $V_2O_5$ (Sample No. 1-4), $Nb_2O_5$ (Sample No. 1-5), $Ta_2O_5$ (Sample No. 1-6), $Cr_2O_3$ (Sample No. 1-7), $MoO_3$ (Sample No. 1-8), $WO_3$ (Sample No. 1-9), $SiO_2$ (Sample No. 1-10), $ZnO$ (Sample No. 1-11), $ZnS$ (Sample No. 1-12), $LaF_3$ (Sample No. 1-13), and $TeO_2$ (Sample No. 1-14) were used, respectively.

In processes for forming the first dielectric layer 2 and the second dielectric layer 6, a sputtering target (a diameter of 100 mm, a thickness of 6 mm) made of the above material was attached to a film-forming device, and then a high frequency sputtering was carried out under a pressure of 0.13 Pa. The power and the atmosphere gas employed in each sample were as shown in Table 3.

In a process for forming the recording layer 4, a sputtering target (a diameter of 100 mm, a thickness of 6 mm) made of a Ge—Sn—Sb—Te-based material obtained by substituting Sn for a part of Ge in a GeTe—$Sb_2Te_3$ pseudo-binary system composition was attached to the film-forming device, and then a DC (direct current) sputtering was carried out. The power was 100 W. During the sputtering, a mixed gas of Ar gas (97%) and $N_2$ gas (3%) was introduced in the device. A pressure during the sputtering was maintained at 0.13 Pa. The composition of the recording layer 4 was $Ge_{27}Sn_8Sb_{12}Te_{53}$ (atomic %).

In a process for forming the optical compensation layer 7, a sputtering target (a diameter of 100 mm, a thickness of 6 mm) made of a material having a composition of $Ge_{80}Cr_{20}$ (atomic %) was attached to the film-forming device, and then a DC sputtering was carried out. The power was 300 W. During the sputtering, Ar gas was introduced. The pressure during the sputtering was maintained at about 0.4 Pa.

In a process for forming the reflective layer 8, a sputtering target (a diameter of 100 mm, a thickness of 6 mm) made of an Ag—Pd—Cu alloy was attached to the film-forming device and then a DC sputtering was carried out. The power was 200 W. During the sputtering Ar gas was introduced. The pressure during the sputtering was maintained at about 0.4 Pa.

After forming the reflective layer 8, an ultraviolet-curing resin was applied to the reflective layer 8. As a dummy substrate 10, a disc-shaped polycarbonate substrate of a diameter of 120 mm and a thickness of 0.6 mm was stuck on the applied ultraviolet-curing resin. Then, an ultraviolet ray was applied from the dummy substrate 10 side to cure the resin. Thereby, an adhesive layer 9 consisting of the cured resin with a thickness of 30 µm was formed, while the dummy substrate 10 was laminated to the reflective layer 8 with the adhesive layer 9.

After laminating the dummy substrate 10, an initialization process was carried out using a semiconductor laser with a wavelength of 810 nm. In the initialization process, the recording layer 4 in a substantially whole annular area ranging from 22 to 60 mm in a radial direction of the information recording medium 25 was crystallized. When the initialization process was completed, the production of the information recording medium 25 was finished.

Figure 10:
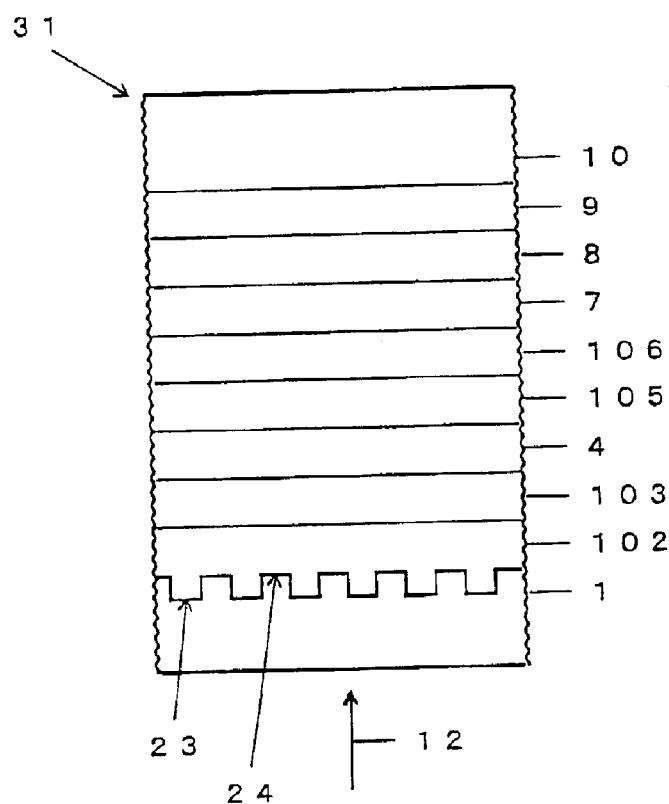
FIG. 10 is a fragmentary sectional view which schematically shows an example of the prior art information recording medium.

For the purpose of comparison, an information recording medium 31 having the structure as shown in FIG. 10 was made. In the comparative sample, a first dielectric layer 102 and a second dielectric layer 106 were formed from $(ZnS)_{80}(SiO_2)_{20}$. Further, both of a first interface layer 103 and a second interface layer 105 were formed into a film consisting of Ge—Cr—N of 5 nm thickness respectively.

The first dielectric layer 102 was formed by conducting a high frequency sputtering using a sputtering target made of $(ZnS)_{80}(SiO_2)_{20}$ (a diameter of 100 mm and a thickness of 6 mm) under a pressure of 0.13 Pa. In this sputtering process, the conditions as shown in Table 3 were employed. The second dielectric layer 106 was formed in the same manner as the first dielectric layer 2.

In a process for forming the first interface layer 103, a sputtering target (a diameter of 100 mm, a thickness of 6 mm) made of a material having a composition of $Ge_{90}Cr_{10}$ (atomic %) was attached to the film-forming device, and then a high frequency sputtering was carried out under a pressure of about 1.33 Pa. The power was 300 W. As an atmosphere gas, a mixed gas of Ar gas (60%) and $N_2$ gas (40%) was introduced. As a result, the first interface layer 103 of Ge—Cr—N was formed by reacting $N_2$ in the mixed gas with Ge and Cr which were sputtered from the sputtering target. The second interface layer 105 was formed in the same manner as the first interface layer 103.

An optical compensation layer 7 and a reflective layer 8 of the information recording medium 31 were formed in the same manner as the optical compensation layer 7 and the reflective layer 8 of the information recording medium 25. The formation of an adhesive layer 9 and the lamination of a dummy substrate 10 were carried out in the same manner as those in the production of the information recording medium 25.

Next, the method for evaluating the information recording medium is explained. The evaluation of adhesiveness of the dielectric layer in the case of the information recording medium 25 was based on the delamination under a condition of a high humidity and a high temperature. Specifically, the information recording medium 25 after the initialization process was located for 100 hours in a high humidity/high temperature-tank where a relative humidity was 80% and the temperature was 90° C. Then, the medium 25 was investigated by observation using a light microscope whether the delamination occurred between the recording layer and the adjacent dielectric layers, more specifically, between the recording layer 4 and at least one of the first dielectric layer 2 and the second dielectric layer 6. Of course, a sample was rated as one having good adhesiveness when no delamination occurred; on the other hand, a sample was rated as one having low adhesiveness when delamination occurred.

The evaluation of overwrite cycle-ability of the information recording medium 25 was based on the number of overwrite cycles. The number of overwrite cycles was determined as described below.

In order to record information on the information recording medium 25, an information recording system having a general constitution was used. The system was provided with a spindle motor for rotating the information recording medium 25, an optical head including a semiconductor laser which can emit a laser beam 12, and an objective lens for condensing the laser beam 12 on the recording layer 4 of the information recording medium 25. On evaluating the information recording medium 25 recording which was equivalent to a capacity of 4.7 GB was conducted by using the semiconductor laser with a wavelength of 660 nm and the objective lens with a numerical aperture of 0.6. A linear velocity of rotation of the information recording medium 25 was set at 8.2 m/second. A time interval analyzer was used for measuring a jitter in order to obtain an average of jitters as mentioned below.

Firstly, in order to determine a measurement condition for determining the number of overwrite cycles, a peak power (Pp) and a bias power (Pb) were determined according to a following procedure. Using the system described above, the information recording medium 25 was irradiated with a laser beam 12 while modulating its power between a peak power (mW) in a high power level and a bias power (mW) in a low power level to record a random signal with a mark length of 0.42 μm (3T) to 1.96 μm (14T) ten times on the same groove surface of the recording layer 4 (by groove recording). Then, a jitter between front ends and a jitter between rear ends were measured. A jitter-average was calculated as the mean values of these jitters. Such jitter-average was measured on each recording condition with the bias power being fixed while the peak power was varied by being gradually increased. A power that was 1.3 times as large as a peak power at which the jitter-average for the random signal became 13% was determined as Pp1 temporarily. Next, a jitter-average was measured on each recording condition with the peak power being fixed at Pp1 while the bias power was varied. The mean value of upper and lower limits of bias powers at which the jitter-average for the random signal became 13% or less was determined as Pb. Then, the jitter-average was measured on each recording condition with the bias power being fixed at Pb while the peak power was varied by being gradually increased. A power that was 1.3 times as large as a peak power at which the jitter-average for the random signal became 13% was determined Pp. When the recording was conducted under the condition of thus determined Pp and Pb, 8 to 9% of the average of the jitters was obtained in the case of, for example, 10 times of overwrite. Considering the upper limit of the laser power of the system, it is desirable to satisfy $Pp \leq 14$ mW and $Pb \leq 8$ mW.

The number of overwrite cycles was determined in this example based on a jitter-average. The information recording medium 25 was irradiated with the laser beam while modulating its power between Pp and Pb thus determined to continuously record a random signal with a mark length of 0.42 μm (3T) to 1.96 μm (14T) in the same groove surface while repeating the predetermined times (by groove recording). After that, jitter-average was measured. The jitter-average was measured when the repetition times, i.e. the number of overwrite cycles, was 1, 2, 3, 5, 10, 100, 200, and 500 times, every 1000 times in a range from 1000 to 10000 times, and every 10000 times in a range from 20000 to 100000 times. The limit of overwrite was defined when the jitter-average became 13%. Overwrite cycle-ability was evaluated based on the number of overwrite cycles at this limit. Of course, as the number of overwrite cycles is larger, the overwrite cycle-ability is rated as higher. When an information recording medium is used as an external memory of a computer, the number of overwrite cycles is preferably 100000 times or more. When an information recording medium is used as a medium for an audio-visual recorder, it is preferably 10000 times or more.

TABLE 3

| | | First and Second Dielectric Layers | | | | | |
|---|---|---|---|---|---|---|---|
| | | Sputtering Conditions | | | | Evaluation | |
| | | | Atmosphere | | | | |
| Sample No. | Material | Power (W) | Gas Mixing Ratio (%) Ar | $O_2$ | Delamination | Number of Overwrite Cycles | Peak Power Pp (mW) |
| 1-1 | $TiO_2$ | 500 | 100 | 0 | Yes | 10000 | 15.5 |
| 1-2 | $ZrO_2$ | 500 | 100 | 0 | Yes | ≧100000 | 13.0 |
| 1-3 | $HfO_2$ | 500 | 100 | 0 | Yes | ≧100000 | 13.0 |
| 1-4 | $V_2O_5$ | 500 | 100 | 0 | Yes | Not Appreciable* | — |
| 1-5 | $Nb_2O_5$ | 500 | 100 | 0 | Yes | 10000 | 13.5 |
| 1-6 | $Ta_2O_5$ | 500 | 100 | 0 | Yes | 10000 | 13.5 |
| 1-7 | $Cr_2O_3$ | 500 | 100 | 0 | No | 10000 | 15.5 |
| 1-8 | $MoO_3$ | 500 | 100 | 0 | Yes | Not Appreciable* | — |
| 1-9 | $WO_3$ | 500 | 100 | 0 | Yes | Not Appreciable* | — |
| 1-10 | $SiO_2$ | 1000 | 97 | 3 | Yes | ≧100000 | 13.0 |
| 1-11 | ZnO | 400 | 100 | 0 | No | 100 | 14.5 |
| 1-12 | ZnS | 400 | 100 | 0 | No | 1000 | 12.0 |
| 1-13 | $LaF_3$ | 400 | 100 | 0 | No | 1000 | 13.0 |
| 1-14 | $TeO_2$ | 200 | 97 | 3 | Yes | Not Appreciable* | — |
| Comparative Sample | $(ZnS)_{80}(SiO_2)_{20}$ (Prior Art) | 400 | 97 | 3 | No | ≧100000 | 11.0 |

*Not Overwritable

As shown in Table 3, it was difficult to overwrite in the recording mediums of Sample Nos. 1-4, 1-8, 1-9 and 1-14. Specifically, when the second overwrite was conducted after forming the first recording marks previously formed recording marks (i.e. the first recording marks) were not erased. Therefore, it was found that it was difficult to use $V_2O_5$, $MoO_3$, $WO_3$, and $TeO_2$ as the dielectric layer. In the other samples, the properties equivalent to those of the comparative sample were not obtained. That is, any of the information recording mediums of Samples No. 1-1 to 1-14 did not satisfy good adhesiveness, good overwrite cycle-ability, and good recording sensitivity ($Pp \leq 14$ mW) at the same time.

From this result, it was found that any of the materials used in Sample Nos. 1-1 to 1-14 was not suitable for forming the dielectric layer in contact with the recording layer when used alone. However, from this result, it was found that the dielectric layers formed from $Cr_2O_3$, ZnO, ZnS and $LaF_3$ respectively showed good adhesiveness to the recording layer, and that the information recording mediums including the dielectric layers formed from $TiO_2$, $ZrO_2$, $HfO_2$, $Nb_2O_5$, $Ta_2O_5$, $Cr_2O_3$ and $SiO_2$ respectively had good overwrite cycle-ability. Therefore, the inventors considered that it is expected that good adhesiveness and good overwrite cycle-ability are achieved at the same time by using a mixture of one or more compounds selected from $Cr_2O_3$, ZnO, ZnS and $LaF_3$ and one or more compounds selected from $TiO_2$, $ZrO_2$, $HfO_2$, $Nb_2O_5$, $Ta_2O_5$, $Cr_2O_3$ and $SiO_2$.

Example 2

In Example 2, for the purpose of accomplishing good adhesiveness and good overwrite cycle-ability at the same time, information recording mediums were produced. In these mediums, each dielectric layer was formed from a mixture of two materials selected from those used in Example 1, one material being an excellent adhesiveness and the other ensuring a practical overwrite cycle-ability of the information recording medium. More specifically, similarly to Example 1, twenty-seven samples, which each had a constitution similar to the information recording medium 25 shown in FIG. 1, were produced, while varying a two-component material for a first and a second dielectric layers 2 and 6. In each sample, the first dielectric layer 2 and the second dielectric layer 6 in each sample were made of a material having the same composition.

The information recording mediums of this example were produced in the same manner as in Example 1 except the first and the second dielectric layers were made of the materials shown in Table 4. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 1 and the second dielectric layer 6 were formed by conducting a high frequency sputtering under a pressure of 0.13 Pa with a sputtering target (a diameter of 100 mm, a thickness of 6 mm) made of a material shown in Table 4, respectively. The atmosphere gas and sputtering power employed in each sample are shown in Table 4.

With respect to each sample, adhesiveness of the dielectric layers and overwrite cycle-ability of the information recording medium were evaluated. The results are shown in Table 4. The method for evaluating adhesiveness and overwrite cycle-ability are as described above.

TABLE 4

| | First and Second Dielectric Layers | | | | | | |
|---|---|---|---|---|---|---|---|
| | | Sputtering Conditions | | | | | |
| | | | Atmosphere | | Evaluation | | |
| | | | Gas Mixing Ratio (%) | | | | Peak |
| Sample | | Power | | | | Number of | Power |
| No. | Material | (W) | Ar | $O_2$ | Delamination | Overwrite Cycles | Pp (mW) |
| 2-1 | $(TiO_2)_{50}(Cr_2O_3)_{50}$ | 500 | 100 | 0 | No | 50000 | 15.5 |
| 2-2 | $(TiO_2)_{50}(ZnO)_{50}$ | 400 | 100 | 0 | No | 100 | 15.0 |
| 2-3 | $(TiO_2)_{50}(ZnS)_{50}$ | 400 | 100 | 0 | No | 1000 | 13.8 |
| 2-4 | $(TiO_2)_{50}(LaF_3)_{50}$ | 400 | 100 | 0 | No | 30000 | 13.3 |
| 2-5 | $(ZrO_2)_{50}(Cr_2O_3)_{50}$ | 500 | 100 | 0 | No | 100000 | 14.3 |
| 2-6 | $(ZrO_2)_{50}(ZnO)_{50}$ | 400 | 100 | 0 | No | 1000 | 13.7 |
| 2-7 | $(ZrO_2)_{50}(ZnS)_{50}$ | 400 | 100 | 0 | No | 1000 | 12.5 |
| 2-8 | $(ZrO_2)_{50}(LaF_3)_{50}$ | 400 | 100 | 0 | No | 50000 | 12.0 |
| 2-9 | $(HfO_2)_{50}(Cr_2O_3)_{50}$ | 500 | 100 | 0 | No | 100000 | 14.3 |
| 2-10 | $(HfO_2)_{50}(ZnO)_{50}$ | 400 | 100 | 0 | No | 1000 | 13.8 |
| 2-11 | $(HfO_2)_{50}(ZnS)_{50}$ | 400 | 100 | 0 | No | 1000 | 12.5 |
| 2-12 | $(HfO_2)_{50}(LaF_3)_{50}$ | 400 | 100 | 0 | No | 50000 | 12.0 |
| 2-13 | $(Nb_2O_5)_{50}(Cr_2O_3)_{50}$ | 500 | 100 | 0 | No | 10000 | 14.5 |
| 2-14 | $(Nb_2O_5)_{50}(ZnO)_{50}$ | 400 | 100 | 0 | No | 100 | 14.0 |
| 2-15 | $(Nb_2O_5)_{50}(ZnS)_{50}$ | 400 | 100 | 0 | No | 1000 | 13.3 |
| 2-16 | $(Nb_2O_5)_{50}(LaF_3)_{50}$ | 400 | 100 | 0 | No | 10000 | 12.3 |
| 2-17 | $(Ta_2O_5)_{50}(Cr_2O_3)_{50}$ | 500 | 100 | 0 | No | 10000 | 14.5 |
| 2-18 | $(Ta_2O_5)_{50}(ZnO)_{50}$ | 400 | 100 | 0 | No | 100 | 14.0 |
| 2-19 | $(Ta_2O_5)_{50}(ZnS)_{50}$ | 400 | 100 | 0 | No | 1000 | 12.8 |
| 2-20 | $(Ta_2O_5)_{50}(LaF_3)_{50}$ | 400 | 100 | 0 | No | 10000 | 12.3 |
| 2-21 | $(Cr_2O_3)_{50}(ZnO)_{50}$ | 400 | 100 | 0 | No | 100 | 15.0 |
| 2-22 | $(Cr_2O_3)_{50}(ZnS)_{50}$ | 400 | 100 | 0 | No | 1000 | 13.8 |
| 2-23 | $(Cr_2O_3)_{50}(LaF_3)_{50}$ | 400 | 100 | 0 | No | 10000 | 13.2 |
| 2-24 | $(SiO_2)_{50}(Cr_2O_3)_{50}$ | 500 | 100 | 0 | No | 100000 | 14.3 |
| 2-25 | $(SiO_2)_{50}(ZnO)_{50}$ | 400 | 100 | 0 | No | 100 | 13.8 |
| 2-26 | $(SiO_2)_{50}(ZnS)_{50}$ | 400 | 100 | 0 | No | 1000 | 12.5 |
| 2-27 | $(SiO_2)_{50}(LaF_3)_{50}$ | 400 | 100 | 0 | No | 80000 | 12.0 |
| Comparative Sample | $(ZnS)_{80}(SiO_2)_{20}$ (prior art) | 400 | 97 | 3 | No | $\geq 100000$ | 11.0 |

As shown in Table 4, delamination did not occur in all of the information recording mediums of Sample Nos. 2-1 to 2-27, and therefore adhesiveness was improved. The samples wherein a material containing $Cr_2O_3$ was used showed good overwrite cycle-ability. Particularly, in each sample wherein a material obtained by mixing $Cr_2O_3$ with $ZrO_2$, $HfO_2$ or $SiO_2$ was used, the number of overwrite cycles was 100000. Further, each sample in which a material containing $LaF_3$ was used showed Pp<14 which means good recording sensitivity. On the contrary, each sample in which a material containing ZnO or ZnS was inferior in overwrite cycle-ability. From these results, it was found that $Cr_2O_3$ or $LaF_3$ is preferably employed as a material which is to be mixed with a dielectric material that contributes to good overwrite cycle-ability, that is, $TiO_2$, $ZrO_2$, $HfO_2$, $Nb_2O_5$, $Ta_2O_5$, $Cr_2O_3$ or $SiO_2$. Further, it was considered that the comibnation of oxide and fluoride is more effective in lowering thermal conductivity of the layer than the combination of two kinds of oxides.

In addition, from the results shown in Table 4, it was found that, by using the combination of $LaF_3$ and oxide, it was possible to obtain an information recording medium which satisfy good adhesiveness, good overwrite cycle-ability and good recording sensitivity at the same time. From this, the inventors considered that the same good result would be obtained by using a mixture containing a fluoride of a rare earth metal.

Example 3

In Example 3, for the purpose of achieving good recording sensitivity, the dielectric layer was formed from a material which was obtained by mixing a fluoride of a rare earth metal with any one of $ZrO_2$, $HfO_2$ and $SiO_2$ which particularly favorably contribute to overwrite cycle-ability. Specifically, similarly to Example 1, twenty-four samples, which each had a constitution similar to the information recording medium 25 shown in FIG. 1, were produced, while varying a two-component material for a first and a second dielectric layers 2 and 6. In this example, the first dielectric layer 2 and the second dielectric layer 6 in each sample were made of a material having the same composition.

Each sample of this example was produced in the same manner as in Example 1 except that the first and the second dielectric layers were made of the material shown in Table 5. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 5, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 5. The method for evaluating adhesiveness and overwrite cycle-ability are as described above.

TABLE 5

| Sample No. | First and second Dielectric Layers Material | Evaluation | | |
|---|---|---|---|---|
| | | Delamination | Number of Overwrite Cycles | Peak Power Pp (mW) |
| 3-1 | $(ZrO2)_{50}(CeF_3)_{50}$ | No | 40000 | 12.6 |
| 3-2 | $(ZrO_2)_{50}(PrF_3)_{50}$ | No | 40000 | 12.4 |
| 3-3 | $(ZrO_2)_{50}(NdF_3)_{50}$ | No | 20000 | 12.3 |
| 3-4 | $(ZrO_2)_{50}(GdF_3)_{50}$ | No | 20000 | 12.5 |
| 3-5 | $(ZrO_2)_{50}(DyF_3)_{50}$ | No | 20000 | 12.2 |
| 3-6 | $(ZrO_2)_{50}(HoF_3)_{50}$ | No | 20000 | 12.7 |
| 3-7 | $(ZrO_2)_{50}(ErF_3)_{50}$ | No | 10000 | 12.8 |
| 3-8 | $(ZrO_2)_{50}(YbF_3)_{50}$ | No | 10000 | 12.5 |
| 3-9 | $(HfO_2)_{50}(CeF_3)_{50}$ | No | 40000 | 12.4 |
| 3-10 | $(HfO_2)_{50}(PrF_3)_{50}$ | No | 40000 | 12.5 |
| 3-11 | $(HfO_2)_{50}(NdF_3)_{50}$ | No | 20000 | 12.6 |
| 3-12 | $(HfO_2)_{50}(GdF_3)_{50}$ | No | 20000 | 12.3 |
| 3-13 | $(HfO_2)_{50}(DyF_3)_{50}$ | No | 20000 | 12.4 |
| 3-14 | $(HfO_2)_{50}(HoF_3)_{50}$ | No | 20000 | 12.5 |
| 3-15 | $(HfO_2)_{50}(ErF_3)_{50}$ | No | 10000 | 12.6 |
| 3-16 | $(HfO_2)_{50}(YbF_3)_{50}$ | No | 10000 | 12.4 |
| 3-17 | $(SiO_2)_{50}(CeF_3)_{50}$ | No | 70000 | 12.3 |
| 3-18 | $(SiO_2)_{50}(PrF_3)_{50}$ | No | 70000 | 12.2 |
| 3-19 | $(SiO_2)_{50}(NdF_3)_{50}$ | No | 50000 | 12.6 |
| 3-20 | $(SiO_2)_{50}(GdF_3)_{50}$ | No | 50000 | 12.4 |
| 3-21 | $(SiO_2)_{50}(DyF_3)_{50}$ | No | 50000 | 12.3 |
| 3-22 | $(SiO_2)_{50}(HoF_3)_{50}$ | No | 50000 | 12.3 |
| 3-23 | $(SiO_2)_{50}(ErF_3)_{50}$ | No | 40000 | 12.5 |
| 3-24 | $(SiO_2)_{50}(YbF_3)_{50}$ | No | 40000 | 12.3 |
| Comparative Sample | $(ZnS)_{80}(SiO_2)_{20}$ (Prior Art) | No | $\geq 100000$ | 11.0 |

As shown in Table 5, in all the information recording mediums of Sample Nos. 3-1 to 3-24, delamination did not occur, and therefore good adhesiveness was obtained. Further, in all the samples, the number of overwrite cycles was 10000 or more, which ensured that the sample was sufficiently used as the information recording medium for an audio-visual recorder. Furthermore, all the samples showed Pp<14 mW which means good recording sensitivity. From this result, it was found that, by mixing an oxide and a fluoride of a rare earth metal, even if the dielectric layer is formed in contact with the recording layer, the properties required for the information recording medium are ensured.

Comparing the comparative sample with Samples No. 3-1 to 3-24, in the comparative sample, 100000 or more times overwrite cycles was achieved and high recording sensitivity, that is, Pp=11 mW was realized. Considering that the information recording medium may be used as an external memory of a computer, it is desired that 100000 or more times overwrite cycles is achieved. Then, in order to realize the performance equal to or higher than the comparative sample (i.e. the prior art information recording medium), the use of a material obtained by mixing a plurality of oxides and a fluoride was attempted.

Example 4

In Example 4, as to $ZrO_2$—$LaF_3$-mixture-based material, a composition range suitable for forming the dielectric layer was determined. Specifically, seven samples, which each had a constitution similar to the information recording medium 27 described in Embodiment 3 with reference to FIG. 3, were produced, while varying the content ratios of the two compounds in the material for a second dielectric layer 6. Hereafter, the producing method of the information recording medium 27 is explained.

Firstly, a substrate 1 which was the same as that used in Example 1 was prepared. On this substrate 1, a first dielectric layer 102 of 150 nm thickness, a first interface layer 103 of 5 nm thickness, a recording layer 4 of 9 nm thickness, the second dielectric layer 6 of 50 nm thickness, an optical compensation layer 7 of 40 nm thickness, and a reflective layer 8 of 80 nm thickness were formed in this order by a sputtering method as follows.

The first dielectric layer 102 was formed from $(ZnS)_{80}(SiO_2)_{20}$ (mol %) in the same manner as the first dielectric layer 102 of the information recording medium 31 (comparative sample) as described above in Example 1. The first interface layer 103 was formed in the same manner as the first interface layer 103 of the information recording medium 31 (comparative sample) as described above in Example 1 so that a Ge—Cr—N layer was formed. The recording layer 4 was formed in the same manner as in Example 1, and therefore, its composition was $Ge_{27}Sn_8Sb_{12}Te_{53}$ (atomic %).

The second dielectric layer 6 was formed by conducting a high frequency sputtering in an Ar gas atmosphere under a pressure of 0.13 Pa with a sputtering target (a diameter of 100 mm and a thickness of 6 mm) made of a material shown in Table 6, respectively. The sputtering power was 500 W in Sample No. 4-1, and 400 W in Sample Nos. 4-2 to 4-7.

The optical compensation 7 and the reflective layer 8 were formed in the same manner as those of the information recording medium 25 described in Example1.

For the purpose of comparison, an information recording medium 31 which was the same as that produced in Example 1 was produced as a comparative sample. With respect to each sample, adhesiveness of the dielectric layers and overwrite cycle-ability of the information recording medium were evaluated. The results are shown in Table 6. The method for evaluating adhesiveness and overwrite cycle-ability are as described above. However, in this example, the evaluation of adhesiveness was conducted by investigating whether delamination occurred between the recording layer 4 and the second dielectric layer 6 adjacent to it.

TABLE 6

| Sample No. | Second Dielectric Layers Material | Evaluation | | |
|---|---|---|---|---|
| | | Delamination | Number of Overwrite Cycles | Peak Power Pp (mW) |
| 4-1 | $ZrO_2$ | Occured in whole area | $\geq 100000$ | 13.0 |
| 4-2 | $(ZrO_2)_{95}(LaF_3)_5$ | Occurred only at the periphery. Not ocurred in the center area. | $\geq 100000$ | 12.8 |
| 4-3 | $(ZrO_2)_{90}(LaF_3)_{10}$ | No | $\geq 100000$ | 12.6 |
| 4-4 | $(ZrO_2)_{80}(LaF_3)_{20}$ | No | 100000 | 12.5 |
| 4-5 | $(ZrO_2)_{70}(LaF_3)_{30}$ | No | 90000 | 12.3 |
| 4-6 | $(ZrO_2)_{60}(LaF_3)_{40}$ | No | 70000 | 12.1 |
| 4-7 | $(ZrO_2)_{50}(LaF_3)_{50}$ | No | 50000 | 12.0 |
| Comparative Sample | $(ZnS)_{80}(SiO_2)_{20}$ (Prior Art) | No | $\geq 100000$ | 11.0 |

As shown in Table 6, it was confirmed that delamination did not occur and good adhesiveness was ensured when $LaF_3$ was contained in an amount of 10 mol % or more. Further, as the ratio of $ZrO_2$ was smaller (that is, the ratio of $LaF_3$ was larger), the number of overwrite cycles was smaller while Pp tended to be smaller, and therefore, the recording sensitivity tended to be better. From the results of Table 6, it was found that considering the balance between the overwrite cycle-ability and the recording sensitivity, the ratio of $ZrO_2$ is preferably 50 mol % or more, while considering the adhesiveness, the ratio of $ZrO_2$ is preferably 90 mol % or less.

Example 5

In Example 5, in order to improve the recording sensitivity and overwrite cycle-ability, the dielectric layer was formed from a material which was a mixture of two or more kinds of oxides and $LaF_3$ as a fluoride of the element selected from the group GL. Specifically, similarly to Example 1, eight samples, which each had a constitution similar to the information recording medium 25 shown in FIG. 1, were produced, while varying a three-component material for a first dielectric layer 2 and a second dielectric layer 6. In this example, the first dielectric layer 2 and the second dielectric layer 6 in each sample were made of a material having the same composition. The reason why $LaF_3$ was employed is that it has a high melting point and advantage in cost.

Each sample of this example was produced in the same manner as in Example 1 except that the first and the second dielectric layers were made of the material shown in Table 7. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 7 respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 7. The method for evaluating adhesiveness and overwrite cycle-ability are as described in Example 1.

As shown in Table 7, more than 100000 times overwrite cycles and $Rp \leq 14$ were obtained in the samples wherein $ZrO_2$—$Cr_2O_3$—$LaF_3$-mixture-system (Sample No. 5-1), $SiO_2$—$Cr_2O_3$—$LaF_3$-mixture-system (Sample No. 5-2), $HfO_2$—$Cr_2O_3$—$LaF_3$-mixture-system (Sample No. 5-3), $ZrO_2$—$SiO_2$—$Cr_2O_3$—$LaF_3$-mixture-system (Sample No. 5-5), and $HfO_2$—$SiO_2$—$Cr_2O_3$—$LaF_3$-mixture-system (Sample No. 5-6) were used respectively. Particularly, each sample wherein the system containing $SiO_2$ was used had a lower Rp, and therefore showed higher recording sensitivity. That is, by forming the dielectric layer from these mixture systems in contact with the recording layer so as to constitute the information recording medium, it was possible to realize, in the constitution without the first and the second interface layers (i.e. the constitution of less layers), the performance equivalent to the prior art constitution having the interface layers.

Although as to Samples Nos. 5-4 and 5-7 in which $TiO_2$—$Cr_2O_3$—$LaF_3$-mixture-system and $TiO_2$—$SiO_2$—$Cr_2O_3$—$LaF_3$-mixture-system were used respectively, the number of overwrite cycles was less than 100000, these samples showed more excellent overwrite cycle-ability than that of Sample No. 2-4 shown in Table 2. Sample No. 5-7 in which $TiO_2$—$SiO_2$—$Cr_2O_3$—$LaF_3$-mixture-system was used showed the overwrite cycle-ability equal to that of Sample No. 5-4, and a lower Pp which means higher recording sensitivity than Sample No. 5-4. From these results of Table 7, it was found that the addition of $Cr_2O_3$ contributes to the improvement of the overwrite cycle-ability, and the addition of $SiO_2$ contributes to the improvement of the recording sensitivity.

Example 6

In Example 6, as to $ZrO_2$—$Cr_2O_3$—$LaF_3$-mixture-based material, a composition range suitable for forming the dielectric layer was determined. Specifically, similarly to Example 4, twelve samples, which each had a constitution similar to the information recording medium 27 as shown in FIG. 3, were produced, while varying the content ratios of the three compounds in the material for a second dielectric layer 6.

Each sample of this example was produced in the same manner as in Example 4 except that the second dielectric layer 6 was made of the material shown in Table 8. Therefore, each of the samples has a constitution which was similar to the information recording medium 27 shown in FIG. 3. A substrate 1 was the same as the substrate used in Example 1. A first dielectric layer 102, a first interface layer 103, a recording layer 4, an optical compensation layer 7 and a reflective layer 8 were formed in the same manner as in Example 4. The second dielectric layer 6 was formed by conducting a high frequency sputtering under a pressure of

TABLE 7

| | | Evaluation | | |
|---|---|---|---|---|
| Sample No. | First and Second Dielectric Layers Material | Delamination | Number of Overwrite Cycles | Peak Power Pp (mW) |
| 5-1 | $(ZrO_2)_{40}(Cr_2O_3)_{30}(LaF_3)_{30}$ | No | $\geq 100000$ | 12.3 |
| 5-2 | $(SiO_2)_{40}(Cr_2O_3)_{30}(LaF_3)_{30}$ | No | $\geq 100000$ | 12.3 |
| 5-3 | $(HfO_2)_{40}(Cr_2O_3)_{30}(LaF_3)_{30}$ | No | $\geq 100000$ | 12.2 |
| 5-4 | $(TiO_2)_{40}(Cr_2O_3)_{30}(LaF_3)_{30}$ | No | 80000 | 13.5 |
| 5-5 | $(ZrO_2)_{30}(SiO_2)_{10}(Cr_2O_3)_{30}(LaF_3)_{30}$ | No | $\geq 100000$ | 10.8 |
| 5-6 | $(HfO_2)_{30}(SiO_2)_{10}(Cr_2O_3)_{30}(LaF_3)_{30}$ | No | $\geq 100000$ | 10.9 |
| 5-7 | $(TiO_2)_{30}(SiO_2)_{10}(Cr_2O_3)_{30}(LaF_3)_{30}$ | No | 80000 | 12.1 |
| 5-8 | $(Ta_2O_5)_{30}(SiO_2)_{10}(Cr_2O_3)_{30}(LaF_3)_{30}$ | No | 60000 | 11.1 |
| Comparative Sample | $(ZnS)_{80}(SiO_2)_{20}$ (Prior Art) | No | $\geq 100000$ | 11.0 |

0.13 Pa with a sputtering target (a diameter of 100 mm, a thickness of 6 mm) made of a material shown in Table 8, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 8. The method for evaluating adhesiveness and overwrite cycle-ability are as described above in connection with Example 4.

TABLE 8

| Sample No. | First and Second Dielectric Layers Material | Evaluation | | |
|---|---|---|---|---|
| | | Delamination | Number of Overwrite Cycles | Peak Power Pp (mW) |
| 6-1 | $(ZrO_2)_{85}(Cr_2O_3)_{10}(LaF_3)_5$ | No | ≧100000 | 13.0 |
| 6-2 | $(ZrO_2)_{35}(Cr_2O_3)_{60}(LaF_3)_5$ | No | ≧100000 | 13.6 |
| 6-3 | $(ZrO_2)_{80}(Cr_2O_3)_{10}(LaF_3)_{10}$ | No | ≧100000 | 12.4 |
| 6-4 | $(ZrO_2)_{30}(Cr_2O_3)_{60}(LaF_3)_{10}$ | No | ≧100000 | 13.0 |
| 6-5 | $(ZrO_2)_{70}(Cr_2O_3)_{10}(LaF_3)_{20}$ | No | ≧100000 | 12.2 |
| 6-6 | $(ZrO_2)_{20}(Cr_2O_3)_{60}(LaF_3)_{20}$ | No | 100000 | 12.8 |
| 6-7 | $(ZrO_2)_{60}(Cr_2O_3)_{10}(LaF_3)_{30}$ | No | ≧100000 | 12.0 |
| 6-8 | $(ZrO_2)_{10}(Cr_2O_3)_{60}(LaF_3)_{30}$ | No | 90000 | 12.6 |
| 6-9 | $(ZrO_2)_{50}(Cr_2O_3)_{10}(LaF_3)_{40}$ | No | ≧100000 | 11.7 |
| 6-10 | $(ZrO_2)_{10}(Cr_2O_3)_{50}(LaF_3)_{40}$ | No | 70000 | 12.2 |
| 6-11 | $(ZrO_2)_{40}(Cr_2O_3)_{10}(LaF_3)_{50}$ | No | ≧100000 | 11.4 |
| 6-12 | $(ZrO_2)_{10}(Cr_2O_3)_{40}(LaF_3)_{50}$ | No | 50000 | 11.8 |
| Comparative Sample | $(ZnS)_{80}(SiO_2)_{20}$ (Prior Art) | No | ≧100000 | 11.0 |

As shown in Table 8, it was confirmed that delamination did not occur and good adhesiveness was ensured by $Cr_2O_3$ even if the ratio of $LaF_3$ was small. As the total of the ratios of $ZrO_2$ and $Cr_2O_3$ was smaller (that is, the ratio of $LaF_3$ was larger), Pp tended to be small, and therefore, the recording sensitivity tended to be better. Further, when the total of the ratios of $ZrO_2$ and $Cr_2O_3$ was the same, as the ratio of $Cr_2O_3$ was larger, the number of overwrite cycles tended to be smaller while Pp tended to be larger. From the results of Table 8, it was found that considering the balance between the overwrite cycle-ability and the recording sensitivity, the total of the ratios of $ZrO_2$ and $Cr_2O_3$ is preferably 50 mol % or more. Further, it was found that each of the ratios of $ZrO_2$ and $Cr_2O_3$ is preferably 10 mol % or more.

Example 7

In Example 7, as to $ZrO_2$—$SiO_2$—$Cr_2O_3$—$LaF_3$-mixture-based material, a composition range suitable for forming the dielectric layer was determined. Specifically, similarly to Example 1, six samples, which each had a constitution similar to the information recording medium 25 shown in FIG. 1, were produced, while varying the content ratios of the four compounds in the material for a first dielectric layer 2 and a second dielectric layer 6. Also in this example, the first dielectric layer 2 and the second dielectric layer 6 in each sample were made of a material having the same composition.

Each sample of this example was produced in the same manner as in Example 1 except that the first and the second dielectric layers were made of the material shown in Table 9. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 9, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 9. The method for evaluating adhesiveness and overwrite cycle-ability are as described in Example 1. The evaluation result of Sample No. 5-5 is shown again in Table 9 since the result was used for determining the composition range.

TABLE 9

| Sample No. | First and Second Dielectric Layers Material | Evaluation | | |
|---|---|---|---|---|
| | | Delamination | Number of Overwrite Cycles | Peak Power Pp (mW) |
| 7-1 | $(ZrO_2)_{20}(SiO_2)_{10}(Cr_2O_3)_{20}(LaF_3)_{50}$ | No | ≧100000 | 10.0 |
| 7-2 | $(ZrO_2)_{20}(SiO_2)_{20}(Cr_2O_3)_{10}(LaF_3)_{50}$ | No | ≧100000 | 9.8 |
| 7-3 | $(ZrO_2)_{20}(SiO_2)_{10}(Cr_2O_3)_{60}(LaF_3)_{10}$ | No | ≧100000 | 12.5 |
| 7-4 | $(ZrO_2)_{20}(SiO_2)_{50}(Cr_2O_3)_{20}(LaF_3)_{10}$ | No | ≧100000 | 10.5 |
| 7-5 | $(ZrO_2)_{50}(SiO_2)_{10}(Cr_2O_3)_{10}(LaF_3)_{30}$ | No | ≧100000 | 10.8 |
| 7-6 | $(ZrO_2)_{70}(SiO_2)_{10}(Cr_2O_3)_{10}(LaF_3)_{10}$ | No | ≧100000 | 11.2 |
| 5-5 | $(ZrO_2)_{30}(SiO_2)_{10}(Cr_2O_3)_{30}(LaF_3)_{30}$ | No | ≧100000 | 10.8 |
| Comparative Sample | $(ZnS)_{80}(SiO_2)_{20}$ (Prior Art) | No | ≧100000 | 11.0 |

As shown in Table 9, it was confirmed that when the material was expressed with the formula (4), i.e. $(D)_X(SiO_2)_Y(Cr_2O_3)_Z(LaF_3)_{100-X-Y-Z}$ (mol %) and D was $ZrO_2$, and X, Y and Z satisfied 20≦X≦70, 10≦Y≦50, 10≦Z≦60, and 50≦X+Y+Z≦90, good adhesiveness, good overwrite cycle-ability (100000 or more times overwrite cycles), and good recording sensitivity of Pp<14 mW were achieved in the information recording medium 25. Further, composition dependence was found. Specifically, in the case of the material in which the ratio of $Cr_2O_3$ was large, recording sensitivity is somewhat lowered, whereas in the case of the material in which the ratio of $LaF_3$ is large, the recording sensitivity becomes higher.

Example 8

In Example 8, as to $HfO_2$—$SiO_2$—$Cr_2O_3$—$LaF_3$-mixture-based material, a composition range suitable for forming the dielectric layer was determined. Specifically, similarly to Example 1, six samples, which each had a constitution similar to the information recording medium 25 shown in FIG. 1, were produced, while varying the content ratios of the four compounds in the material for a first dielectric layer 2 and a second dielectric layer 6. Also in this example, the first dielectric layer 2 and the second dielectric layer 6 in each sample were made of a material having the same composition.

Each sample of this example was produced in the same manner as in Example 1 except that the first and the second dielectric layers were made of the material shown in Table 10. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 10, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 10. The method for evaluating adhesiveness and overwrite cycle-ability are as described in Example 1. The evaluation result of Sample No. 5-6 is shown again in Table 10 since the result was used for determining the composition range.

TABLE 10

| Sample No. | First and Second Dielectric Layers Material | Delamination | Number of Overwrite Cycles | Peak Power Pp (mW) |
|---|---|---|---|---|
| 8-1 | $(HfO_2)_{20}(SiO_2)_{10}(Cr_2O_3)_{20}(LaF_3)_{50}$ | No | $\geq 100000$ | 10.1 |
| 8-2 | $(HfO_2)_{20}(SiO_2)_{20}(Cr_2O_3)_{10}(LaF_3)_{50}$ | No | $\geq 100000$ | 9.9 |
| 8-3 | $(HfO_2)_{20}(SiO_2)_{10}(Cr_2O_3)_{60}(LaF_3)_{10}$ | No | $\geq 100000$ | 12.5 |
| 8-4 | $(HfO_2)_{20}(SiO_2)_{50}(Cr_2O_3)_{20}(LaF_3)_{10}$ | No | $\geq 100000$ | 10.6 |
| 8-5 | $(HfO_2)_{50}(SiO_2)_{10}(Cr_2O_3)_{10}(LaF_3)_{30}$ | No | $\geq 100000$ | 10.9 |
| 8-6 | $(HfO_2)_{70}(SiO_2)_{10}(Cr_2O_3)_{10}(LaF_3)_{10}$ | No | $\geq 100000$ | 11.3 |
| 5-6 | $(HfO_2)_{30}(SiO_2)_{10}(Cr_2O_3)_{30}(LaF_3)_{30}$ | No | $\geq 100000$ | 10.9 |
| Comparative Sample | $(ZnS)_{80}(SiO_2)_{20}$ (Prior Art) | No | $\geq 100000$ | 11.0 |

As shown in Table 10, it was confirmed that when the material was expressed with the formula (4), i.e. $(D)_X (SiO_2)_Y (Cr_2O_3)_Z (LaF_3)_{100-X-Y-Z}$ (mol %) and D was $HfO_2$, and X, Y and Z satisfied $20 \leq X \leq 70$, $10 \leq Y \leq 50$, $10 \leq Z \leq 60$, and $50 \leq X+Y+Z \leq 90$, good adhesiveness, good overwrite cycle-ability (100000 or more times overwrite cycles), and good recording sensitivity of Pp<14 mW were achieved in the information recording medium 25.

Example 9

In Example 9, as to $Ta_2O_5$—$SiO_2$—$Cr_2O_3$—$LaF_3$-mixture-based material, a composition range suitable for forming the dielectric layer was determined. Specifically, similarly to Example 1, six samples, which each had a constitution similar to the information recording medium 25 shown in FIG. 1, were produced, while varying the content ratios of the four compounds in the material for a first dielectric layer 2 and a second dielectric layer 6. Also in this example, the first dielectric layer 2 and the second dielectric layer 6 in each sample were made of a material having the same composition.

Each sample of this example was produced in the same manner as in Example 1 except that the first and the second dielectric layers were made of the material shown in Table 11. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 11, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 11. The method for evaluating adhesiveness and overwrite cycle-ability are as described in Example 1. The evaluation result of Sample No. 5-8 is shown again in Table 11 since the result was used for determining the composition range.

TABLE 11

| Sample No. | First and Second Dielectric Layers Material | Delamination | Number of Overwrite Cycles | Peak Power Pp (mW) |
|---|---|---|---|---|
| 9-1 | $(Ta_2O_5)_{20}(SiO_2)_{10}(Cr_2O_3)_{20}(LaF_3)_{50}$ | No | 10000 | 10.3 |
| 9-2 | $(Ta_2O_5)_{20}(SiO_2)_{20}(Cr_2O_3)_{10}(LaF_3)_{50}$ | No | 10000 | 10.1 |
| 9-3 | $(Ta_2O_5)_{20}(SiO_2)_{10}(Cr_2O_3)_{60}(LaF_3)_{10}$ | No | 20000 | 12.8 |
| 9-4 | $(Ta_2O_5)_{20}(SiO_2)_{50}(Cr_2O_3)_{20}(LaF_3)_{10}$ | No | $\geq 100000$ | 10.8 |
| 9-5 | $(Ta_2O_5)_{50}(SiO_2)_{10}(Cr_2O_3)_{10}(LaF_3)_{30}$ | No | 40000 | 11.1 |
| 9-6 | $(Ta_2O_5)_{70}(SiO_2)_{10}(Cr_2O_3)_{10}(LaF_3)_{10}$ | No | 20000 | 11.5 |
| 5-8 | $(Ta_2O_5)_{30}(SiO_2)_{10}(Cr_2O_3)_{30}(LaF_3)_{30}$ | No | 60000 | 11.1 |
| Comparative Sample | $(ZnS)_{80}(SiO_2)_{20}$ (Prior Art) | No | $\geq 100000$ | 11.0 |

As shown in Table 11, it was confirmed that when the material was expressed with the formula (4), i.e. $(D)_X (SiO_2)_Y (Cr_2O_3)_Z (LaF_3)_{100-X-Y-Z}$ (mol %) and D was $Ta_2O_5$, and X, Y and Z satisfied $20 \leq X \leq 70$, $10 \leq Y \leq 50$, $10 \leq Z \leq 60$, and $50 \leq X+Y+Z \leq 90$, good adhesiveness and good recording sensitivity of Pp<14 mW were achieved in the information recording medium 25. Compared with the samples of Examples 7 and 8, each of Samples Nos. 9-1, 2, 3, 5 and 6 showed a smaller overwrite cycles. However, these samples were practicable as an information recording medium for particular use (for example, an audio-visual recorder).

Example 10

In Example 10, as to $ZrSiO_4$—$Cr_2O_3$—$LaF_3$-mixture-based material, a composition range suitable for forming the dielectric layer was determined. Specifically, similarly to Example 1, seven samples, which each had a constitution similar to the information recording medium 25 shown in FIG. 1, were produced, while varying the content ratios of the three compounds in the material for a first dielectric layer 2 and a second dielectric layer 6. Also in this example, the first dielectric layer 2 and the second dielectric layer 6 in each sample were made of a material having the same composition.

Each sample of this example was produced in the same manner as in Example 1 except that the first and the second dielectric layers were made of the material shown in Table 12. Therefore, each of the samples had a constitution which was similar to the information recording medium 25 shown in FIG. 1. A substrate 1 was the same as the substrate used in Example 1. A recording layer 4, an optical compensation layer 7 and a reflective layer 8 were formed in the same manner as in Example 1. The first dielectric layer 2 and the second dielectric layer 6 were formed by conducting a high frequency sputtering under a pressure of 0.13 Pa with a sputtering target (a diameter of 100 mm, a thickness of 6 mm) made of a material shown in Table 12, respectively. As to all the samples, in the process of forming the dielectric layer, the sputtering was conducted in an Ar gas atmosphere using a 400 W power.

With respect to each sample, adhesiveness of the dielectric layers and overwrite cycle-ability of the information recording medium were evaluated. The results are shown in Table 12. The method for evaluating adhesiveness and overwrite cycle-ability are as described in Example 1.

TABLE 12

| Sample No. | First and Second Dielectric Layers Material | Delamination | Number of Overwrite Cycles | Peak Power Pp (mW) |
|---|---|---|---|---|
| 10-1 | $(ZrSiO_4)_{40}(Cr_2O_3)_{10}(LaF_3)_{50}$ | No | $\geq 100000$ | 9.8 |
| 10-2 | $(ZrSiO_4)_{50}(Cr_2O_3)_{30}(LaF_3)_{20}$ | No | $\geq 100000$ | 10.5 |
| 10-3 | $(ZrSiO_4)_{50}(Cr_2O_3)_{20}(LaF_3)_{30}$ | No | $\geq 100000$ | 11.0 |
| 10-4 | $(ZrSiO_4)_{70}(Cr_2O_3)_{20}(LaF_3)_{10}$ | No | $\geq 100000$ | 12.0 |
| 10-5 | $(ZrSiO_4)_{70}(Cr_2O_3)_{10}(LaF_3)_{20}$ | No | $\geq 100000$ | 10.5 |
| 10-6 | $(ZrSiO_4)_{20}(Cr_2O_3)_{50}(LaF_3)_{30}$ | No | $\geq 100000$ | 12.7 |
| 10-7 | $(ZrSiO_4)_{20}(Cr_2O_3)_{40}(LaF_3)_{40}$ | No | $\geq 100000$ | 12.3 |
| Comparative Sample | $(ZnS)_{80}(SiO_2)_{20}$ (Prior Art) | No | $\geq 100000$ | 11.0 |

As shown in Table 12, it was confirmed that when the material was expressed with the formula (5), i.e. $(ZrSiO_4)_A (Cr_2O_3)_B (LaF_3)_{100-A-B}$ (mol %) and A and B satisfy $20 \leq A \leq 70$, $10 \leq B \leq 50$, and $50 \leq A+B \leq 90$, good adhesiveness, good overwrite cycle-ability (100000 or more times overwrite cycles), and good recording sensitivity of Pp<14 mW were achieved in the information recording medium 25. Further, composition dependence was found. Specifically, in the case of the material in which the ratio of $Cr_2O_3$ was large, recording sensitivity is somewhat lowered, whereas in the case of the material in which the ratio of $LaF_3$ is large, the recording sensitivity becomes higher.

Example 11

In Example 11, land-groove recording was conducted in the information recording medium of Sample No. 10-2 produced in Example 10, and the overwrite cycle-ability was evaluated by determining the number of overwrite cycles as to each of groove recording and land recording in accordance with the method described in connection with Example 1. The results are shown in Table 13 together with the peak power (Pp) and the bias power (Pb) which were determined upon evaluation of the overwrite cycle-ability. For comparison, the same evaluation was conducted as to the information recording medium 31 as shown FIG. 10, which was the same as that produced in Example 1.

TABLE 13

| | | Groove Recording | | | Land Recording | | |
|---|---|---|---|---|---|---|---|
| Sample No. | Delamination | Number of Overwrite Cycles | Power (mW) Pp | Pb | Number of Overwrite Cycles | Power (mW) Pp | Pb |
| 10-2 | No | $\geq 100000$ | 10.5 | 4.8 | $\geq 100000$ | 10.8 | 5.0 |
| Comparative Sample | No | $\geq 100000$ | 11.0 | 5.0 | $\geq 100000$ | 11.3 | 5.2 |

As shown in Table 13, the overwrite cycle-ability of Sample No. 10-2 was the same as that of the comparative sample as to both of groove recording and land recording. Further, Pp of Sample No. 10-2 was lower than that of the comparative sample, which means that Sample No. 10-2 showed higher recording sensitivity than the comparative sample. Therefore, it was confirmed that the information recording medium of the present invention is useful as an information recording medium used for land-groove recording.

As shown in the above, the layer containing a mixture which is expressed with, for example, $(ZrSiO_4)_{50}(Cr_2O_3)_{30}(LaF_3)_{20}$ (mol %) can be formed in contact with the recording layer, since the material is free of S. Further, the information recording medium 25 as shown in FIG. 1 wherein the first dielectric layer 2 and the second dielectric layer 6 are the oxide-fluoride-based material layer has good performance equal to or higher than that of the information recording medium 31 as shown in FIG. 10 which includes the first and the second interface layers 103 and 105. This is apparent from the results of Examples 3 to 11. In other words, from the above examples, it was confirmed that according to the present invention, an information recording medium whose performance is comparable to that of the prior art information recording medium can be obtained even if the number of layers is reduced.

Example 12

In Example 12, an information recording medium (Sample No. 12-1) which had a constitution similar to the information recording medium 26 described in Embodiment 2 with reference to FIG. 2 was produced. In this recording medium, only a first dielectric layer 2 was an oxide-fluoride-based material layer. Hereafter, the producing method of the information recording medium 26 is explained.

Firstly, a substrate 1 which was the same as that used in Example 1 was prepared. On this substrate 1, a first dielectric layer 2 of 150 nm thickness, a recording layer 4 of 9 nm thickness, a second interface layer 105 of 3 nm thickness, the second dielectric layer 106 of 50 nm thickness, an optical compensation layer 7 of 40 nm thickness, and a reflective layer 8 of 80 nm thickness were formed into films in this order by a sputtering method as follows.

In a process for forming the first dielectric layer 2, a sputtering target (a diameter of 100 mm, a thickness of 6 mm) made of a material having a composition of $(ZrSiO_4)_{30}(Cr_2O_3)_{40}(LaF_3)_{30}$ (mol %) was attached to a film-forming device, and then, a high frequency sputtering was carried out in an Ar gas atmosphere under a pressure of 0.13 Pa. The power was 400 W.

The recording layer 4 was produced in the same manner as in Example 1. Therefore, the composition thereof was $Ge_{27}Sn_8Sb_{12}Te_{53}$ (atomic %).

The second interface layer 105 was formed in the same manner as the first interface layer 103 of the information recording medium 31 (comparative sample) described in Example 1. The second dielectric layer 106 was formed from $(ZnS)_{80}(SiO_2)_{20}$(mol %) in the same manner as the first dielectric layer 102 of the information recording medium 31 (comparative sample) described above. The optical compensation layer 7 and the reflective layer 8 were formed in the same manner as those of the information recording medium 25 which were described in Example 1.

For comparison, an information recording medium 31 which was the same as that produced in Example 1 was produced as a comparative sample. The adhesiveness of the first dielectric layer 2 in each sample was evaluated under the same conditions as Example 1. Groove recording and Land recording were carried out in each sample, and each sample was evaluated by determining the number of overwrite cycles as to the groove recording and the land recording. The results of the evaluation are shown in Table 14.

TABLE 14

| Sample No. | Delami-nation | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 12-1 | No | ≧100000 | 11.3 | 5.1 | ≧100000 | 11.5 | 5.3 |
| Comparative Sample | No | ≧100000 | 11.0 | 5.0 | ≧100000 | 11.3 | 5.2 |

As shown in Table 14, the information recording medium 26 of six-layer constitution in which only the first dielectric layer 2 was the oxide-fluoride-based material layer realized adhesiveness, overwrite cycle-ability, a peak power and a bias power which were substantially equal to those of the information recording medium 31 of seven-layer constitution. $(ZrSiO_4)_{30}(Cr_2O_3)_{40}(LaF_3)_{30}$ (mol %) is an example of the compositions of the layers which can constitute the information recording medium 26. All the information recording mediums 26 which were produced by using $ZrSiO_4$—$Cr_2O_3$—$LaF_3$-mixture-based material employed in Example 10 showed good performance. The same was the case with the materials employed in other examples.

Example 13

In Example 13, an information recording medium (Sample No. 13-1) which had a constitution similar to the information recording medium 27 described in Embodiment 3 with reference to FIG. 3 was produced. In this recording medium, only a second dielectric layer 6 was an oxide-fluoride-based material layer of $(ZrSiO_4)_{50}(Cr_2O_3)_{20}(LaF_3)_{30}$ (mol %).

In this example, Sample No. 13-1 was produced in the same manner as in Example 4 except for a process of forming the second dielectric layer 6. In a process for forming the second dielectric layer 6, a sputtering target (a diameter of 100 mm, a thickness of 6 mm) made of a material having a composition of $(ZrSiO_4)_{50}(Cr_2O_3)_{20}(LaF_3)_{30}$ (mol %) was attached to a film-forming device, and then, a high frequency sputtering was carried out in an Ar gas atmosphere under a pressure of 0.13 Pa. The power was 400 W.

For comparison, an information recording medium 31 which was the same as that produced in Example 1 was produced as a comparative sample. The adhesiveness of the second dielectric layer 6 in each sample was evaluated under the same conditions as Example 1. Further, the overwrite cycle-ability of each sample was evaluated by carrying out groove recording and land recording in each sample and determining the number of overwrite cycles as to the groove recording and the land recording in accordance with the method as described in Example 1. The results of the evaluation are shown in Table 15.

TABLE 15

| Sample No. | Delami-nation | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 13-1 | No | ≧100000 | 10.5 | 4.8 | ≧100000 | 10.8 | 5.0 |
| Comparative Sample | No | ≧100000 | 11.0 | 5.0 | ≧100000 | 11.3 | 5.2 |

As shown in Table 15, the information recording medium 27 of six-layer constitution in which only the second dielectric layer 6 was $(ZrSiO_4)_{50}(Cr_2O_3)_{20}(LaF_3)_{30}$ (mol %) realized adhesiveness, overwrite cycle-ability, a peak power and a bias power which were substantially equal to those of the information recording medium 31 of seven-layer constitution. $(ZrSiO_4)_{50}(Cr_2O_3)_{20}(LaF_3)_{30}$ (mol %) is an example of the compositions of the layers which can constitute the information recording medium 27. All the information recording mediums 27 which were produced by using $ZrSiO_4$—$Cr_2O_3$—$LaF_3$-mixture-based material employed in Example 10 showed good performance. The same was the case with the materials employed in other examples.

Example 14

In Example 14, an information recording medium (Sample No. 14-1) which had a constitution similar to the information recording medium 28 described in Embodiment 4 with reference to FIG. 4 was produced. In this recording medium, a first and a second dielectric layers 2 and 6 were oxide-fluoride-based material layers. Hereafter, the producing method of the information recording medium 28 is explained.

Firstly, a disc-shaped polycarbonate substrate having a diameter of 120 mm and a thickness of 1.1 mm was prepared as a substrate 101. A guide groove was previously provided on one side of the substrate with a depth of 21 nm and a track pitch (i.e. a distance between centers of adjacent groove surfaces 23 in a plane parallel to the principal surface of the substrate) of 0.32 µm.

On this substrate 101, a reflective layer 8 of 80 nm thickness, the second dielectric layer 6 of 16 nm thickness, a recording layer 4 of 11 nm thickness, and the first dielectric layer 2 of 68 nm thickness were formed into films in this order by a sputtering method as follows.

The reflective layer 8 was formed in the same manner as that in Example 1. In a process for forming the second dielectric layer 6, a sputtering target (a diameter of 100 mm, a thickness of 6 mm) made of a material having a composition of $(ZrSiO_4)_{50}(Cr_2O_3)_{30}(LaF_3)_{20}$ (mol %) was attached to a film-forming device, and then, a high frequency sputtering was carried out in an Ar gas atmosphere under a pressure of 0.13 Pa. The power was 400 W. The first dielectric layer 2 was formed in the same manner.

In a process for forming the recording layer 4, a sputtering target (a diameter of 100 mm, a thickness of 6 mm) made of a Ge—Se—Te-based material was attached to the film-forming device, and then a DC sputtering was carried out. The power was 100 W. During the sputtering, a mixed gas of Ar gas (97%) and $N_2$ gas (3%) was introduced in the device. The pressure during the sputtering was maintained at about 0.13 Pa. The composition of the recording layer 4 was $Ge_{45}Sb_4Te_{51}$.

After forming the first dielectric layer 2, an ultraviolet-curing resin was applied to the first dielectric layer 2. As a dummy substrate 110, a disc-shaped polycarbonate substrate of a diameter of 120 mm and a thickness of 90 µm was stuck on the applied ultraviolet-curing resin. Then, an ultraviolet ray was applied from the dummy substrate 110 to cure the resin. Thereby, an adhesive layer 9 consisting of the cured resin with a thickness of 10 µm was formed while the dummy substrate 110 was laminated to the first dielectric layer 2 with the adhesive layer 9.

After laminating the dummy substrate 110, an initialization process was carried out using a semiconductor laser with a wavelength of 670 nm. In the initialization process, the recording layer 4 in a substantially whole annular area ranging from 22 to 60 mm in a radial direction of the information recording medium 28 was crystallized. When the initialization process was completed, the production of the information recording medium 28 (Sample No. 14-1) was finished.

As a comparative sample, an information recording medium whose constitution is the same as that of the Information recording medium 28 except that it had the first and the second interface layers between the recording layer and the first and the second dielectric layers respectively, was produced (not shown). In this comparative sample, the first and second dielectric layers were formed from $(ZnS)_{80}(SiO_2)_{20}$ (mol %). These dielectric layers were formed in the same manner as the first dielectric layer 102 of the information recording medium 31 (comparative sample) described in Example 1. Each of the first and the second interface layers was formed from Ge—Cr—N and had a thickness of 5 nm. These interface layers were formed in the same manner as the first interface layer 103 of the information recording medium 31 (comparative sample) described in Example 1. The other layers were formed in the same manner as those of the information recording medium 28.

The adhesiveness and the overwrite cycle-ability were evaluated as to each sample. The results are shown in Table 16. The method for evaluating the adhesiveness is as described in Example 1. The overwrite cycle-ability was evaluated by a method which was different from that employed in Example 1. That method is explained in the following.

The overwrite cycle-ability of the information recording medium 28 was evaluated by a system whose arrangement is the same as that of the system employed in Example 1. Upon evaluating overwrite cycle-ability of the information recording medium 28, recording which was equivalent to a capacity of 23 GB was conducted using a semiconductor laser with a wavelength of 405 nm and an objective lens with a numerical aperture of 0.85. A linear velocity of rotation of the information recording medium 28 was set at 5 m/second. A spectrum analyzer was used for measurements of CNR (Carrier-to-Noise Ratio, i.e. a ratio of an amplitude of a signal to a noise) and an erase ratio.

In order to determine a measurement condition for determining the number of overwrite cycles, a peak power (Pp) and a bias power (Pb) were determined according to the following procedure. The information recording medium 28 was irradiated with a laser beam 12 while modulating its power between a peak power (mW) in a high power level and a bias power (mW) in a low power level to record a 2T signal with a mark length of 0.16 µm ten times on the same groove surface of the recording layer 4. CNR was measured after the 2T signal was recorded ten times. Such CNR was measured on each condition with the bias power being fixed at a certain value while the peak power during ten times-recording of the 2T signal was varied. A power that was 1.2 times as large as a minimum peak power at which the amplitude of the signal was saturated was determined as Pp.

Next, after the 2T signal was recorded ten times as described above, the recorded signal was reproduced and the amplitude of the 2T signal was measured. Further, a 9T signal was recorded one time on the same groove surface to overwrite it. Then, the recorded signal was reproduced and the amplitude of the 2T signal was measured, and the erase ratio was obtained as a decrement of the 2T signal on the basis of the amplitude measured after ten times-recording. This erase ratio defined as above was obtained on each condition with the peak power being fixed at Pp determined above while the bias power during ten times-recording of the 2T signal and at the time of one time-recording of the 9T signal was varied. The center value of the range of the bias power at which the erase ratio was not less than 25 dB was determined as Pb. Considering the upper limit of the laser power of the system, it is desirable to satisfy $Pp \leq 6$ mW and $Pb \leq 3$ mW.

The number of overwrite cycles used as the index of overwrite cycle-ability was determined in this example based on CNR and the erase ratio. The information recording medium 28 was irradiated with the laser beam while modulating its power between Pp and Pb thus determined to continuously record a 2T signal in the same groove surface. After that, CNR was measured and an erase ratio was obtained. The erase ratio was obtained as a decrement of a 2T signal as described above. More specifically, the 2T signal was measured after recording the 2T signal predetermined repetition times and after overwriting the 9T signal on it, and then the erase ratio was obtained as a decrement of the measured amplitude of the 2T signal after overwriting of the 9T signal on the basis of the measured amplitude of the 2T signal after recording of the predetermined repetition times. CNR and the erase ratio were measured when the repetition times, i.e. the number of overwrite cycles, was 1, 2, 3, 5, 10, 100, 200, 500, 1000, 2000, 3000, 5000, 7000, and 10000 times. The limit of overwriting was defined when CNR dropped by 2 dB or when the erase ratio dropped by 5 dB, on the basis of CNR and the erase ratio measured when the number of overwrite cycles was ten. Overwrite cycle-ability was evaluated based on the number of overwrite cycles at this limit. Of course, as the number of overwrite cycles is larger, the overwrite cycle-ability is higher. The number of overwrite cycles of the information recording medium 28 is preferably 10000 times or more.

TABLE 16

| Sample No. | Delamination | Groove Recording | | |
|---|---|---|---|---|
| | | Number of Overwrite Cycles | Power (mW) | |
| | | | Pp | Pb |
| 14-1 | No | ≧10000 | 5.0 | 2.3 |
| Comparative Sample | No | ≧10000 | 5.0 | 2.4 |

The information recording medium 28 of Sample No. 14-1 of this example was different from the information recording medium 25 shown in FIG. 1 in the formation order of each layer on the substrate, the recording conditions (the wavelength of laser beam and the numerical aperture) and the recording capacity. The recording capacity of Sample No. 14-1 was five times larger than that of the information recording medium 25 shown in FIG. 1. However, it was confirmed that, irrespective of these differences, even if the interface layer was not formed, the use of the layer of $(ZrSiO_4)_{50}(Cr_2O_3)_{30}(LaF_3)_{20}$ (mol %) as the first dielectric layer 2 and the second dielectric layer 6 made it possible to obtain an information recording medium whose performance was equal to that of the information recording medium which had the interface layers. In the information recording medium 28 produced in this example, a measured Rc value was 20%, and a measured Ra value was 3% (at an unrelieved flat surface thereof).

The same results were obtained when only one of the first dielectric layer 2 and the second dielectric layer 6 in the constitution of the information recording medium 28 was the oxide-fluoride-based material layer. That is, by using the oxide-fluoride-based material layer, it is possible to reduce at least one interface layer which was used in the prior art constitution, and ensure the performance which is equivalent to that of the prior art constitution. Further, since the oxide-fluoride-based material layer employed in the present invention does not contain S (sulfur), the atomic diffusion does not occur when the layer is in contact with the reflective layer 8 containing Ag. Thereby, a four-layer constitution is realized. Of course, a layer for adjusting the light absorption in the recording layer may be provided between the reflective layer 8 and the second dielectric layer 6. Such a layer is formed from one ore more materials selected from a metal, a non metal, a semimetal, a semiconductor and a dielectric substance, and compounds thereof. Such a layer preferably has a reflective index of 4 or less and a extinction coefficient of 4 or less, to the light with a wavelength of about 405 nm.

Example 15

In Example 15, an information recording medium (Sample No. 15-1) which had a constitution similar to the information recording medium 29 described in Embodiment 5 with reference to FIG. 5 was produced. In this recording medium, a fifth dielectric layer 19, a fourth dielectric layer 17, a second dielectric layer 6 and a first dielectric layer 2 were oxide-fluoride-based material layers. Hereafter, the producing method of the information recording medium 29 is explained.

Firstly, a substrate 101 which is the same as that used in Example 14 was prepared. On this substrate 101, the second reflective layer 20 of 80 nm thickness, the fifth dielectric layer 19 of 16 nm thickness, the second recording layer 18 of 11 nm thickness, and the fourth dielectric layer 17 of 68 nm thickness were formed into films in this order by a sputtering method. Thereby, a second information layer 22 was formed on the substrate 101.

The second reflective layer 20 was formed from an Ag—Pd—Cu alloy in the same manner as in Example 1. In a process for forming the fifth dielectric layer 19, a sputtering target (a diameter of 100 mm, a thickness of 6 mm) made of a material having a composition of $(ZrSiO_4)50(Cr_2O_3)_{30}(LaF_3)_{20}$ (mol %) was attached to a film-forming device, and then, a high frequency sputtering was carried out in an Ar gas atmosphere under a pressure of 0.13 Pa. The power was 400 W. The fourth dielectric layer 17 was formed in the same manner. The second recording layer 18 was formed in the same manner as in Example 4 using a sputtering target made of a Ge—Se—Te-based material.

Next, an intermediate layer 16 of 30 μm thickness which had a guide groove was formed. The intermediate layer 16 was formed according to the following steps. Firstly, an ultraviolet-curing resin was applied to the second information layer 22 by spin coating. A polycarbonate substrate which had on its surface concavities and convexities was placed and stuck on the applied ultraviolet-curing resin with the concavo-convex side in contact with the resin. These concavities and convexities were complementary to the guide groove which was to be formed on the intermediate layer 16. Then, an ultraviolet ray was applied from the polycarbonate substrate side to cure the resin. The polycarbonate substrate was removed from an intermediate layer 16. Thereby, the intermediate layer 16 consisted of the cured resin to which the guide groove was transferred, was formed.

After forming the intermediate layer 16, an initialization process of the second information layer 22 was conducted. In the initialization process, a semiconductor laser with a wavelength of 670 nm was used and the second recording layer 18 in a substantially whole annular area ranging from 22 to 60 mm in a radial direction was crystallized.

Next, on the intermediate layer 16, a third dielectric layer 15 of 15 nm thickness, a first reflective layer 14 of 10 nm thickness, the second dielectric layer 6 of 12 nm thickness, a first recording layer 13 of 6 nm thickness, and the first dielectric layer 2 of 45 nm thickness were formed into films in this order by a sputtering method. Thereby, a first information layer 21 was formed.

In a process for forming the third dielectric layer 15, a sputtering target (a diameter of 100 mm, a thickness of 6 mm) made of $TiO_2$ was attached to a film-forming device, and then a high frequency sputtering was carried out under a pressure of about 0.1 3 Pa. The power was 400 W. During the sputtering, a mixed gas of Ar gas (97%) and $O_2$ gas (3%) was introduced in the device.

The first reflective layer 14 was formed as an Ag—Pd—Cu alloy layer in the same manner as the second reflective layer 20. The second dielectric layer 6 was formed from $(ZrSiO_4)_{50}(Cr_2O_3)_{30}(LaF_3)_{20}$ (mol %) in the same manner as the fifth dielectric layer 19. The first dielectric layer 2 was formed in the same manner. Therefore, in this example, the fifth, fourth, second and first dielectric layers 19, 17, 6 and 2 had the same composition.

In a process for forming the first recording layer 13, a sputtering target (a diameter of 100 mm, a thickness of 6 mm) made of a Ge—Sn—Sb—Te-based material was attached to the film-forming device, and then a DC sputtering was carried out. The power was 50 W. During the sputtering, Ar gas (100%) was introduced. The pressure during the sputtering was maintained at about 0.13 Pa. The composition of the recording layer was $Ge_{40}Sn_5Sb_4Te_{51}$ (atomic %).

After forming the first dielectric layer 2, an ultraviolet-curing resin was applied to the first dielectric layer 2. As a dummy substrate 110, a disc-shaped polycarbonate substrate of a diameter of 120 mm and a thickness of 65 μm was stuck on the applied ultraviolet-curing resin. Then, an ultraviolet ray was applied from the dummy substrate 110 side to cure the resin. Thereby, an adhesive layer 9 consisting of the cured resin with a thickness of 10 μm was formed while the dummy substrate 110 was laminated to the first dielectric layer 2 with the adhesive layer 9.

After laminating the dummy substrate 110, an initialization process of the first information layer 21 was carried out using a semiconductor laser with a wavelength of 670 nm. In the initialization process, the first recording layer 13 in a substantially whole annular area ranging from 22 to 60 mm in a radial direction was crystallized. When the initialization process was completed, the production of the information recording medium (Sample No. 15-1) was finished.

With respect to each of the first information layer 21 and the second information layer 22 of Sample No. 15-1, The adhesiveness of the dielectric layer and the overwrite cycle-ability of the information recording medium were evaluated. The results are shown in Table 17 together with a peak power (Pp) and a bias power (Pb) which were determined when evaluating overwrite cycle-ability.

In this example, the evaluation of adhesiveness of the dielectric layer was conducted by investigating whether the delamination occurred in the first information layer 21 and the second information layer 22 respectively under a condition which was the same as that in Example 1. The overwrite cycle-ability of the information recording medium 29 was evaluated under a condition which is the same as in Example 14 by carrying out recording which was equivalent to a capacity of 23 GB in the first information layer 21 and the second information layer 22 respectively and then obtaining the number of overwrite cycles with respect to each of the first information layer 21 and the second information layer 22. A laser beam 12 was focused on the first recording layer 13 when recording on the first information layer 21, and on the second recording layer 18 when recording on the second information layer 22. Considering the upper limit of the laser power of the system, it is desirable to satisfy $Pp \leq 11$ mW and $Pb \leq 5.5$ mW.

TABLE 17

| | First Information Layer | | | Second Information Layer | | |
|---|---|---|---|---|---|---|
| Sample No. | Delamination | Number of Overwrite Cycles | Peak Power Pp (mW) | Delamination | Number of Overwrite Cycles | Peak Power Pp (mW) |
| 15-1 | No | $\geq 10000$ | 9.8 | No | $\geq 10000$ | 9.9 |

The information recording medium 29 of Sample No. 15-1 of this example was different from the information recording medium 25 shown in FIG. 1 in the formation order of each layer on the substrate, the number of the information layers (that is, the number of the recording layers), the recording conditions (the wavelength of laser beam and the numerical aperture). The number of the information layers of Sample No. 15-1 was two while that of the information recording medium 25 was one. Further, the recording capacity of Sample No. 15-1 is ten times larger than that of the information recording medium 25 shown in FIG. 1. However, irrespective of these differences, it was confirmed that, even if the interface layer was not formed, the use of the layer of $(ZrSiO_4)_{50}(Cr_2O_3)_{30}(LaF_3)_{20}$ (mol %) as the fist, second, fourth and fifth layers 2, 6, 17 and 19 made it possible to obtain an information recording medium whose performance was good. In the information recording medium 29 produced in this example, a designed Rc value was 6%, and a designed Ra value was 0.7% (at an unrelieved flat surface thereof) for the first information layer 21. A designed Rc value was 25%, and a designed Ra value was 3% for the second information layer 22.

In this example, all the first, second, fourth and fifth layers 2, 6, 7 and 19 were the oxide-fluoride-based material layers, however, the present invention is not limited to this embodiment. In one variation of the information recording medium of the present invention, at least one of the four dielectric layers may be an oxide-fluoride-based material layer while the other dielectric layers may be the layers made of $(ZnS)_{80}(SiO_2)_{20}$ (mol %). In that case, it is necessary to provide an interface layer between the recording layer and the layer made of $(ZnS)_{80}(SiO_2)_{20}$ (mol %). In this variation, the object of reducing the number of layers is achieved while good performance is obtained similarly to the above Sample 15-1.

Further, in this example, the first, second, fourth and fifth dielectric layers 2, 6, 17 and 19 were the oxide-fluoride-based material of the same composition. However, the present invention is not limited to this embodiment. As one variation, the information recording medium 29 in which the composition of these four dielectric layers are different from each other may be produced. Such an information recording medium shows good performance similarly to the above Sample 15-1.

Example 16

In Example 16, an information recording medium which had a constitution similar to the information recording medium 30 described in Embodiment 6 with reference to FIG. 6 was produced. In this recording medium, a first interface layer 3 and a second interface layer 5 were oxide-fluoride-based material layers. Hereafter, the producing method of the information recording medium 30 is explained.

Firstly, a substrate 1 which was the same as that used in Example 1 was prepared. On this substrate 1, a first dielectric layer 102 of 150 nm thickness, the first interface layer 3 of 5 nm thickness, a recording layer 4 of 9 nm thickness, the second interface layer 5 of 3 nm thickness, a second dielectric layer 106 of 50 nm thickness, an optical compensation layer 7 of 40 nm thickness, and a reflective layer 8 of 80 nm thickness were formed into films in this order by a sputtering method.

The first dielectric layer 102 was formed from $(ZnS)_{80}(SiO_2)_{20}$ (mol %) in the same manner as the first dielectric layer 102 of the information recording medium 31 (comparative sample) described above in Example 1. The second dielectric layer 106 was formed in the same manner.

In a process for forming the first interface layer 3, a sputtering target (a diameter of 100 mm, a thickness of 6 mm) made of a material having a composition of $(ZrSiO_4)_{50}(Cr_2O_3)_{40}(LaF_3)_{10}$ (mol %) was attached to a film-forming device, and then, a high frequency sputtering was carried out in an Ar gas atmosphere under a pressure of 0.13 Pa. The power was 400 W. The second interface layer 5 was formed in the same manner.

The recording layer 4 was formed in the same manner as in Example 1. Therefore, the composition of the layer was $Ge_{27}Sn_8Sb_{12}Te_{53}$ (atomic %). The optical compensation layer 7 was formed using $Ge_{80}Cr_{20}$ in the same manner as in Example 1. The reflective layer 8 was formed from an Ag—Pd—Cu alloy in the same manner as in Example 1.

For comparison, as a comparative sample, an information recording medium 31 which was the same as that produced in Example 1 was produced. As to the obtained samples, the adhesiveness and the overwrite cycle-ability were evaluated. The evaluation of the adhesiveness was conducted by investigating whether delamination occurred between the recording layer 4 and the adjacent interface layer, more specifically, between the recording layer 4 and at least one of the first interface layer 3 and the second interface layer 5. The evaluation of overwrite cycle-ability was conducted by carrying out groove recording and land recording, and then obtaining the number of overwrite cycles as to each of groove recording and land recording in accordance with the method described in Example 1. The results of evaluation are shown in Table 18.

TABLE 18

| Sample No. | Delamination | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 16-1 | No | ≧100000 | 11.1 | 4.9 | ≧100000 | 11.2 | 5.1 |
| Comparative Sample | No | ≧100000 | 11.0 | 5.0 | ≧100000 | 11.3 | 5.2 |

As shown in Table 18, the performance of the information recording medium 30 of Sample No. 16-1 in which the oxide-fluoride-based material layer was used as each interface layer was substantially equal to that of the comparative sample. The number of layers constituting Sample No. 16-1 was the same as that constituting the prior art information recording medium. Therefore, the effect given by reducing the number of layers cannot be obtained in Sample No. 16-1. However, in the case where the oxide-fluoride-based material layer is employed as the interface layer, the interface layer can be formed by sputtering in an atmosphere of Ar gas alone, without the need of a reactive sputtering which is required for forming an interface layer of, for example, Ge—Cr—N in the prior art. Therefore, variations in composition and in thickness occurred in one interface layer of the oxide-fluoride-based material become smaller than the variations occurred in the interface layer of Ge—Cr—N. Thus, the readiness and the stability of production can be improved. Further, since the quality of the oxide-fluoride-based material layer is less dependent on the film-forming device, the conditions under which the layer is formed can be optimized more rapidly. Therefore, the use of the oxide-fluoride-based material as the interface layer gives an effect of expediting the start of mass production.

Example 17

In Example 17, as to the information recording medium which included an oxide-fluoride-based material layer containing a third component in addition to oxides of the elements selected from the group GM and a fluoride of the element selected from the group GL, the performance was evaluated. In this example, an information recording medium 27 as shown in FIG. 3 was produced in the same manner as in Example 4 except for the material for a second dielectric layer 6.

Upon forming the second dielectric layer 6, a sputtering target made of $(ZrO_2)_{29}(SiO_2)_{29}(Cr_2O_3)_{21}(LaF_3)_{21}$ (mol %) was attached to a film-forming device, and sputtering chips which were made of $Si_3N_4$, Ge, C, Au, Ni, Pd and Al and have a size of 10 mm×10 mm×1 mm respectively were located on the sputtering target. The second dielectric layer 6 was formed by carrying out a high frequency sputtering in an Ar gas atmosphere under a pressure of 0.13 Pa with the use of this sputtering target with the sputtering chips. The power was 400 W. According to the analysis of the formed layer, the layer contains $(ZrO_2)_{29}(SiO_2)_{29}(Cr_2O_3)_{21}(LaF_3)_{21}$ in an amount of 90 mol %, and $Si_3N_4$ in an amount of 3 mol %, Ge in an amount of 3 mol %, Au in an amount of 0.5 mol %, Ni in an amount of 0.5 mol %, Pd in an amount of 0.5 mol %, and Al in an amount of 0.5 mol %.

For comparison, an information recording medium 31 which was the same as that produced in Example 1 was produced as a comparative sample. The adhesiveness of the second dielectric layer 6 in each sample was evaluated under the same conditions as Example 1. The overwrite cycle-ability of each sample was evaluated by carrying out groove recording and land recording in each sample and determining the number of overwrite cycles as to the groove recording and the land recording in accordance with the method as described in Example 1. The results of the evaluation are shown in Table 19.

TABLE 19

| Sample No. | Delamination | Groove Recording | | | Land Recording | | |
| --- | --- | --- | --- | --- | --- | --- | --- |
| | | Number of Overwrite Cycles | Power (mW) Pp | Pb | Number of Overwrite Cycles | Power (mW) Pp | Pb |
| 17-1 | No | ≧100000 | 13.6 | 6.3 | ≧100000 | 13.8 | 6.5 |
| Comparative Sample | No | ≧100000 | 11.0 | 5.0 | ≧100000 | 11.3 | 5.2 |

As shown in Table 19, Sample No. 17-1 showed the adhesiveness and the overwrite cycle-ability which were substantially equivalent to those of the comparative sample. Pp and Pb of Sample 17-1 satisfied Pp<14 mW and Pb<7 mW and were sufficiently practicable although they were higher than those of the comparative sample. From these results, it was confirmed that when the dielectric layer contains an oxide(s) of an element(s) selected from the group GM and a fluoride(s) of an element(s) selected from the group GL in an amount of 90 mol % or more in total, good adhesiveness, good overwrite cycle-ability and good recording sensitivity are ensured.

Example 18

In the above Examples 1-17, the information recording mediums on which information was recorded by optical means were produced. In Example 18, an information recording medium 207 shown in FIG. 8 on which information was recorded by electric means was produced. This information recording medium is what is called a memory.

The information recording medium 207 of this example was produced as follows. Firstly, a Si substrate 201 having a length of 5 mm, a width of 5 mm, and a thickness of 1 mm of which surface was subjected to a nitriding treatment was prepared. On this substrate 201, a lower electrode 202 of Au with a thickness of 0.1 μm was formed in an area of 1.0 mm×1.0 mm. On the lower electrode 202, a phase-change part 205 of $Ge_{38}Sb_{10}Te_{52}$ (which is expressed as $Ge_8Sb_2Te_{11}$ as a compound) with a thickness of 0.1 μm was formed in a circular area of a diameter of 0.2 mm, and a thermal insulating part 206 of $(ZrSiO_4)_{40}(Cr_2O_3)_{30}(LaF_3)_{30}$ (mol %) with the same thickness as the phase-change part 205 was formed in an area of 0.6 mm×0.6 mm (excluding the phase-change part 205). Further, an upper electrode 204 of Au with a thickness of 0.1 μm was formed in an area of 0.6 mm×0.6 mm. The lower electrode 202, the phase-change part 205, and the insulating part 206 were formed by a sputtering method respectively.

In a process for forming the phase-change part 205, a sputtering target (a diameter of 100 mm, a thickness of 6 mm) made of a Ge—Se—Te-based material was attached to a film-forming device, and then a DC sputtering was carried out with a power of 100 W while introducing Ar gas. A pressure during the sputtering was maintained at about 0.13 Pa. In a process for forming the thermal insulating part 206, a sputtering target (a diameter of 100 mm, a thickness of 6 mm) made of a material having a composition of $(ZrSiO_4)_{40}(Cr_2O_3)_{30}(LaF_3)_{30}$ (mol %) was attached to the film-forming device, and then a high frequency sputtering was carried out under a pressure of about 0.13 Pa. The power was 400 W. During the sputtering, Ar gas was introduced. Each sputtering in these processes was conducted while covering an area excluding the surface on which a film was to be formed with a mask so that the phase change part 205 and the insulating part 206 did not overlap each other. The formation order of the phase-change part 205 and the thermal insulating part 206 is not limited to a particular one, and either may be formed earlier.

The phase-change part 205 and the thermal insulating part 206 constituted a recording part 203. The phase-change part 205 corresponded to a recording layer according to this invention. The thermal insulating part 206 corresponded to an oxide-fluoride-based material layer according to this invention.

The detailed description of processes for forming the lower electrode 202 and the upper electrode 204 is omitted since these electrode were formed by a sputtering method which is generally employed in the technical field of electrode formation.

Phase change occurred in the phase-change part 205 by applying an electric energy to the information recording medium 207 of this example thus produced. This was confirmed by means of a system shown in FIG. 9. The cross sectional view of the information recording medium 207 shown in FIG. 9 is the cross section of the information recording medium 207 taken along a line A-B in a direction of its thickness shown in FIG. 8.

Figure 9:
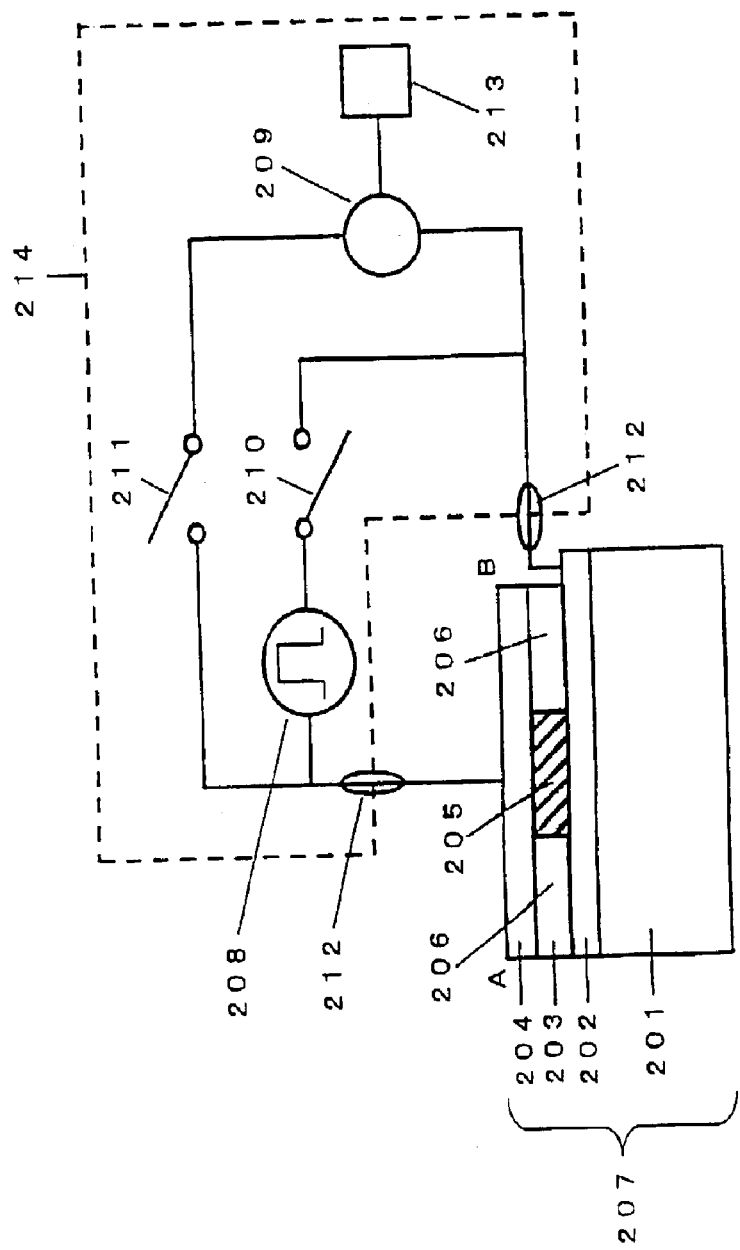
FIG. 9 is a schematic view which shows an example of a system for the information recording medium shown in FIG. 8.

As shown in FIG. 9, more specifically, two parts 212 for application were bonded to the lower electrode 202 and the upper electrode 204 respectively with a lead wire of Au. Thus, an electrically recording/reproducing device 214 was connected to the information recording medium (memory) 207 through these application parts 212. Between the application parts 212 which were respectively connected to the lower electrode 202 and the upper electrode 204 in the electrically recording/reproducing device 214, a pulse producing part 208 was connected through a switch 210, and a resistance measuring device 209 was also connected through a switch 211. The resistance measuring device 209 was connected to a judgment part 213 which judged whether a resistance value measured by the resistance measuring device 209 was high or low. A current pulse was transmitted between the upper electrode 204 and the lower electrode 202 via the application parts 212 by means of the pulse producing part 208, while a resistance value between the lower electrode 202 and the upper electrode 204 was measured by the resistance measuring device 209. Thus measured resistance value was judged by the judgment part 213 whether it was high or low. Such resistance value generally changes because of the phase change of the phase-change part 205. Therefore, the state of a phase of the phase-change part 205 was able to be known based on the result of this judgment.

In the case of this example, the melting point of the phase-change part 205 was 630° C., the crystallization temperature thereof was 170° C., and the crystallization time thereof was 130 ns. The resistance value between the lower electrode 202 and the upper electrode 204 was 1000 Ω when the phase-change part 205 was in the state of amorphous phase, and was 20 Ω when it was in the state of crystalline phase. A current pulse of 20 mA and 150 ns was applied between the upper electrodes 204 and the lower electrode 202 when the phase-change part 205 was in the state of amorphous phase (i.e. in the level of high resistance). As a result, the resistance value between the lower electrode 202 and the upper electrode 204 dropped and the phase-change part 205 changed into the state of crystalline phase from the state of amorphous phase. Further, a current pulse of 200 mA and 100 ns was applied between the upper electrodes 204 and the lower electrode 202 when the phase-change part 205 was in the state of crystalline phase (i.e. in the level of low resistance). As a result, the resistance value between the lower electrode 202 and the upper electrode 204 rose and the phase-change part 205 changed into the state of amorphous phase from the state of crystalline phase.

From the result described above, it was confirmed that a phase change occurred in the phase-change part (a recording layer) by using the layer made of a material having a composition of $(ZrSiO_4)_{40}(Cr_2O_3)_{30}(LaF_3)_{30}$ (mol %) as the thermal insulating part 206 around the phase-change part 205 and by applying an electric energy to it. Therefore, it was also confirmed that the information recording medium 207 had a function of recording an information.

As in this example, in the case where the thermal insulating part 206 of $(ZrSiO_4)_{40}(Cr_2O_3)_{30}(LaF_3)_{30}$ (mol %) which is a dielectric substance is provided around the column-shaped phase-change part 205, it effectively prevents a current, which flows into the phase-change part 205 by applying a voltage between the upper electrode 204 and the lower electrode 202, from escaping to the periphery of the phase-change part 205. As a result, a temperature of the phase-change part 205 can be efficiently raised by the Joule heat generated by the current. Particularly, in order to change the phase-change part 205 into the state of amorphous phase, a process of melting the phase-change part 205 of $Ge_{38}Sb_{10}Te_{52}$ followed by quenching it is required. By providing the thermal insulating part 206 around the phase-change part 205, the phase-change part melting can be occurred with a smaller current.

A material of $(ZrSiO_4)_{40}(Cr_2O_3)_{30}(LaF_3)_{30}$ (mol %) for the thermal insulating part 206 has a high melting point. Moreover, an atomic diffusion caused by heat hardly takes place in this material. Thus, the material is applicable to an electric memory such as the information recording medium 207. Additionally, in the case where the thermal insulating part 206 is located along the periphery of the phase-change part 205, the thermal insulating part 206 serves to substantially isolate the phase-change part 205 electrically and thermally in the plane of the recording part 203. By utilizing this and providing a plurality of phase-change parts 205 in the information recording medium 207 so that the phase-change parts 205 are isolated from each other by the thermal insulating part 206, the memory capacity of the information recording medium 207 can be made larger and accessing function and/or switching function can be improved. In addition, a plurality of information recording mediums 207 themselves can also be connected to each other.

An information recording medium of this invention has been demonstrated through various examples thereinbefore. An oxide-fluoride-based material layer can be used for both an information recording medium recorded with optical means and an information recording medium recorded with electric means. According to an information recording medium of this invention which includes the oxide-fluoride-based material layer, an constitution which has not been realized can be realized, and/or hihger performance were obtained compared with the prior art information recording medium.

What is claimed is:

1. An information recording medium comprising:
a substrate;
a recording layer wherein a phase change between a crystal phase and an amorphous phase of the recording layer is capable of being generated by an irradiation of light or an application of electric energy; and
an oxide-fluoride-based material layer comprising (1) at least one element selected from a first group consisting of Ti, Zr, Hf, Nb, Ta, Cr and Si, (2) an oxygen atom, (3) at least one element selected from a second group consisting of La, Ce, Pr, Nd, Gd, Dy, Ho, Er and Yb, and (4) a fluorine atoms,
with the proviso that the oxide-fluoride-based material layer does not contain a sulfide or a selenide.

2. The information recording medium according to claim 1, wherein the oxide-fluoride-based material layer comprises a material expressed with a formula: $M_HO_IL_JF_K$ (atomic %) wherein M represents the at least one element selected from the first group, L represents the at least one element selected from the second group, and H, I, J and K satisfy $10 \leq H \leq 45$, $24 \leq I \leq 76$, $0 \leq J \leq 19$, and $0 \leq K \leq 48$.

3. The information recording medium according to claim 1, wherein the oxide-fluoride-based material layer comprises a material which contains Cr and at least one element selected from a third group consisting of Ti, Zr, Hf and Ta, and at least one element selected from a fourth group consisting of La, Ce, Pr and Nd and is expressed with a formula:

$M^1_PCr_QO_IL^1_JF_K$ (atomic %)

wherein $M^1$ represents the at least one element selected from the third group $L^1$ represents the at least one element selected from the fourth group, and P, Q, I, J and K satisfy $0<P \leq 38, 0<Q \leq 45, 24 \leq I \leq 76, 0<I9$, and $0<K \leq 48$.

4. The information recording medium according to claim 1, wherein the oxide-fluoride-based material layer comprises a material which contains Cr, Si and at least one element selected from a third group consisting of Ti, Zr, Hf and Ta, and at least one element selected from a fourth group consisting of La, Ce, Pr and Nd and is expressed with a formula:

$M^1_RCr_SSi_TO_UL^1_VF_W$ (atomic %)

wherein $M^1$ represents the at least one element selected from the third group, $L^1$ represents the at least one element selected from the fourth group, and R, S, T, U, V and W satisfy $0<R \leq 28, 0<S \leq 33, 0<T \leq 19, 25 \leq U \leq 70, 0<V \leq 18$, and $0<W \leq 45$.

5. The information recording medium according to claim 1, wherein the oxide-fluoride-based material layer comprises: (a) one or more oxides; and (b) one or more fluorides, and each oxide is an oxide of the at least one element selected from the first group, and each fluoride is a fluoride of the at least one element selected from the second group.

6. The information recording medium according to claim 5, wherein the oxide-fluoride-based material layer comprises the one or more oxides of the elements selected from the first group and the one or more fluorides of the elements selected from the second group in an amount of 90 mol % or more in total.

7. The information recording medium according to claim 5, wherein the oxide-fluoride-based material layer comprises the one or more oxides of the elements selected from the first group in an amount of 50 mol % or more.

8. The information recording medium according to claim 5, wherein the oxide-fluoride-based material layer comprises, as the one or more oxides, an oxide of Cr and one or more oxides which each are an oxide of at least one element selected from a third group consisting of Ti, Zr, Hf and Ta and, as the one or more fluorides, one or more fluorides which each are a fluoride of at least one element selected from a fourth group consisting of La, Ce, Pr and Nd.

9. The information recording medium according to claim 8, wherein the oxide-fluoride-based material layer comprises, the oxide of Cr and the one or more oxides of the elements selected from the third group in an amount of 50 mol % or more in total.

10. The information recording medium according to claim 9, wherein the oxide-fluoride-based material layer further comprises an oxide of Si.

11. The information recording medium according to claim 5, wherein the oxide-fluoride-based material layer comprises, as the one or more oxides, $SiO_2$ and $Cr_2O_3$ and at least one oxide selected from $ZrO_2$, $HfO_2$ and $Ta_2O_5$ and, as the one or more fluorides, $LaF_3$.

12. The information recording medium according to claim 11, wherein the oxide-fluoride-based material layer comprises a material expressed with a formula:

$(D)_X(SiO_2)_Y(Cr_2O_3)_Z(LaF_3)_{100-X-Y-Z}$ (mol %)

wherein D represents the at least one oxide selected from $ZrO_2$, $HfO_2$ and $Ta_2O_5$, and X, Y and Z satisfy $20 \leq X \leq 70$, $10 \leq Y \leq 50$, $10 \leq Z \leq 60$, and $50 \leq X+Y+Z \leq 90$.

13. The information recording medium according to claim 5, wherein the oxide-fluoride-based material layer comprises, as the one or more oxides. $ZrSiO_4$ and $Cr_2O_3$, and, as the one or more fluorides, $LaF_3$.

14. The information recording medium according to claim 13, wherein the oxide-fluoride-based material layer comprises a material expressed with a formula:

$$(ZrSiO_4)_A(Cr_2O_3)_B(LaF_3)_{100-A-B} \text{ (mol \%)}$$

wherein A and B satisfy $20 \leq A \leq 70$, $10 \leq B \leq 50$, and $50 \leq A+B \leq 90$.

15. The information recording medium according to claim 1, wherein the phase change is capable of being generated reversibly in the recording layer.

16. The information recording medium according to claim 15, wherein the recording layer comprises a material selected from a group consisting of Ge—Se—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

17. The information recording medium according to claim 15, wherein the recording layer has a thickness of 15 nm or less.

18. The information recording medium according to claim 1, further comprising at least one additional recording layer.

19. The information recording medium according to claim 1, wherein a first dielectric layer, the recording layer, a second dielectric layer, and a reflective layer are formed in order on one surface of the substrate, and at least one of the first dielectric layer and the second dielectric layer is the oxide-fluoride-based material layer and is in contact with the recording layer.

20. The information recording medium according to claim 1, wherein a first dielectric layer, an interface layer, the recording layer, a second dielectric layer, an optical compensation layer and a reflective layer are formed in order on one surface of the substrate, and the second dielectric layer is the oxide-fluoride-based material layer and is in contact with the recording layer.

21. The information recording medium according to claim 1, wherein a reflective layer, a second dielectric layer, the recording layer and a first dielectric layer are formed in order on one surface of the substrate, and at least one of the first dielectric layer and the second dielectric layer is the oxide-fluoride-based material layer and is in contact with the recording layer.

22. The information recording medium according to claim 1, wherein a reflective layer, an optical compensation layer, a second dielectric layer, the recording layer, an interface layer and a first dielectric layer are formed in order on one surface of the substrate, and the second dielectric layer is the oxide-fluoride-based material layer and is in contact with the recording layer.

23. The information recording medium according to claim 1, wherein at least a second recording layer and a first recording layer are formed in order on one surface of the substrate, and at least one of the oxide-fluoride-based material layer is formed in contact with the first recording layer or the second recording layer.

24. The information recording medium according to claim 1, wherein at least a second reflective layer, a fifth dielectric layer, a second recording layer, a fourth dielectric layer, an intermediate layer, a third dielectric layer, a first reflective layer, a second dielectric layer, a first recording layer, and a first dielectric layer are formed in order, and at least one of the first dielectric layer, the second dielectric layer, the fourth dielectric layer and the fifth dielectric layer is the oxide-fluoride-based material layer formed in contact with the first recording layer or the second recording layer.

25. A method for producing an information recording medium which comprises a substrate, a recording layer, and an oxide-fluoride-based material layer comprising (1) at least one element selected from a first group consisting of Ti, Zr, Hf, Nb, Ta, Cr and Si, (2) an oxygen atom, (3) at least one element selected from a second group consisting of La, Ce, Pr, Nd, Gd, Dy, Ho, Er and Yb, and (4) a fluorine atom, with the proviso that the oxide-fluoride-based material layer does not contain a sulfide or a selenide, the method comprising forming the oxide-fluoride-based material layer by a sputtering method using a sputtering target comprising at least one element selected from the first group, an oxygen atom, at least one element selected from the second group and a fluorine atom.

26. The method according to claim 25, wherein the sputtering target comprises a material expressed with a formula:

$$M_h O_i L_j F_k \text{ (atomic \%)}$$

wherein M represents the at least one element selected from the first group, L represents the at least one element selected from the second group, and h, i, j and k satisfy $10 \leq h \leq 45$, $24 \leq i \leq 76$, $0 < j \leq 19$, and $0 < k \leq 48$.

27. The method according to claim 25, wherein the sputtering target comprises a material which contains Cr and at least one element selected from a third group consisting of Ti, Zr, Hf and Ta and at least one element selected from a fourth group consisting of La, Ce, Pr and Nd, and is expressed with a formula:

$$M^1_p Cr_q O_i L^1_j F_k \text{ (atomic \%)}$$

wherein $M^1$ represents the at least one element selected from the third group, $L^1$ represents the at least one element selected from the fourth group, and p, q, i, j and k satisfy $0 < p \leq 38, 0 < q \leq 45$, $24 \leq i \leq 76$, $0 < j \leq 19$, and $0 < k \leq 48$.

28. The method according to claim 25, wherein the sputtering target comprises a material which contains Cr, Si and at least one element selected from a third group consisting of Ti, Zr, Hf and Ta, and at least one element selected from a fourth group consisting of La, Ce, Pr and Nd and is expressed with a formula:

$$M^1_r Cr_s Si_t O_u L^1_v F_w \text{ (atomic \%)}$$

wherein $M^1$ represents the at least one element selected from the third group, $L^1$ represents the at least one element selected from the fourth group, and r, s, t, u, v and w satisfy $0 < r \leq 28$, $0 < s \leq 33, 0 < t \leq 19$, $25 \leq u \leq 70$, $0 < v \leq 18$, and $0 < w \leq 45$.

29. The method according to claim 25, wherein the sputtering target comprises: (a) one or more oxides; and (b) one or more fluorides, and each oxide is an oxide of the at least one element selected from the first group, and each fluoride is a fluoride of the at least one element selected from the second group.

30. The method according to claim 29, wherein the sputtering target comprises the one or more oxides of the elements selected from the first group and the one or more fluorides of the elements selected from the second group in an amount of 90 mol % or more in total.

31. The method according to claim 29, wherein the sputtering target comprises the one or more oxides of the elements selected from the first group in an amount of 50 mol % or more.

32. The method according to claim 29, wherein the sputtering target comprises, as the one or more oxides, an oxide of Cr and one or more oxides which each are an oxide of at least one element selected from a third group consisting of Ti, Zr, Hf and Ta and, as the one or more fluorides, one or more fluorides which each are a fluoride of at least one element selected from a fourth group consisting of La, Ce, Pr and Nd.

33. The method according to claim 32, wherein the sputtering target comprises the oxide of Cr and the one or more oxides of the elements selected from the third group in an amount of 50 mol % or more in total.

34. The method according to claim 33, wherein the sputtering target further comprises an oxide of Si.

35. The method according to claim 29, wherein the sputtering target comprises, as the one or more oxides, $SiO_2$ and $Cr_2O_3$ and at least one oxide selected from a group consisting of $ZrO_2$, $HfO_2$ and $Ta_2O_5$ and, as the one or more fluorides, $LaF_3$.

36. The method according to claim 35, wherein the sputtering target comprises a material which is expressed with a formula:

$$(D)_x(SiO_2)_y(Cr_2O_3)_z(LaF_3)_{100-x-y-z} \text{ (mol \%)}$$

wherein D represents the at least one oxide selected from the group consisting of $ZrO_2$, $HfO_2$ and $Ta_2O_5$, and x, y and z satisfy $20 \leq x \leq 70$, $10 \leq y \leq 50$, $10 \leq z \leq 60$, and $50 \leq x+y+z \leq 90$.

37. The method according to claim 29, wherein the sputtering target comprises, as the one or more oxides, $ZrSiO_4$ and $Cr_2O_3$ and, as the one or more fluorides, $LaF_3$.

38. The method according to claim 37, wherein the sputtering target comprises a material which is expressed with a formula:

$$(ZrSiO_4)_a(Cr_2O_3)_b(LaF_3)_{100-a-b} \text{ (mol \%)}$$

wherein a and b satisfy $20 \leq a \leq 70$, $10 \leq b \leq 50$, and $50 \leq a+b \leq 90$.

* * * * *

UNITED STATES PATENT AND TRADEMARK OFFICE
CERTIFICATE OF CORRECTION

PATENT NO. : 6,881,466 B2
DATED : April 19, 2005
INVENTOR(S) : Rie Kojima et al.

It is certified that error appears in the above-identified patent and that said Letters Patent is hereby corrected as shown below:

Column 69,
Line 54, replace "atoms," with -- atom, --.
Line 63, replace "$0 \leq J \leq 19$," with -- $0 < J \leq 19$, --.
Line 63, replace "$0 \leq K \leq 48$." with -- $0 < K \leq 48$. --.

Column 70,
Lines 3 and 15, replace "Nd" with -- Nd, --.
Line 7, replace "group" with -- group, --.
Line 9, replace "$0 < 19$," with -- $0 < J \leq 19$, --.
Line 44, replace "Ta" with -- Ta, --.
Line 49, replace "comprises," with -- comprises --.
Line 58, replace "$Ta_2O_5$" with -- $Ta_2O_5$, --.

Column 72,
Line 28, replace "and Ta and" with -- and Ta, and --.
Line 42, replace "Nd" with -- Nd, --.

Column 73,
Line 9, replace "Ta" with -- Ta, --.

Column 74,
Line 13, replace "$Cr_2O_3$" with -- $Cr_2O_3$, --.

Signed and Sealed this

Twenty-third Day of August, 2005

JON W. DUDAS
*Director of the United States Patent and Trademark Office*